US012807868B2

(12) United States Patent
Shin et al.

(10) Patent No.: US 12,807,868 B2
(45) Date of Patent: Nov. 24, 2026

(54) POLYCYCLIC COMPOUND AND ORGANIC LIGHT-EMITTING DEVICE USING SAME

(71) Applicant: SFC CO., LTD, Cheongju-si (KR)

(72) Inventors: Bong-ki Shin, Cheongju-si (KR); Sung-hoon Joo, Cheongju-si (KR); Byung-sun Yang, Cheongju-si (KR); Ji-hwan Kim, Cheongju-si (KR); Hyeon-jun Jo, Cheongju-si (KR); Sung-eun Choi, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 1132 days.

(21) Appl. No.: 17/768,627

(22) PCT Filed: Oct. 14, 2020

(86) PCT No.: PCT/KR2020/014030

§ 371 (c)(1),
(2) Date: Apr. 13, 2022

(87) PCT Pub. No.: WO2021/075856

PCT Pub. Date: Apr. 22, 2021

(65) Prior Publication Data

US 2024/0301279 A1 Sep. 12, 2024

(30) Foreign Application Priority Data

Oct. 14, 2019 (KR) ........................ 10-2019-0126703

(51) Int. Cl.

| | |
|---|---|
| ***C09K 11/06*** | (2006.01) |
| ***H10K 50/11*** | (2023.01) |
| ***H10K 85/30*** | (2023.01) |
| ***H10K 85/40*** | (2023.01) |
| ***H10K 85/60*** | (2023.01) |

(52) U.S. Cl.

CPC .............. *C09K 11/06* (2013.01); *H10K 50/11* (2023.02); *H10K 85/324* (2023.02); *H10K 85/40* (2023.02); *H10K 85/622* (2023.02); *H10K 85/636* (2023.02); *H10K 85/656* (2023.02); *H10K 85/6572* (2023.02); *H10K 85/6574* (2023.02); *H10K 85/6576* (2023.02); *H10K 85/658* (2023.02); *C09K 2211/1033* (2013.01); *C09K 2211/1037* (2013.01); *C09K 2211/104* (2013.01); *C09K 2211/1044* (2013.01); *C09K 2211/1088* (2013.01); *C09K 2211/1092* (2013.01); *C09K 2211/1096* (2013.01)

(58) Field of Classification Search

CPC ............ C09K 11/06; C09K 2211/1033; C09K 2211/1037; C09K 2211/104; C09K 2211/1044; C09K 2211/1088; C09K 2211/1092; C09K 2211/1096; C09K 2211/1055; C09K 2211/107; C09K 2211/1022; C09K 2211/1048; C09K 2211/1051; H10K 50/11; H10K 85/324; H10K 85/40; H10K 85/622; H10K 85/636; H10K 85/656; H10K 85/6572; H10K 85/6574; H10K 85/6576; H10K 85/658; H10K 50/00; H10K 85/654; H10K 99/00; H10K 85/615; C07F 7/0816; C07F 5/02

See application file for complete search history.

(56) References Cited

U.S. PATENT DOCUMENTS

| | | | | |
|---|---|---|---|---|
| 10,787,467 | B2 * | 9/2020 | Fuchiwaki ............ | C07F 7/0816 |
| 2015/0295205 | A1 * | 10/2015 | Lee ...................... | H10K 50/828 257/40 |
| 2018/0069182 | A1 | 3/2018 | Hatakeyama et al. | |
| 2020/0185626 | A1 | 6/2020 | Yuuki | |
| 2022/0017545 | A1 * | 1/2022 | Han ...................... | C07F 7/0816 |

FOREIGN PATENT DOCUMENTS

| | | | |
|---|---|---|---|
| CN | 111285892 | A | 6/2020 |
| JP | 2012-234873 | A | 11/2012 |
| KR | 10-2018-0122298 | A | 11/2018 |
| KR | 10-2019-0113861 | A | 10/2019 |
| KR | 10-2020-0057890 | A | 5/2020 |
| KR | 10-2020-0071192 | A | 6/2020 |
| KR | 10-2020-0081302 | A | 7/2020 |
| KR | 10-2020-0121228 | A | 10/2020 |
| KR | 10-2202111 | B1 | 1/2021 |
| KR | 10-2213030 | B1 | 2/2021 |
| WO | WO 2020/201070 | A1 | 10/2020 |

OTHER PUBLICATIONS

Escande, A., & Ingleson, M. J. (2015). Fused polycyclic aromatics incorporating boron in the core: fundamentals and applications. Chemical Communications, 51(29), 6257-6274. (Year: 2015).*
Hirai, M., Tanaka, N., Sakai, M., & Yamaguchi, S. (2019). Structurally constrained boron-, nitrogen-, silicon-, and phosphorus-centered polycyclic π-conjugated systems. Chemical reviews, 119(14), 8291-8331. (Year: 2019).*
Ohshita, J. (2016). Group 14 metalloles condensed with heteroaromatic systems. Organic Photonics and Photovoltaics, 4(1). (Year: 2016).*
Delouche, Thomas, Muriel Hissler, and Pierre-Antoine Bouit. “Polycyclic aromatic hydrocarbons containing heavy group 14 elements: From synthetic challenges to optoelectronic devices.” Coordination Chemistry Reviews 464 (2022): 214553. (Year: 2022).*
(Continued)

*Primary Examiner* — Dawn L Garrett
(74) *Attorney, Agent, or Firm* — NSIP Law

(57) ABSTRACT

The present invention relates to a novel polycyclic compound employed by an organic layer of an organic light-emitting device, and an organic light-emitting device employing the compound according to the present invention has markedly improved luminous efficiency. According to the present invention, it is possible to achieve a highly efficient organic light-emitting device which can be effectively applied to a variety of display devices.

15 Claims, No Drawings

(56) References Cited

OTHER PUBLICATIONS

International Search Report issued on Mar. 9, 2021, in counterpart PCT Patent Application No. PCT/KR2020/014030 (4 pages in Korean).
Chinese Office Action issued on Apr. 27, 2023, in counterpart Chinese Patent Application No. 202080086200.7 (13 pages in English, 10 pages in Chinese).

* cited by examiner

POLYCYCLIC COMPOUND AND ORGANIC LIGHT-EMITTING DEVICE USING SAME

CROSS REFERENCE TO RELATED APPLICATIONS

This application is a U.S. National Stage Application of International Application No. PCT/KR2020/014030, filed on Oct. 14, 2020, which claims the benefit under 35 USC 119(a) and 365(b) of Korean Patent Application No. 10-2019-0126703, filed on Oct. 14, 2019 in the Korean Intellectual Property Office, the entire disclosure of which is incorporated herein by reference for all purposes.

TECHNICAL FIELD

The present invention relates to a polycyclic compound and a highly efficient and long-lasting organic electroluminescent device with significantly improved luminous efficiency using the polycyclic compound.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DETAILED DESCRIPTION OF THE INVENTION

Problems to be Solved by the Invention

Accordingly, the present invention intends to provide an organic electroluminescent compound that is employed in an organic layer of an organic electroluminescent device to achieve high efficiency of the device, and an organic electroluminescent device including the organic electroluminescent compound.

Means for Solving the Problems

One aspect of the present invention provides an organic electroluminescent compound represented by Formula A:

[Formula A]

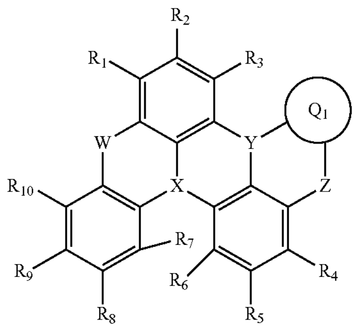

or Formula B

[Formula B]

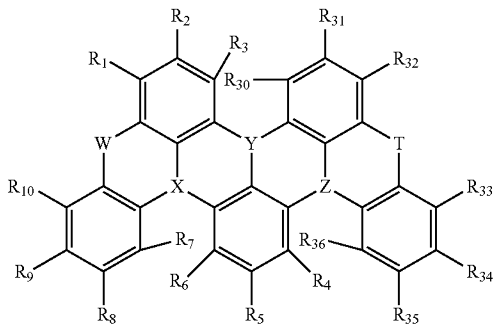

More specific structures of Formulae A and B, definitions of the substituents in Formulae A and B, and specific polycyclic compounds that can be represented by Formulae A and B are described below.

A further aspect of the present invention provides an organic electroluminescent device including a first electrode, a second electrode opposite to the first electrode, and one or more organic layers interposed between the first and second electrodes wherein one of the organic layers includes at least one of the specific polycyclic compounds that can be represented by Formula A or B.

Effects of the Invention

The polycyclic compound of the present invention can be employed in an organic layer of an organic electroluminescent device to achieve high efficiency of the device.

BEST MODE FOR CARRYING OUT THE INVENTION

The present invention will now be described in more detail.

The present invention is directed to a polycyclic compound represented by Formula A:

[Formula A]

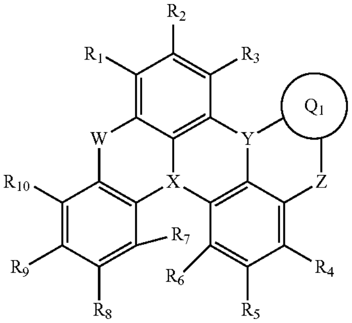

wherein W is selected from $SiR_{11}R_{12}$ and $GeR_{13}R_{14}$, each of X and Y is independently selected from B, N, $CR_{15}$, $SiR_{16}$, P, P=O, P=S, $GeR_{17}$, and Al, Z is a single bond or a divalent group selected from the following structures Y-1 to Y-12:

(Y-1)

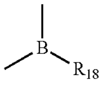

(Y-2)

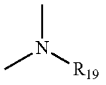

(Y-3)

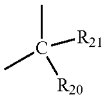

(Y-4)

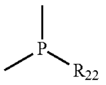

(Y-5)

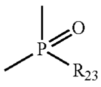

(Y-6)

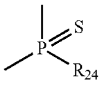

(Y-7)

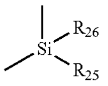

(Y-8)

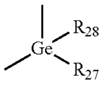

(Y-9)

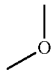

(Y-10)

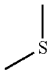

(Y-11)

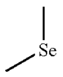

-continued (Y-12)

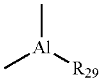

$Q_1$ is a 3- to 8-membered monocyclic or polycyclic aliphatic, aromatic or non-aromatic ring containing at least one hydrocarbon or heteroatom, and $R_1$ to $R_{29}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{29}$, $Q_1$, and their substituents optionally forms a substituted or unsubstituted ring with an adjacent substituent; or Formula B:

[Formula B]

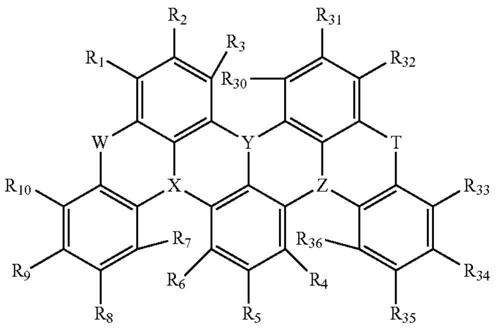

wherein W is selected from $SiR_{11}R_{12}$ and $GeR_{13}R_{14}$, each of X, Y, and Z is independently selected from B, N, $CR_{15}$, $SiR_{16}$, P, P=O, P=S, $GeR_{17}$, and Al, T is a single bond or a divalent group selected from the following structures Y-1 to Y-12:

(Y-1)

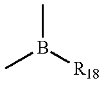

(Y-2)

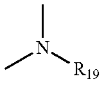

(Y-3)

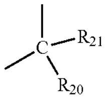

-continued (Y-4)

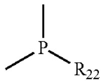

(Y-5)

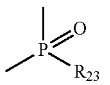

(Y-6)

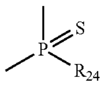

(Y-7)

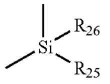

(Y-8)

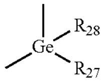

(Y-9)

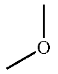

(Y-10)

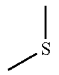

(Y-11)

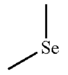

(Y-12)

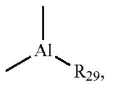

and $R_1$ to $R_{36}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{36}$, and their substituents optionally forms a substituted or unsubstituted ring with an adjacent substituent.

In Formula A, $Q_1$ is optionally further substituted with one or more substituents.

According to a specific embodiment of the present invention, in Formula A, each of $R_1$ to $R_{29}$, $Q_1$, and their substituents may optionally form a substituted or unsubstituted aliphatic, aromatic or non-aromatic ring containing at least one hydrocarbon or heteroatom with an adjacent substituent.

According to one embodiment of the present invention, in Formula A, each of $R_{18}$ to $R_{29}$ may be combined with $Q_1$ or its substituent to form a substituted or unsubstituted aliphatic, aromatic or non-aromatic ring containing at least one hydrocarbon or heteroatom. Each of $R_{18}$ to $R_{29}$ may be combined with $R_4$ to form a substituted or unsubstituted aliphatic, aromatic or non-aromatic ring containing at least one hydrocarbon or heteroatom. Each of $R_{18}$ to $R_{29}$ may contain at least one heteroatom. In a further embodiment, each of $R_{18}$ to $R_{29}$ may contain at least one nitrogen atom (N). These specific structures can be found in the specific compounds that are exemplified below.

According to one embodiment of the present invention, in Formula A, $R_3$, $Q_1$, and their substituents are optionally bonded together to form a substituted or unsubstituted aliphatic, aromatic or non-aromatic ring containing at least one hydrocarbon or heteroatom. These specific structures can be found in the specific compounds that are exemplified below.

According to a specific embodiment of the present invention, in Formula B, each of $R_1$ to $R_{36}$, and their substituents optionally forms a substituted or unsubstituted aliphatic, aromatic or non-aromatic ring containing at least one hydrocarbon or heteroatom with an adjacent substituent.

According to one embodiment of the present invention, in Formula B, $R_3$, $R_{30}$, and their substituents are optionally bonded together to form a substituted or unsubstituted aliphatic, aromatic or non-aromatic ring containing at least one hydrocarbon or heteroatom. These specific structures can be found in the specific compounds that are exemplified below.

The polycyclic compound of the present invention can be used to fabricate a highly efficient organic electroluminescent device.

As used herein, the term "substituted" and "further substituted with substituents" indicates substitution with one or more substituents selected from deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. As used herein, the term "unsubstituted" indicates having no substituent.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted aliphatic, aromatic or non-aromatic ring containing at least one hydrocarbon or heteroatom and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The definitions of the terms "aliphatic ring", "aliphatic linker", "aromatic ring", and "non-aromatic ring" are as follows.

The aliphatic ring refers to a saturated or unsaturated ring consisting of alkylene, alkenylene, and/or alkynylene and optionally containing at least one hydrocarbon or heteroatom. The aliphatic linker also refers to a saturated or unsaturated linking group selected from alkylene, alkenylene, alkynylene, and combinations thereof.

Specifically, the aromatic ring may be, for example, naphthalene, anthracene, benzanthracene, benzopyrene, acenaphthylene, 1,2-dihydroacenaphthylene, phenanthrene, chrysene, indenopyrene, fluorene, fluoranthene, benzacephenanthrylene, benzoperylene, pyrene, benzofluoranthene or dibenzanthracene.

Specific examples of non-aromatic rings include, but are not limited to, the following structures:

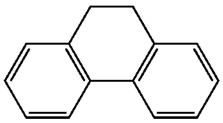
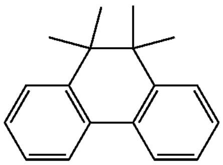
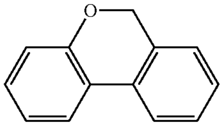
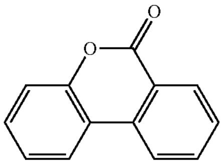
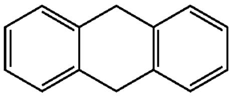
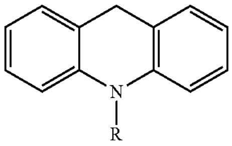
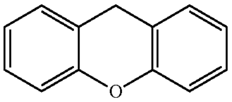
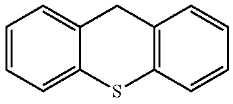
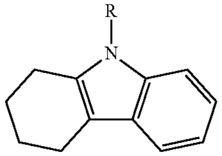
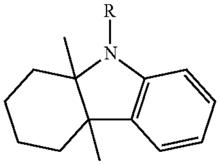
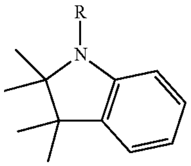
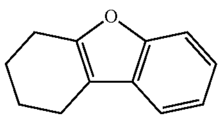

The other substituents are known to those skilled in the art to which the present invention pertains. The alkyl groups may be straight or branched, and the numbers of carbon atoms therein are not particularly limited but are preferably 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphthenyl, triphenylene, and fluoranthene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and heteroarylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups may be monocyclic or polycyclic ones. The arylamine groups may include two or more aryl moieties. In this case, the aryl moieties may be monocyclic aryl moieties or monocyclic heteroaryl moieties. Alternatively, the aryl moieties may consist of a monocyclic aryl moiety and a polycyclic aryl moiety. The aryl moieties in the arylamine groups may be selected from those exemplified above.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic compound represented by Formula A or B according to the present invention may be selected from, but not limited to, the following compounds 1 to 215:

1

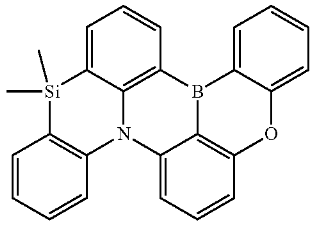

2

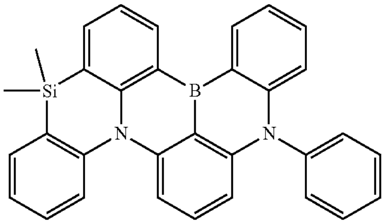

3

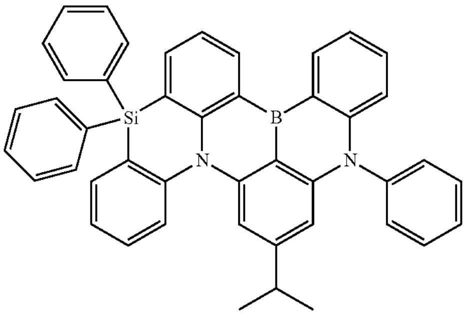

-continued

4

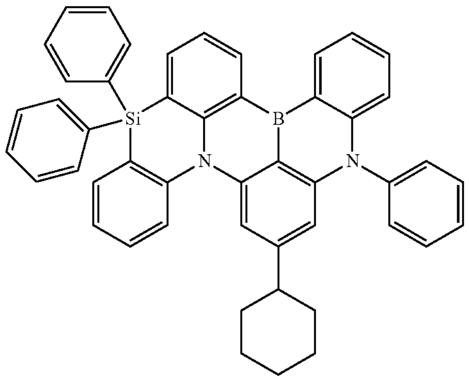

5

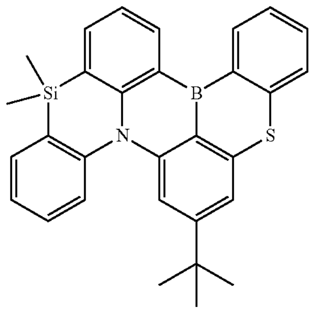

6

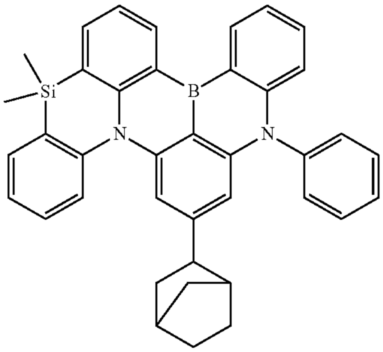

7

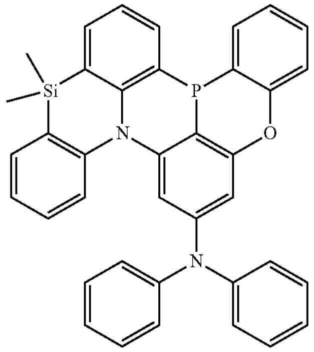

8
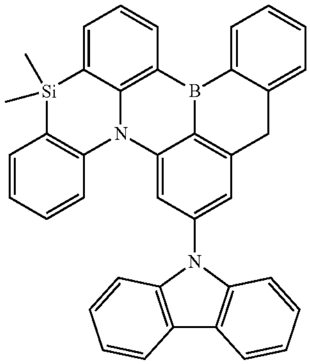
9
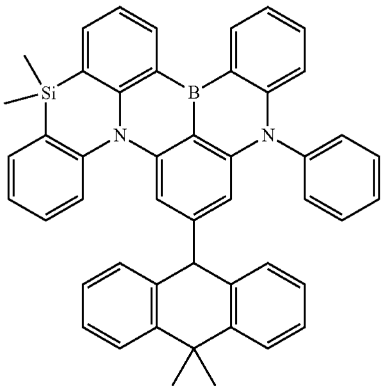
10
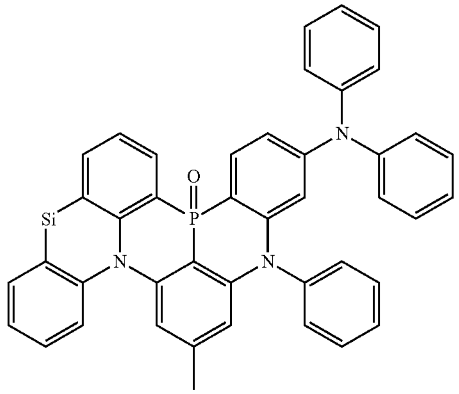
11
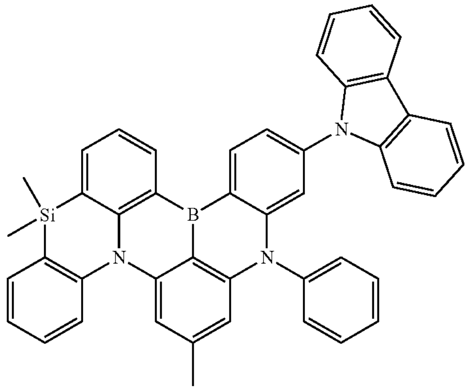
12
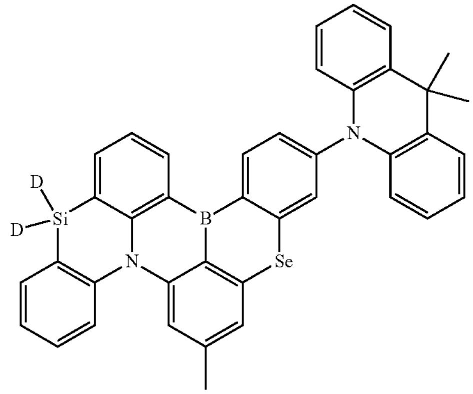
13
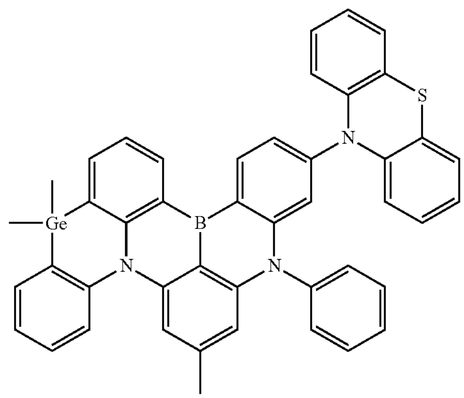
14
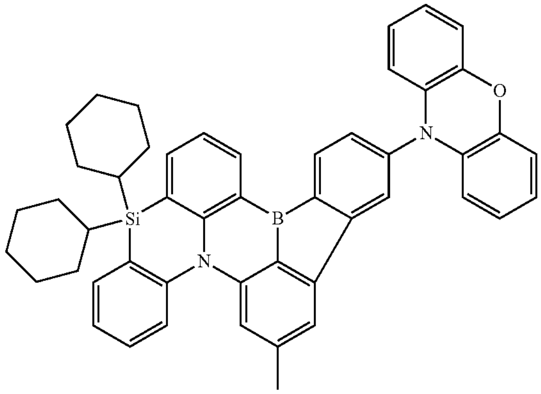
15
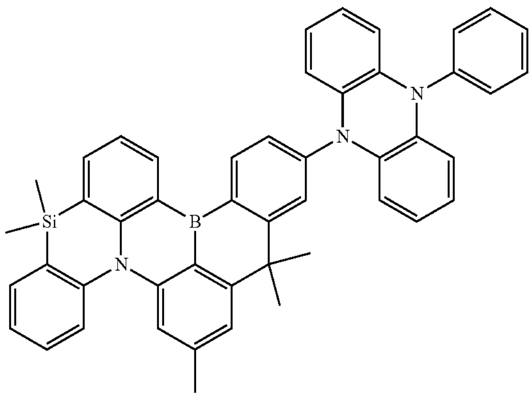

-continued
16
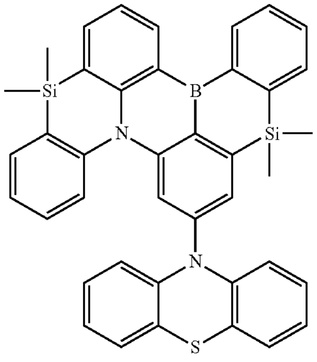
17
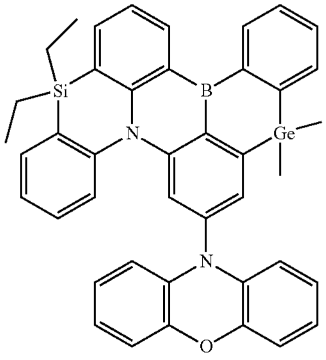
18
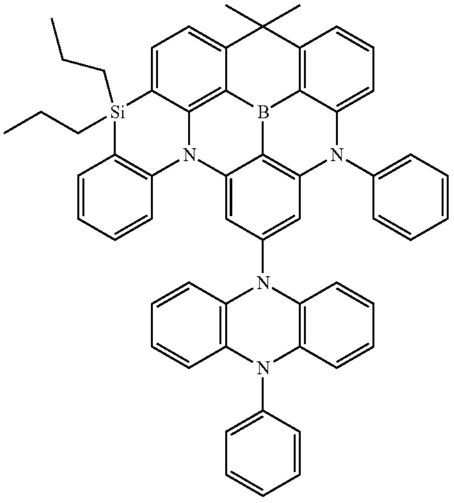
19
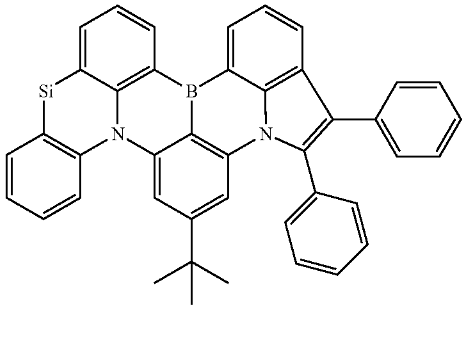
-continued
20
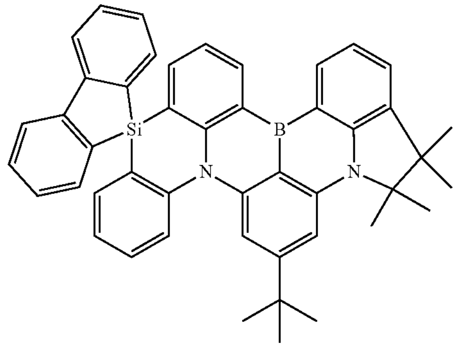
21
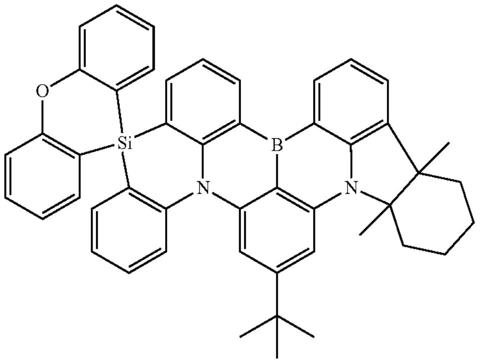
22
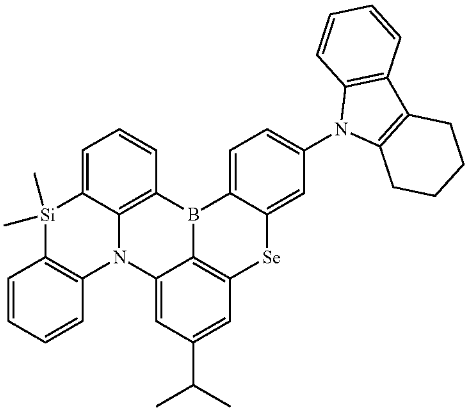
23
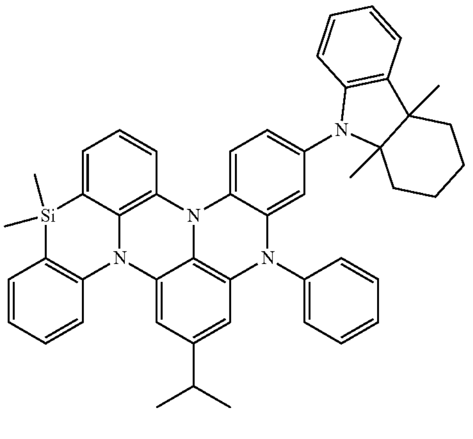

-continued
24
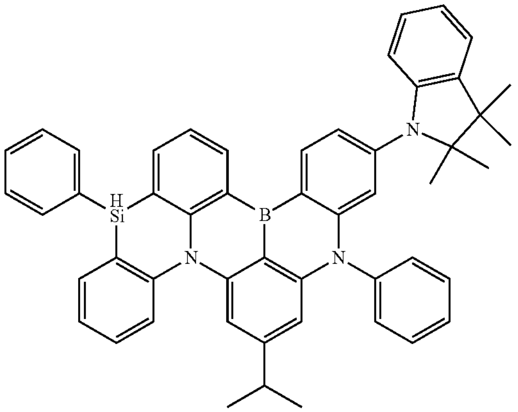
25
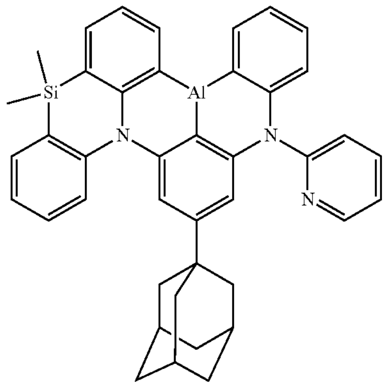
26
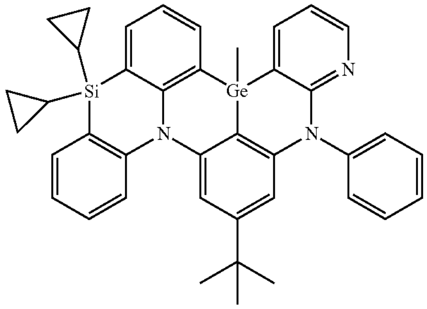
27
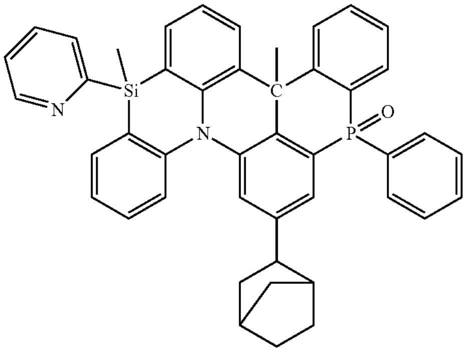
-continued
28
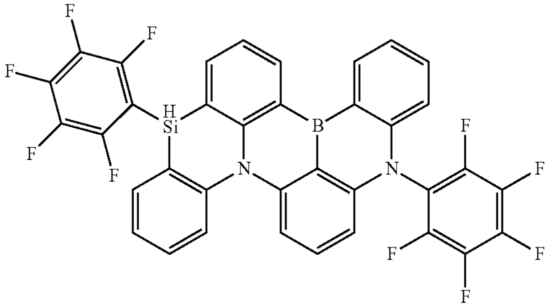
29
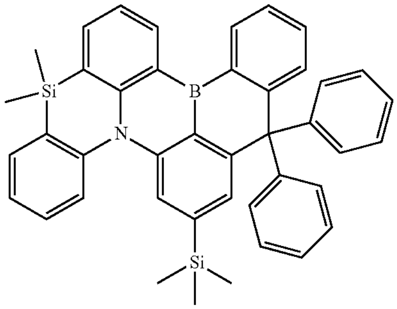
30
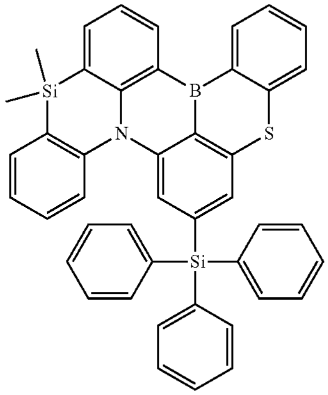
31
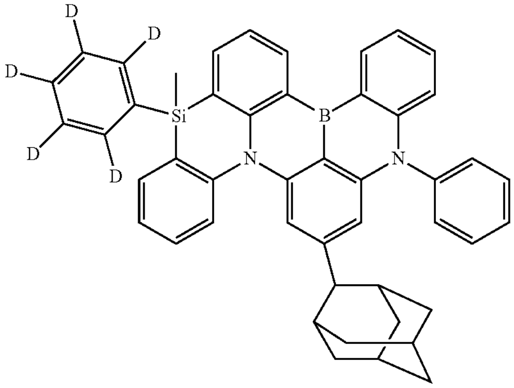

-continued
32
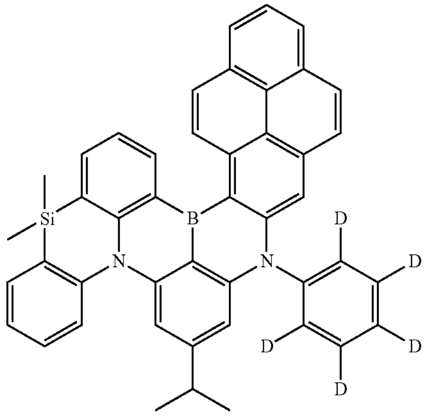
33
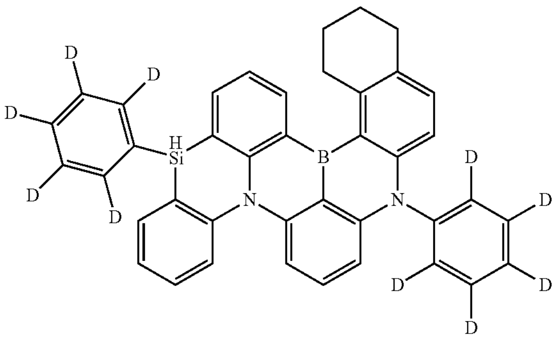
34
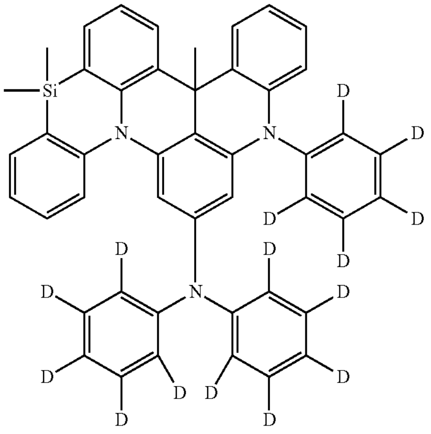
-continued
35
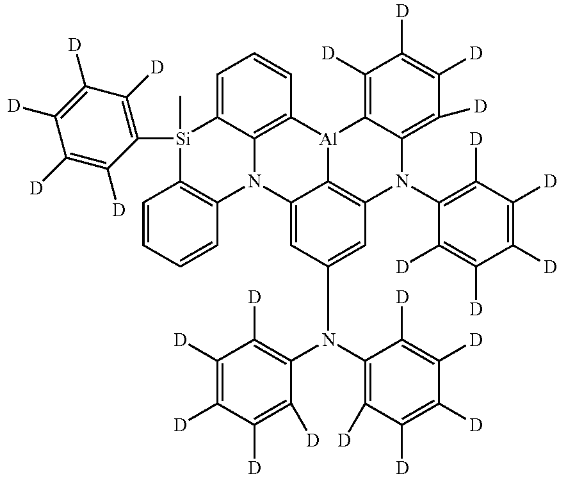
36
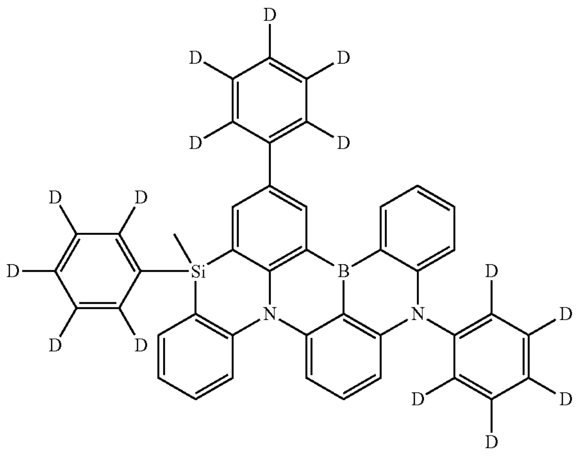
37
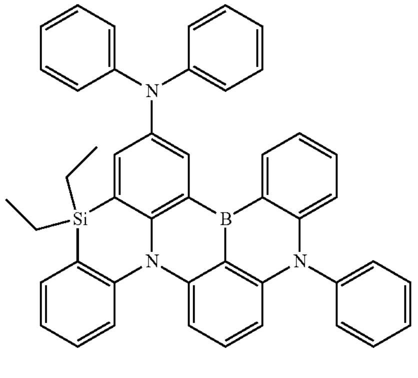

-continued
38
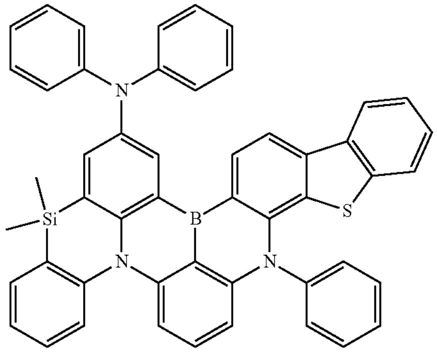
39
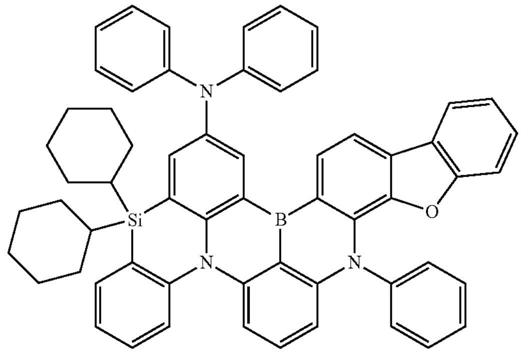
40
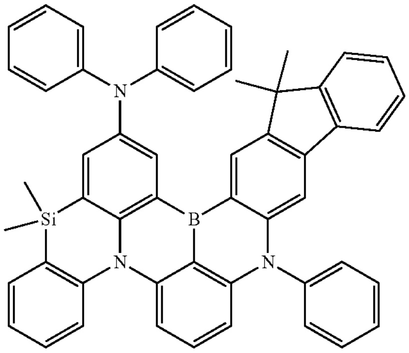
41
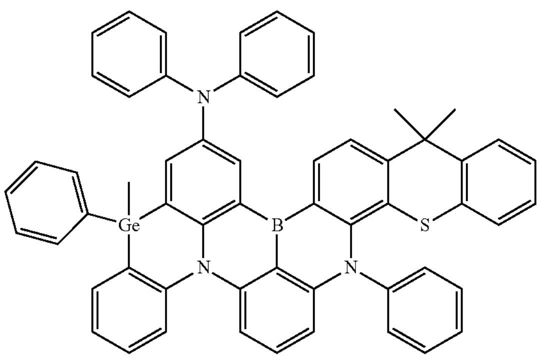
-continued
42
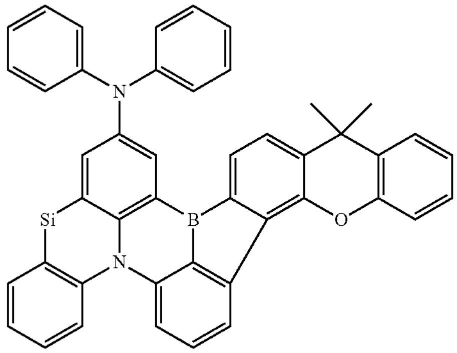
43
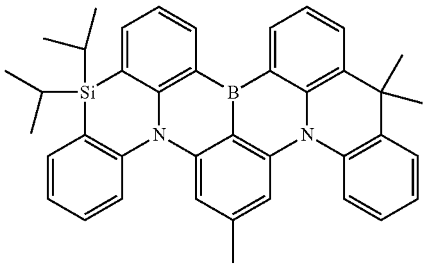
44
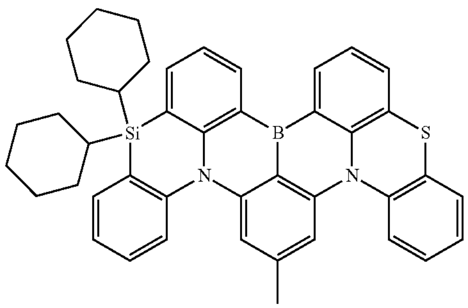
45
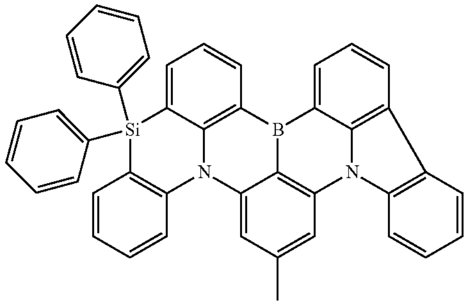
46
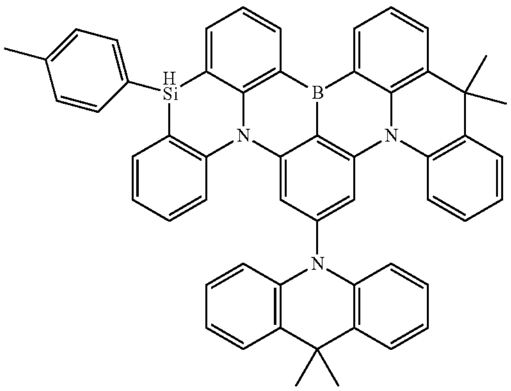

-continued
47
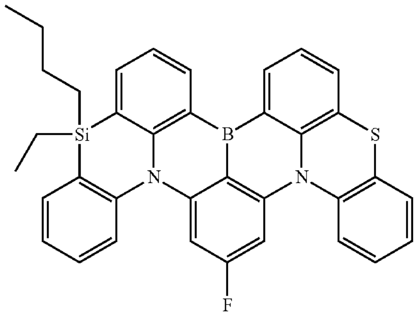
48
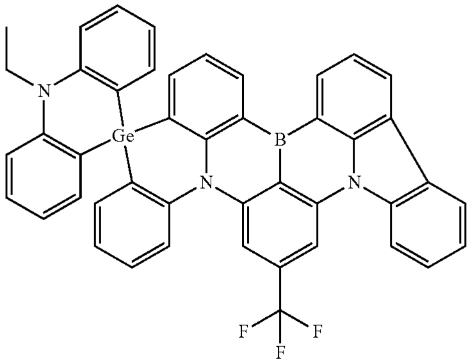
49
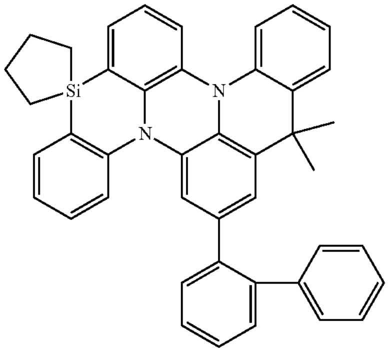
50
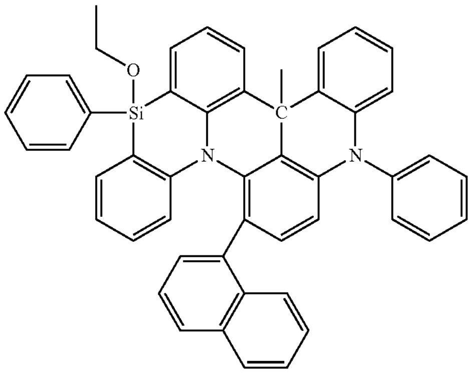
-continued
51
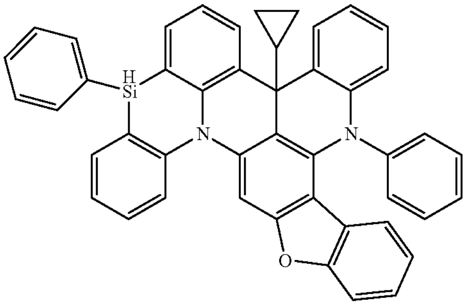
52
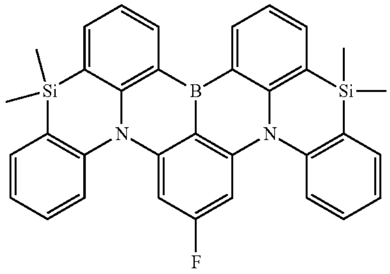
53
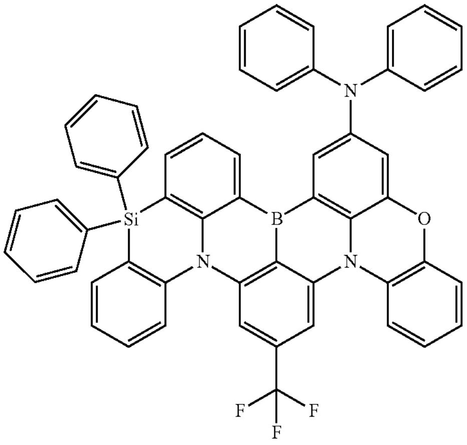
54
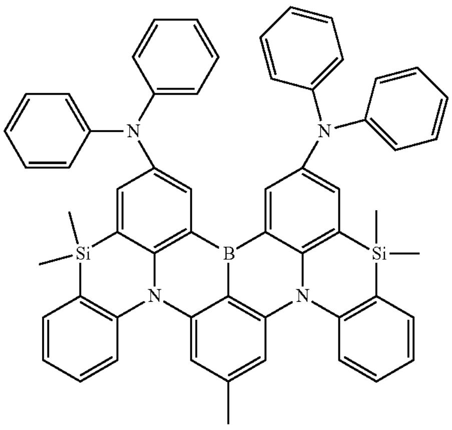

-continued
55
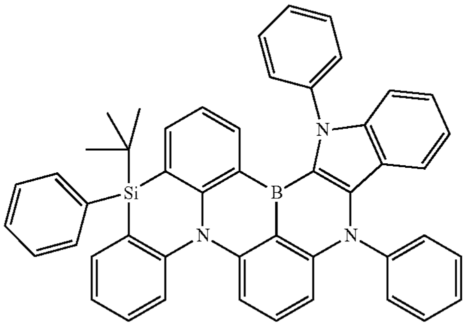
56
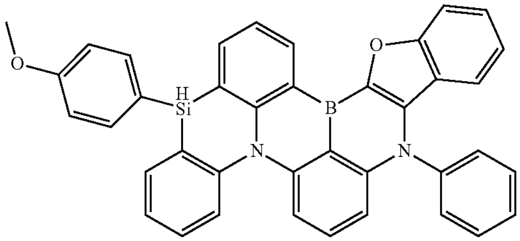
57
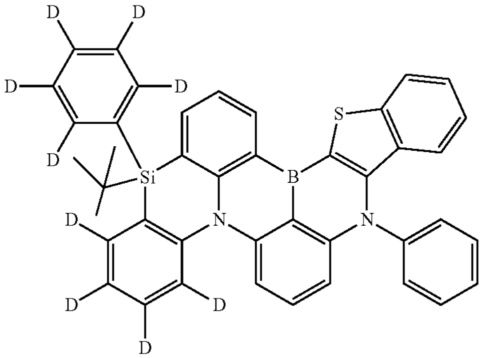
58
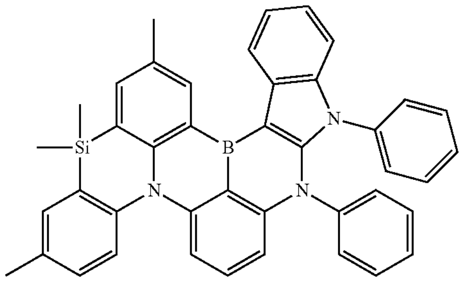
59
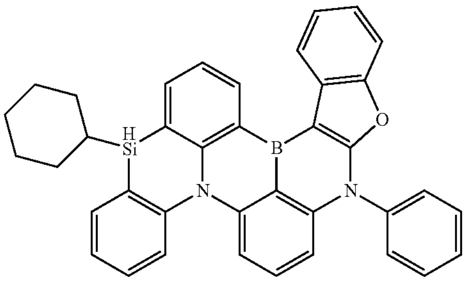
-continued
60
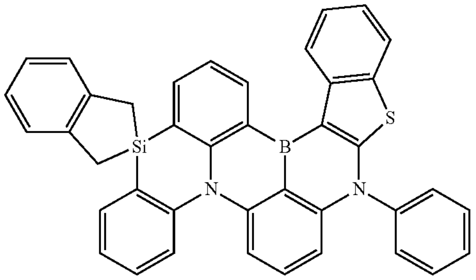
61
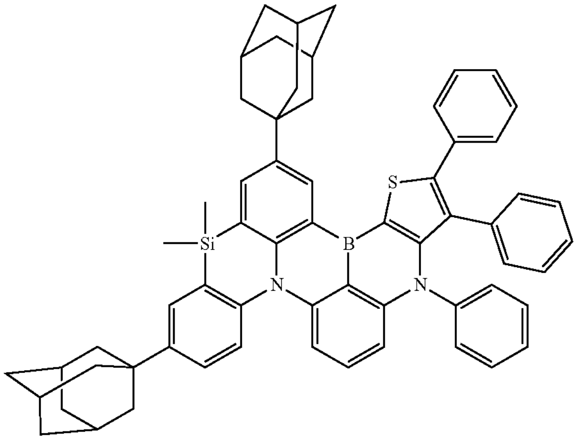
62
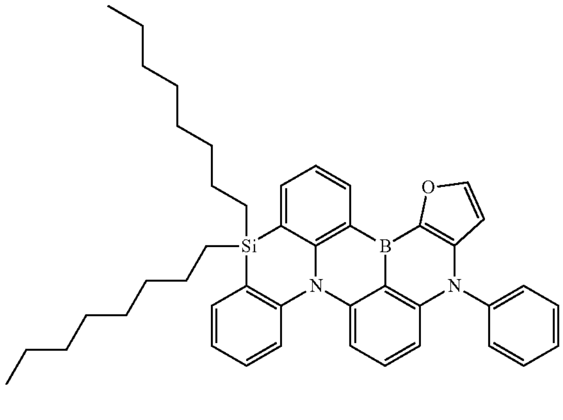
63
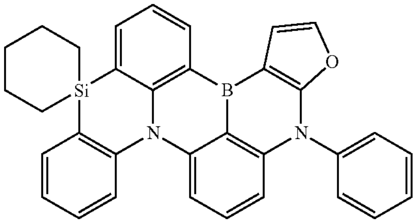

-continued
64
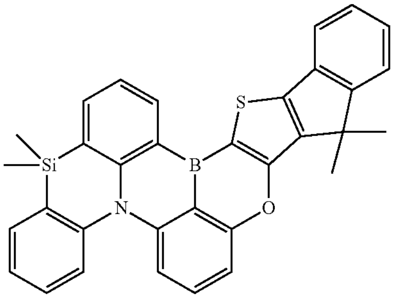
65
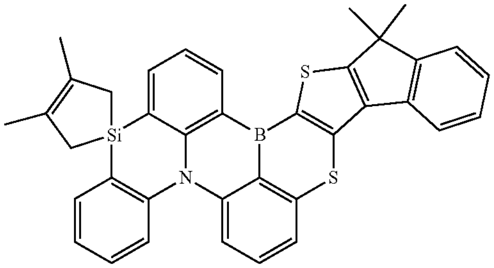
66
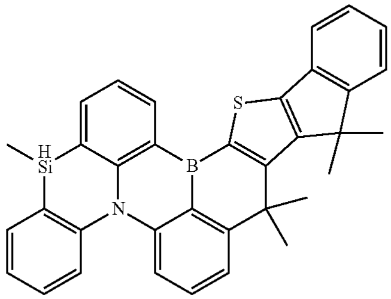
67
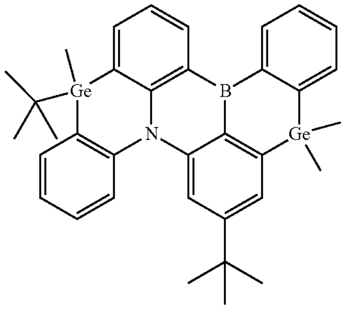
68
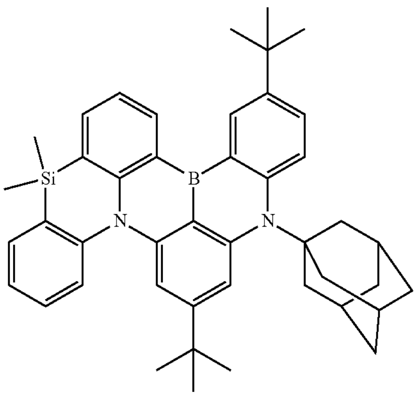
-continued
69
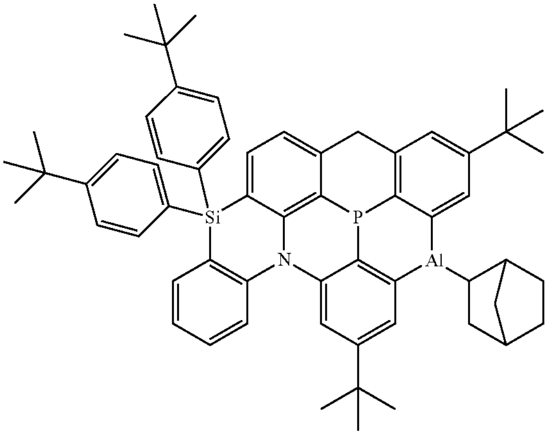
70
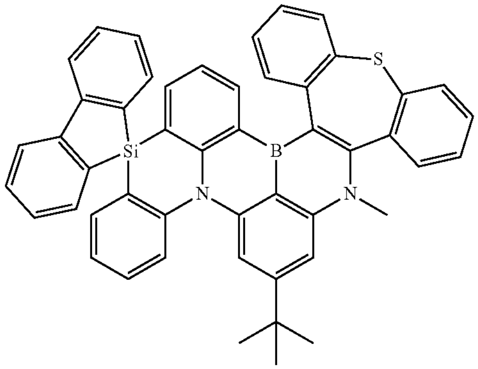
71
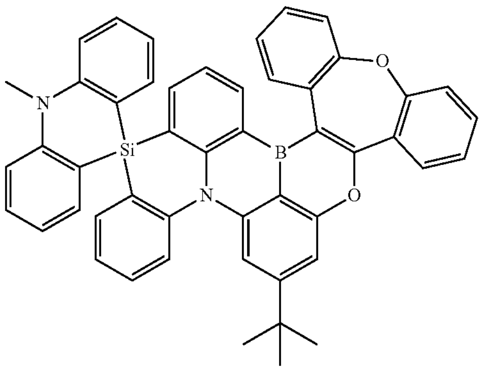
72
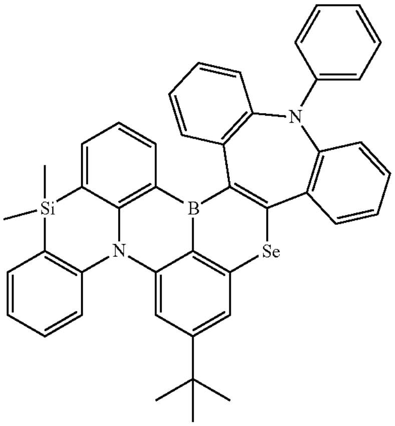

-continued
73
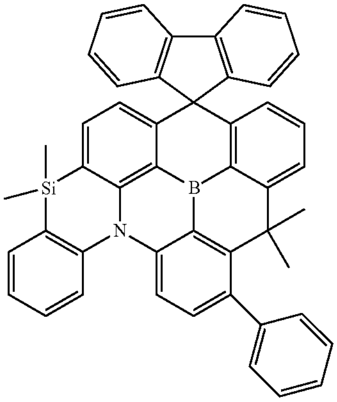
74
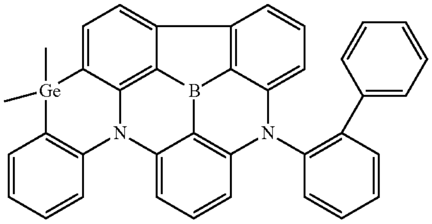
75
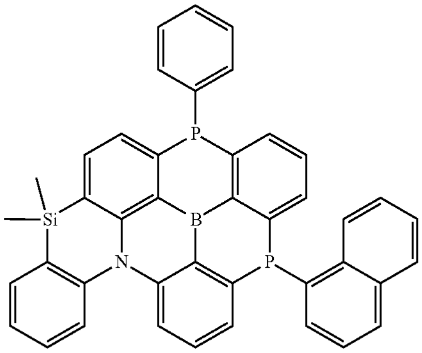
76
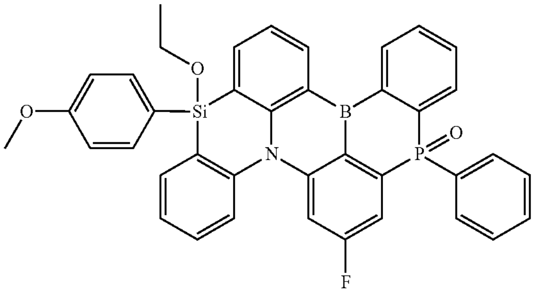
77
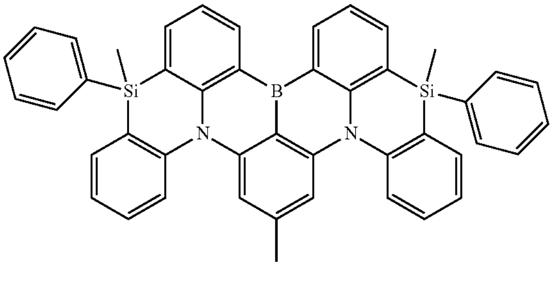
-continued
78
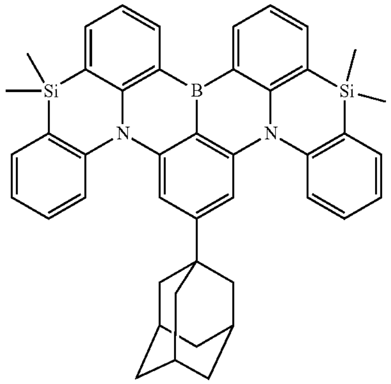
79
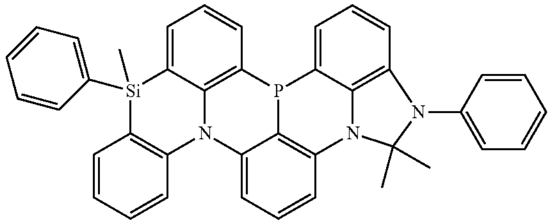
80
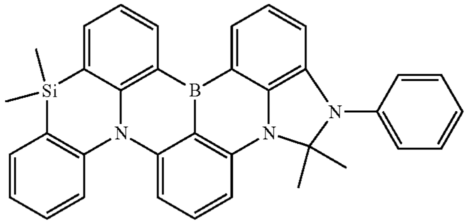
81
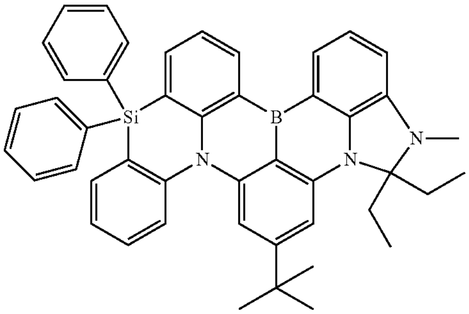
82
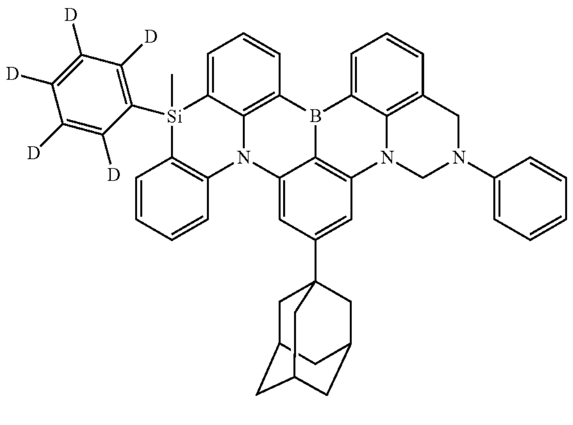

-continued
83
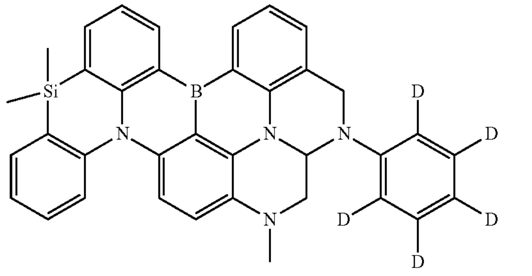
84
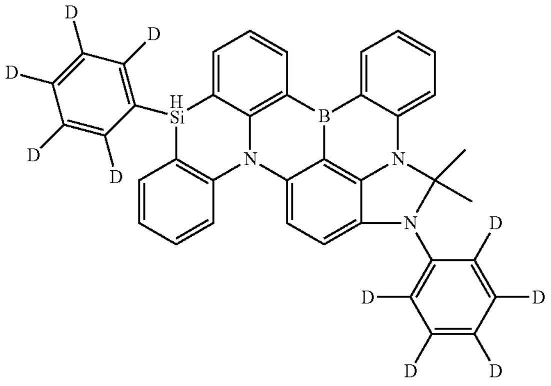
85
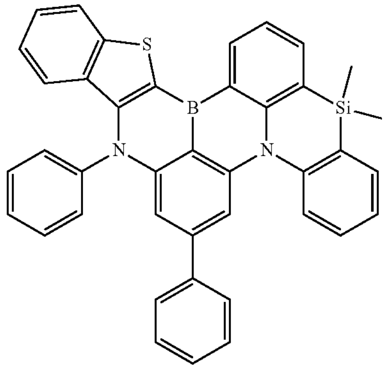
86
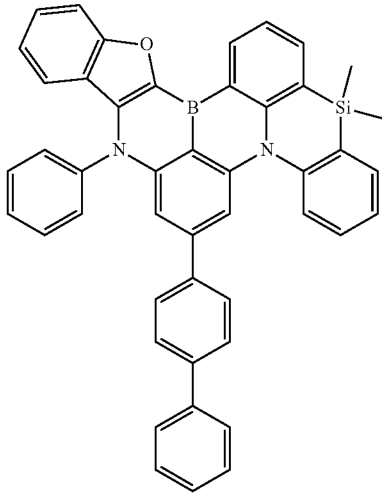
-continued
87
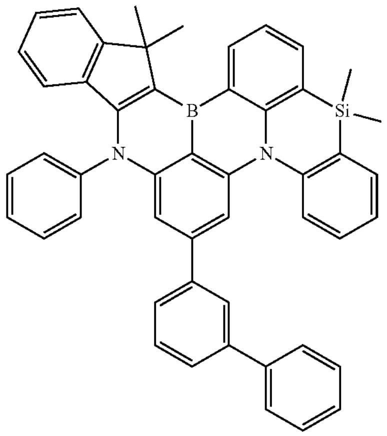
88
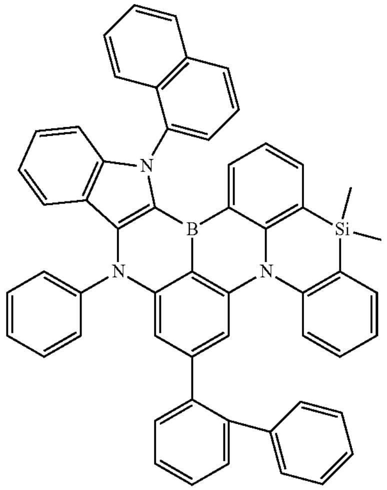
89
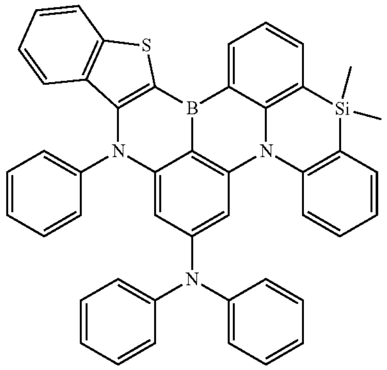

-continued
90
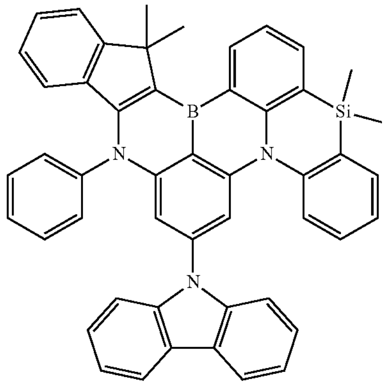
91
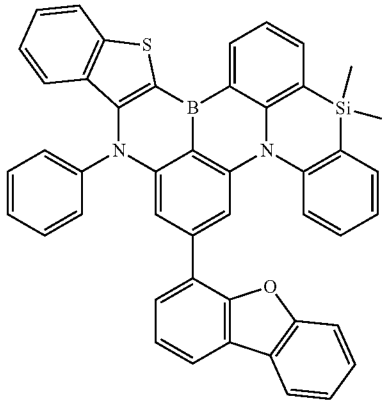
92
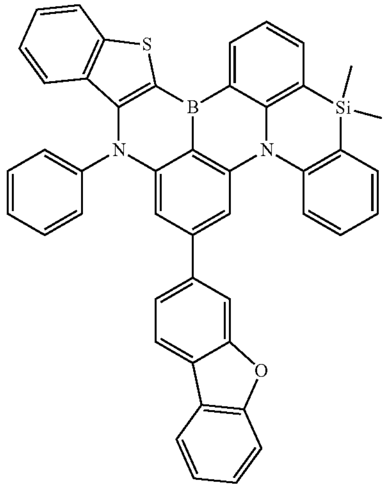
-continued
93
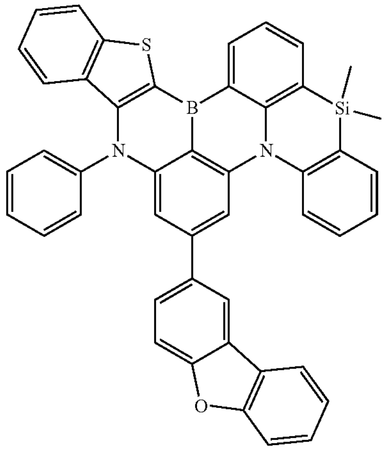
94
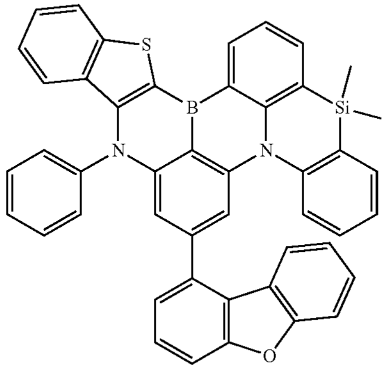
95
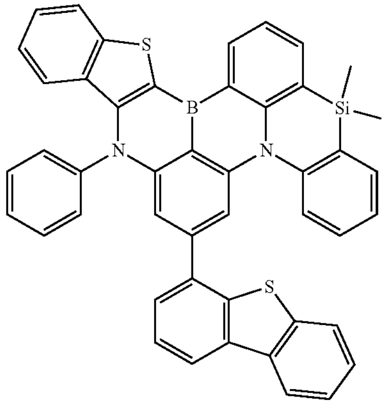

-continued
96
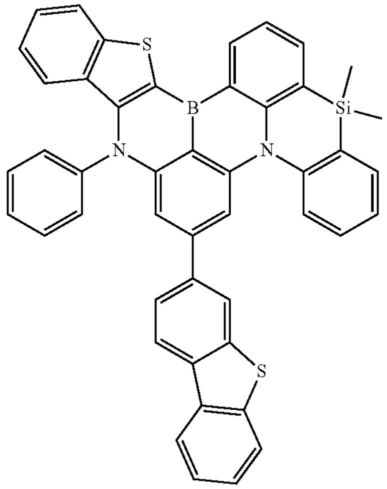
97
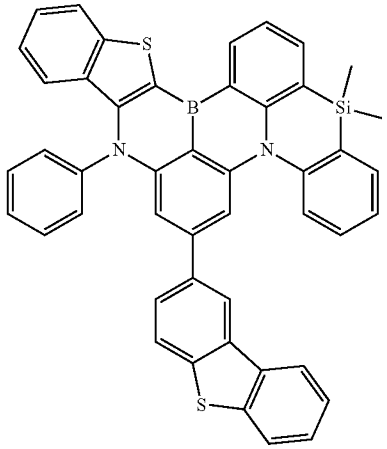
98
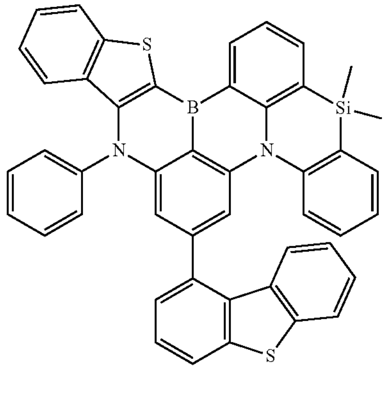
-continued
99
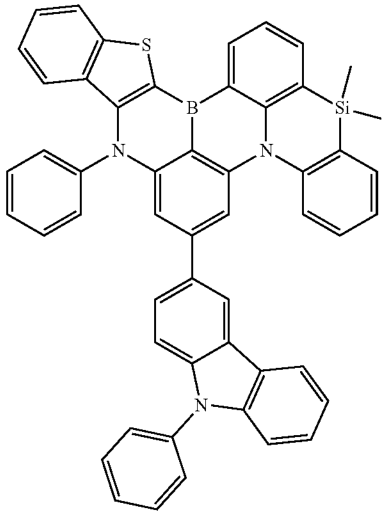
100
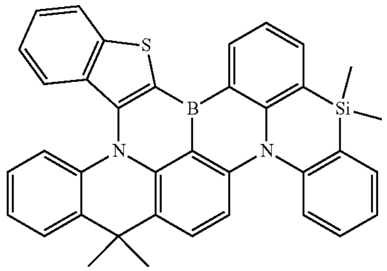
101
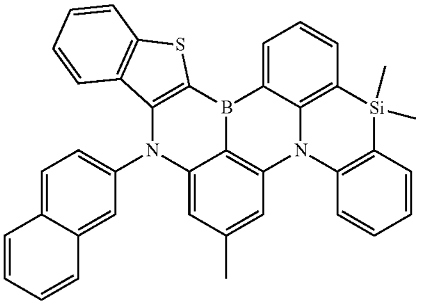
102
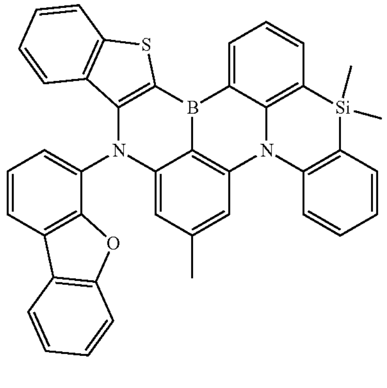

-continued
103
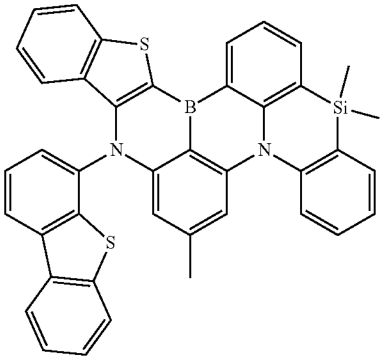
104
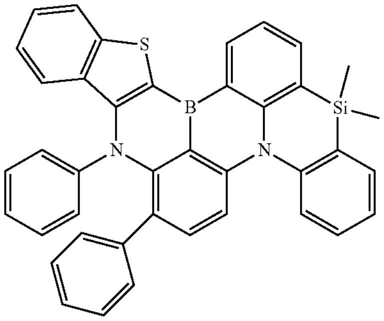
105
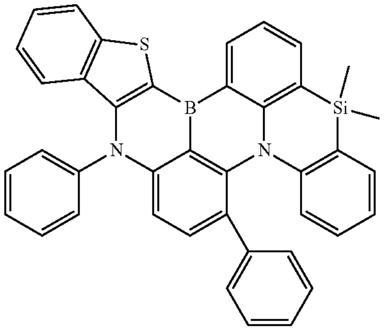
106
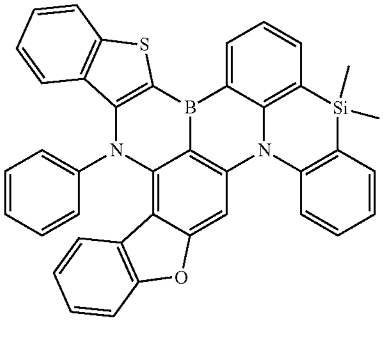
-continued
107
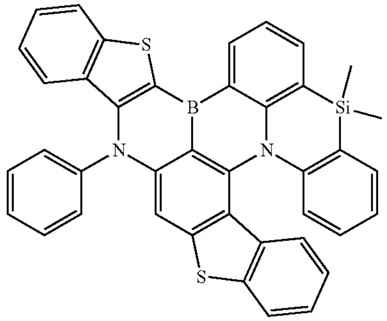
108
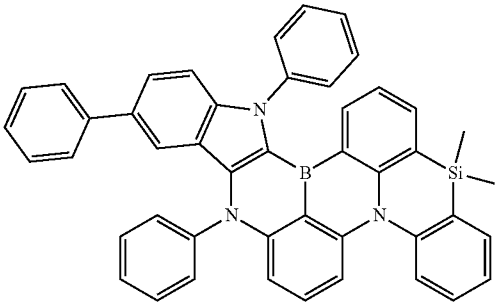
109
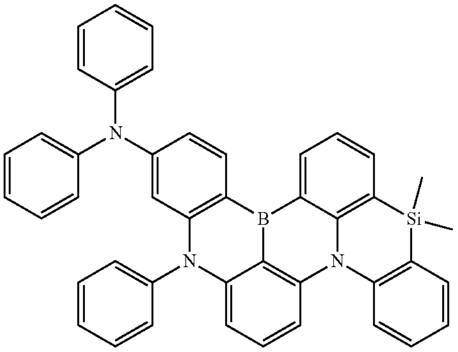
110
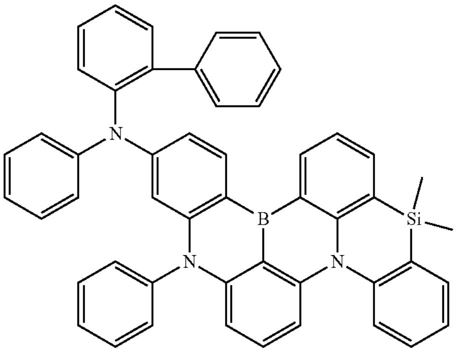

-continued
111
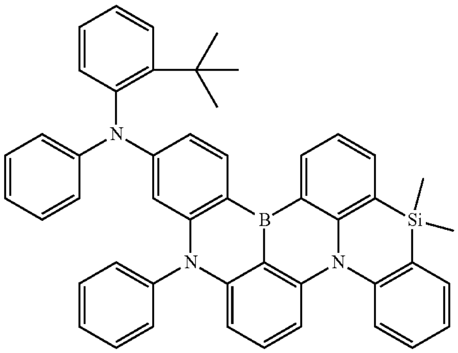
112
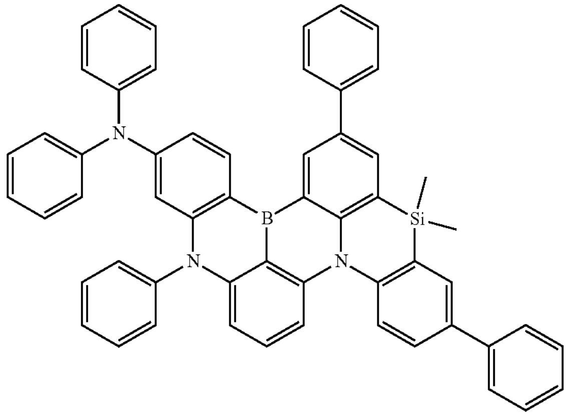
113
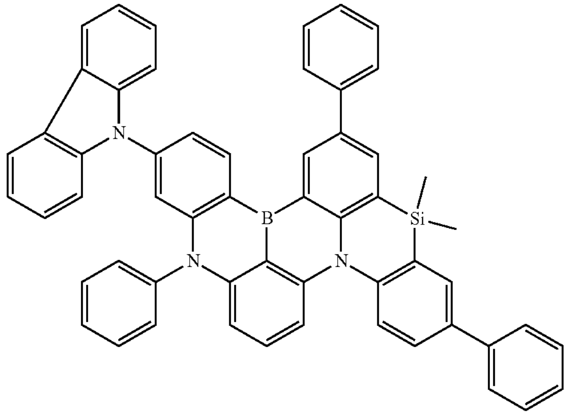
-continued
114
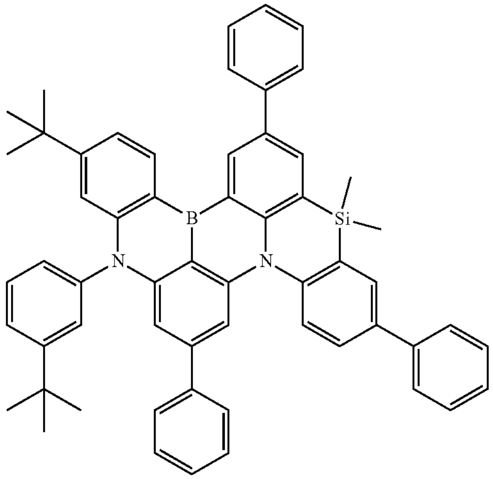
115
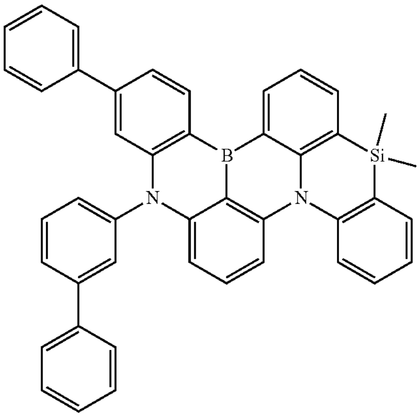
116
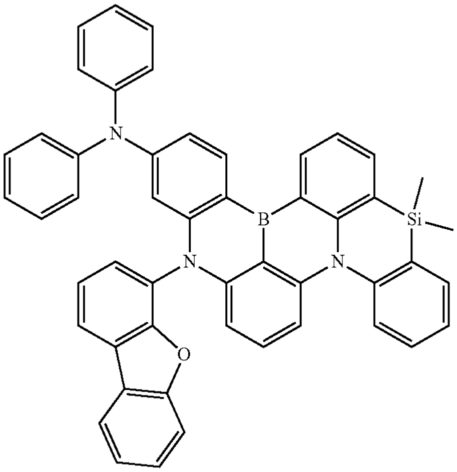

-continued
117
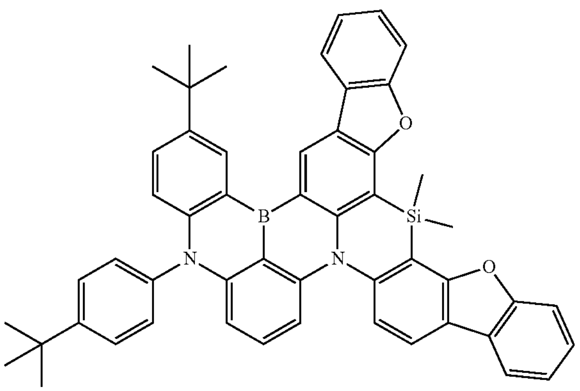
118
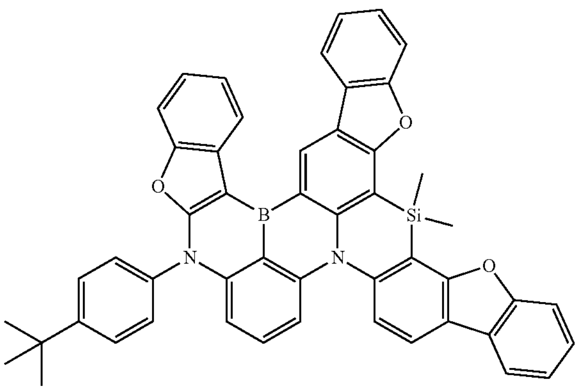
119
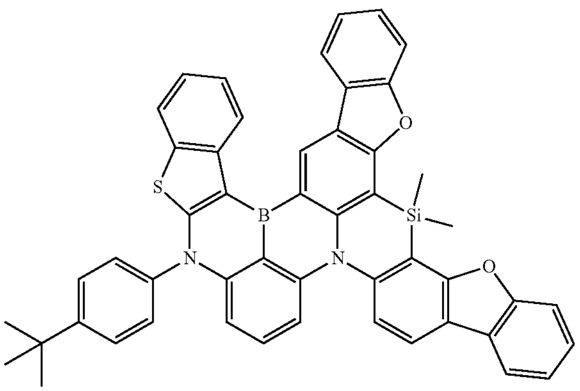
120
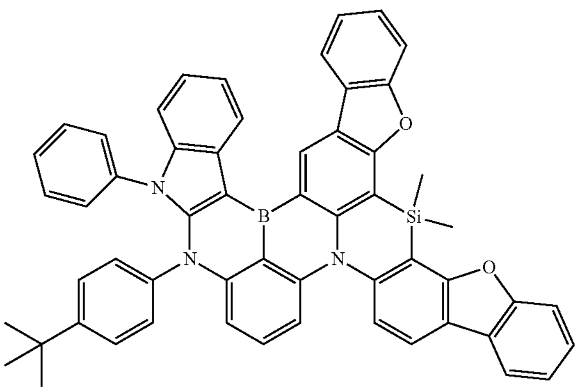
-continued
121
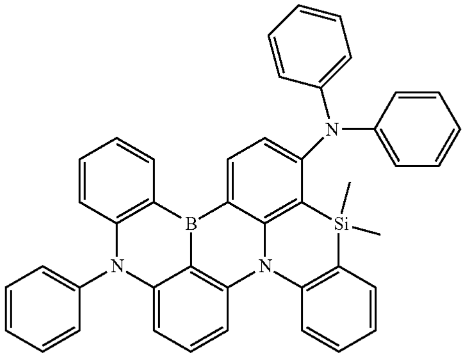
122
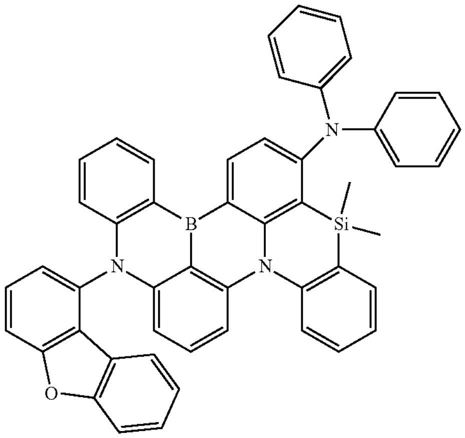
123
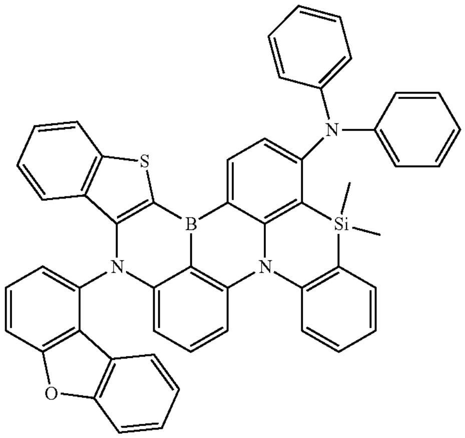
124
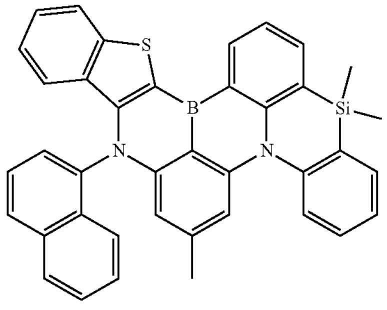

-continued
125
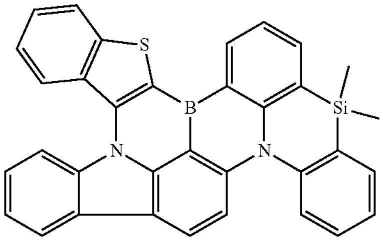
126
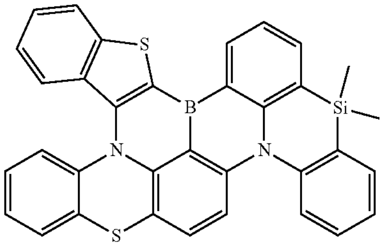
127
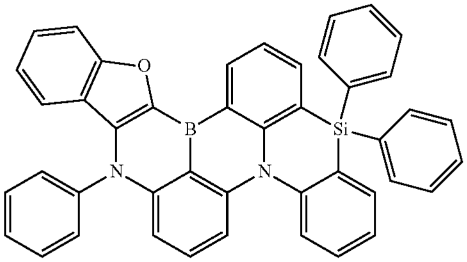
128
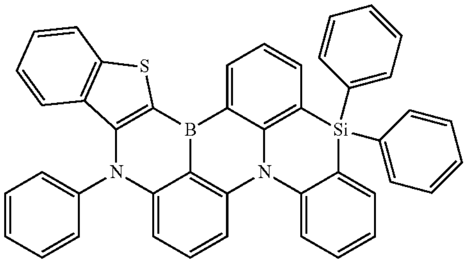
129
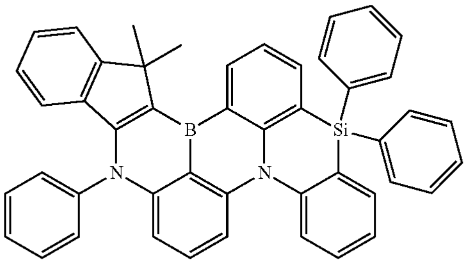
130
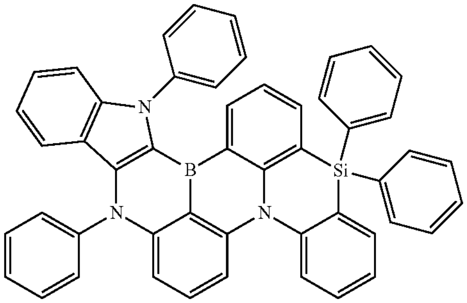
-continued
131
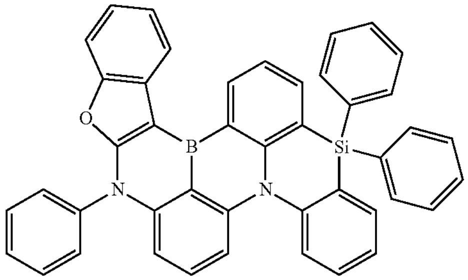
132
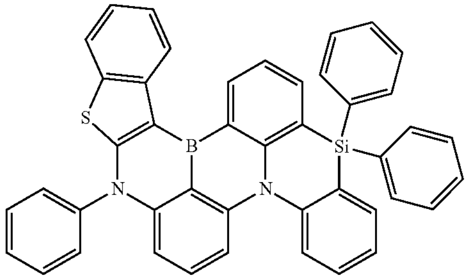
133
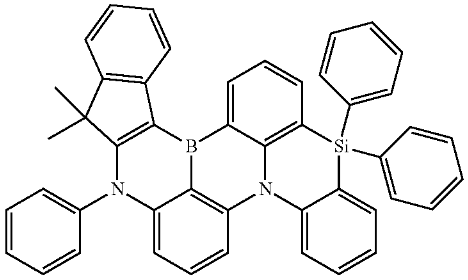
134
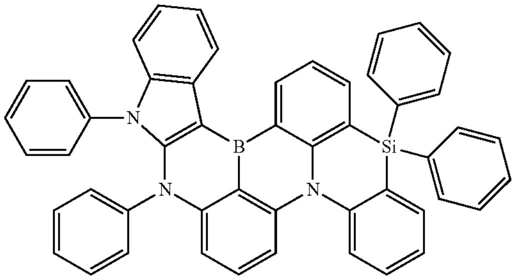
135
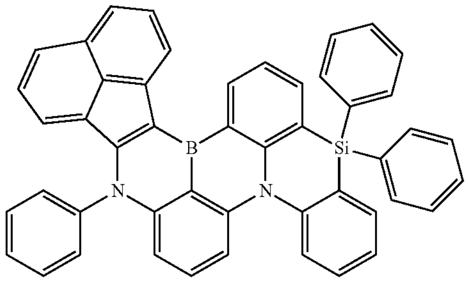

-continued
136
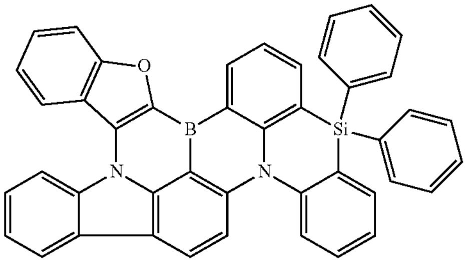
137
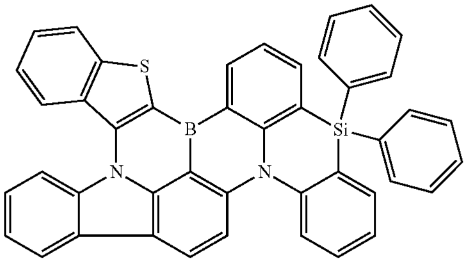
138
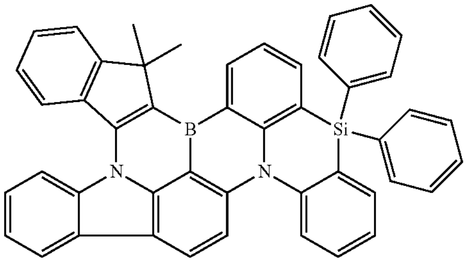
139
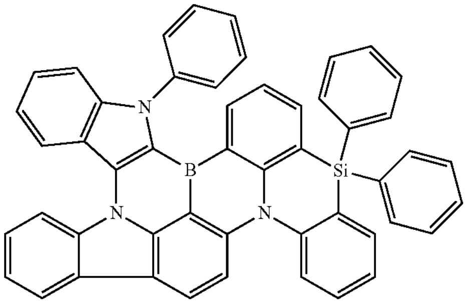
140
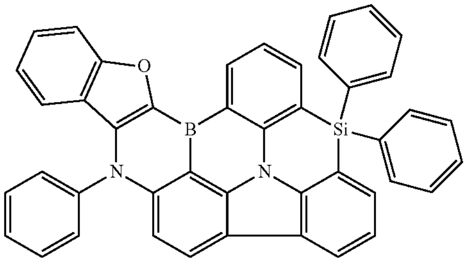
-continued
141
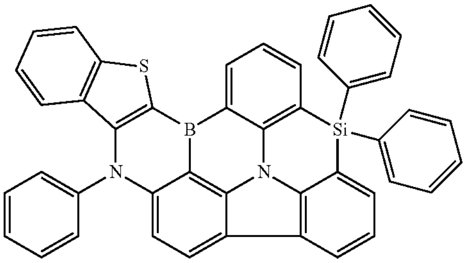
142
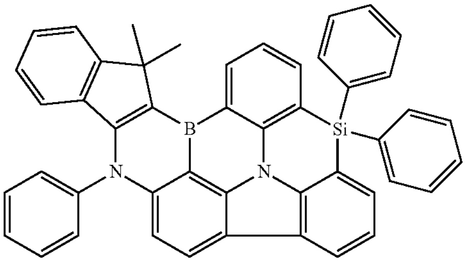
143
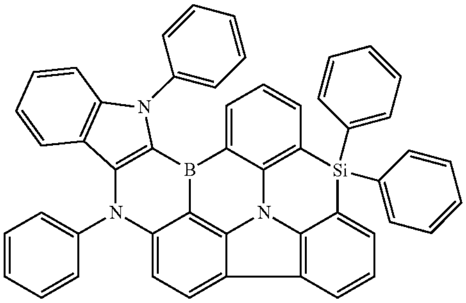
144
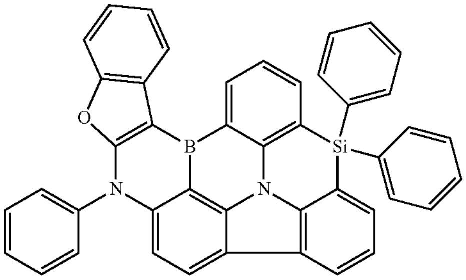
145
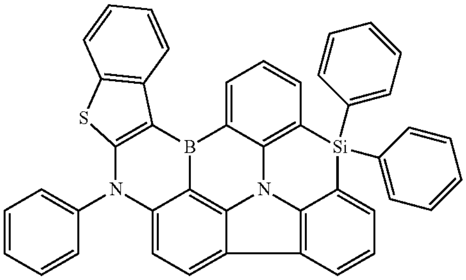

-continued
146
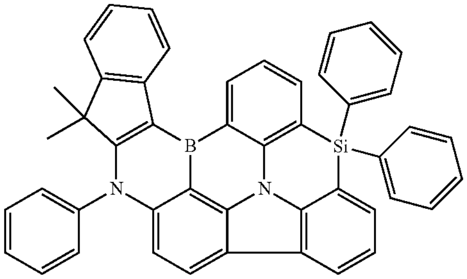
147
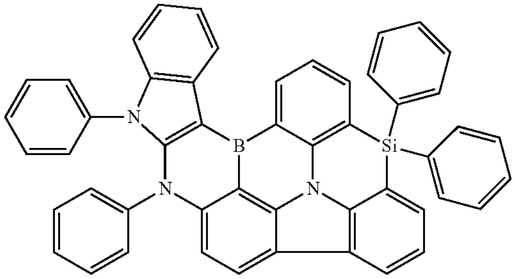
148
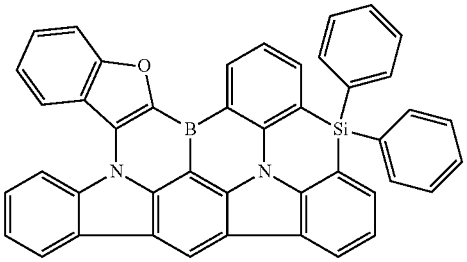
149
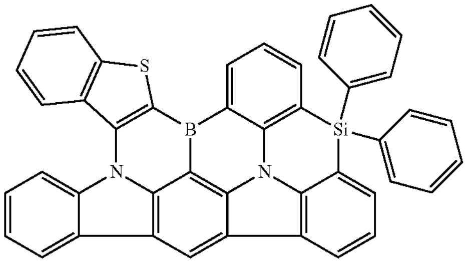
150
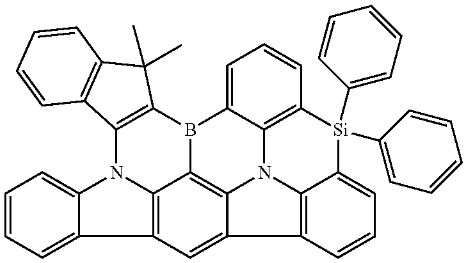
-continued
151
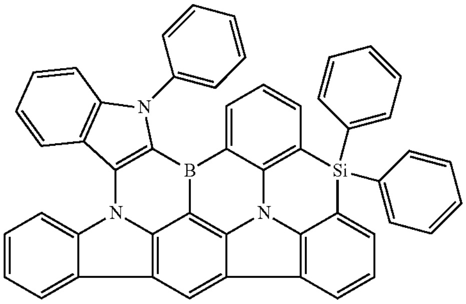
152
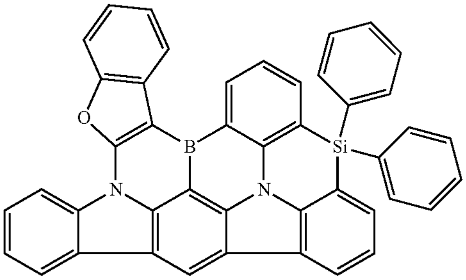
153
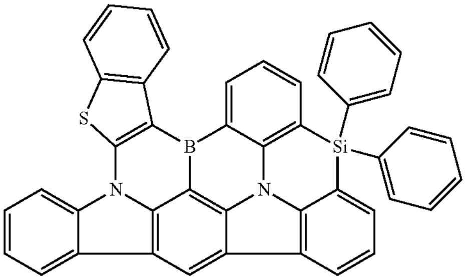
154
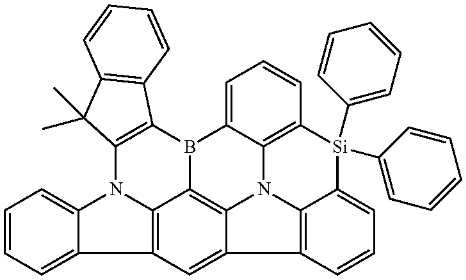
155
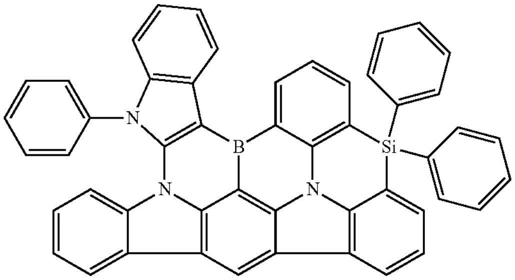

-continued
156
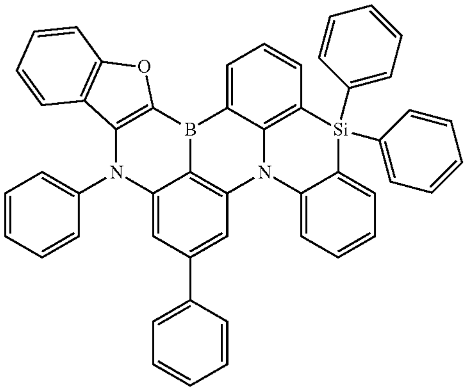
157
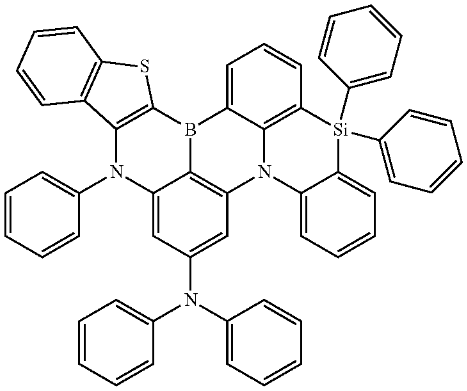
158
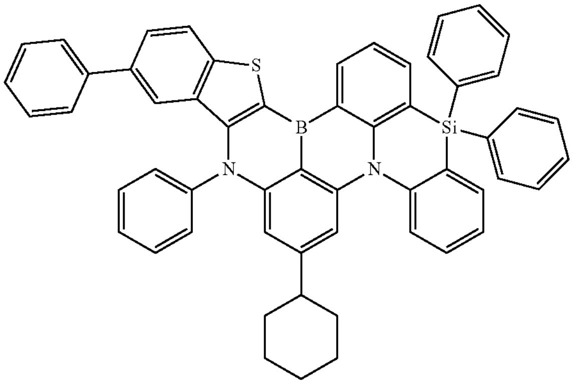
159
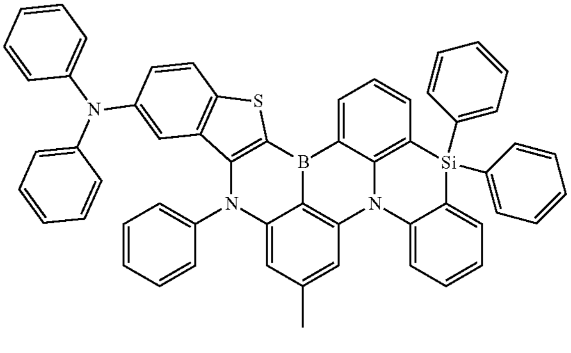
-continued
160
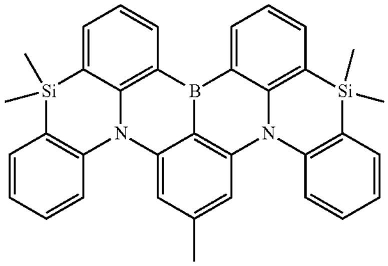
161
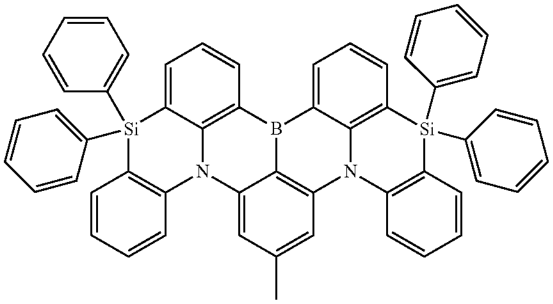
162
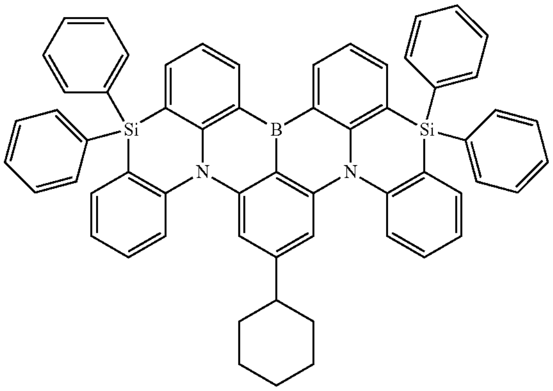
163
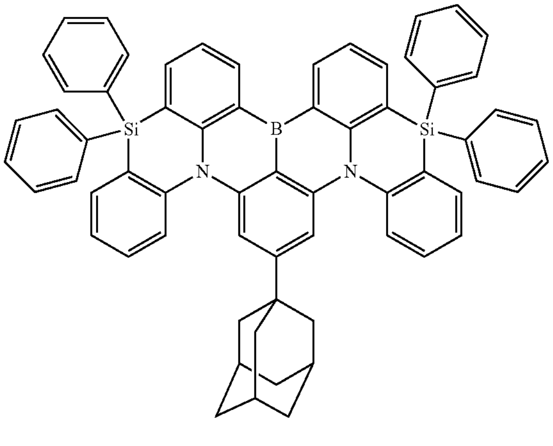

-continued
164
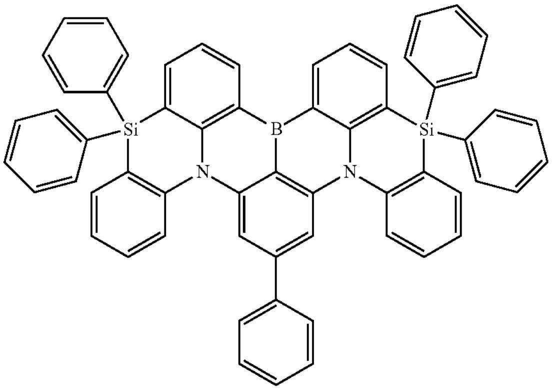
165
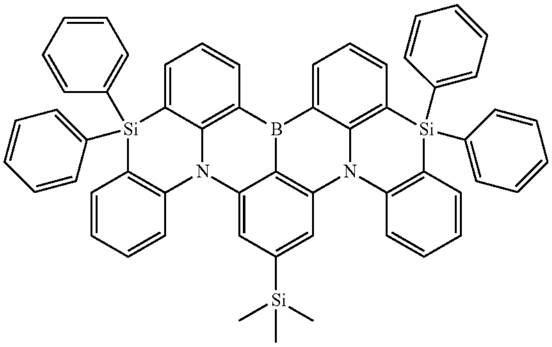
166
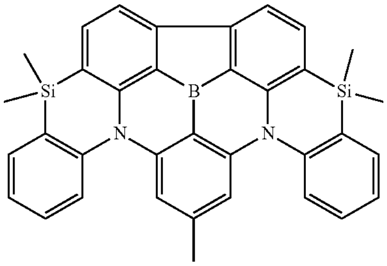
167
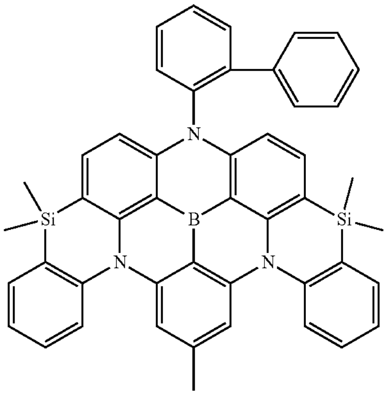
-continued
168
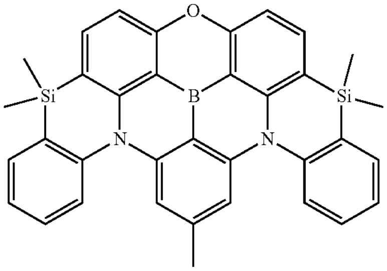
169
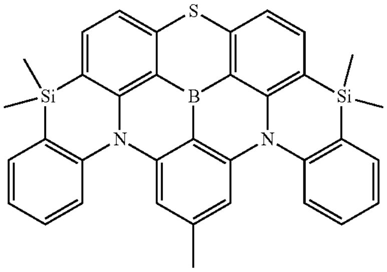
170
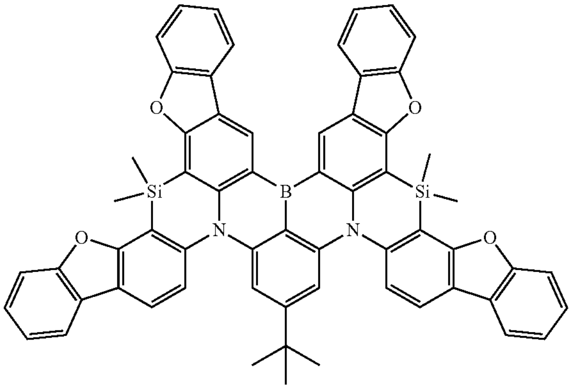
171
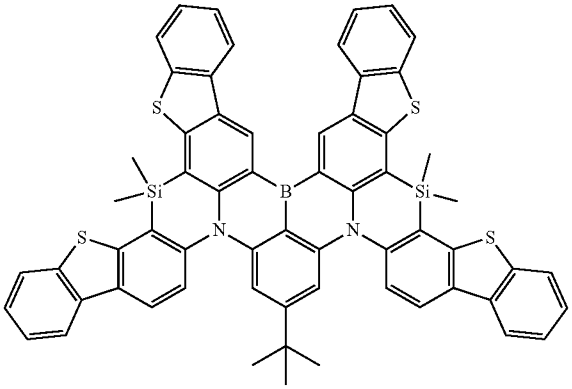

-continued
172
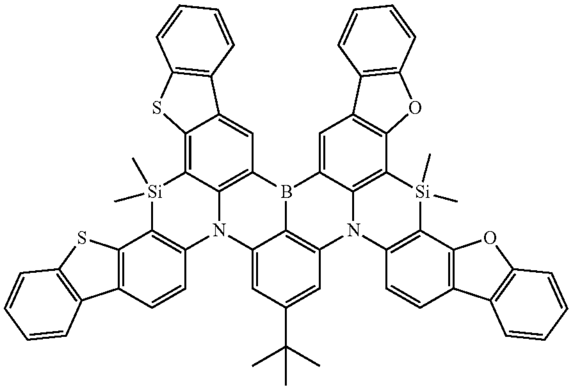
173
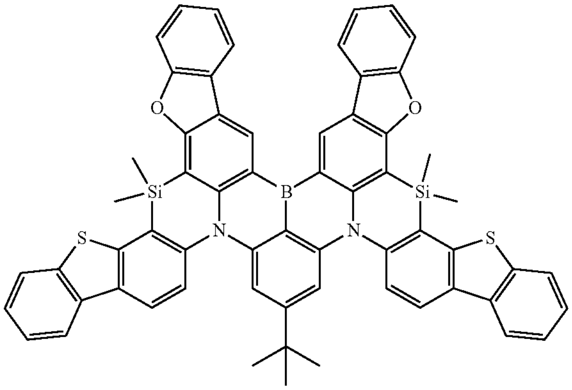
174
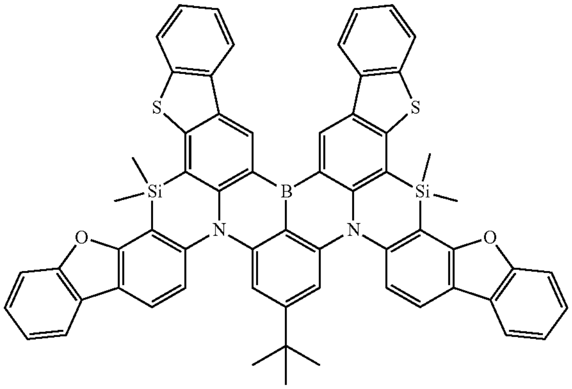
175
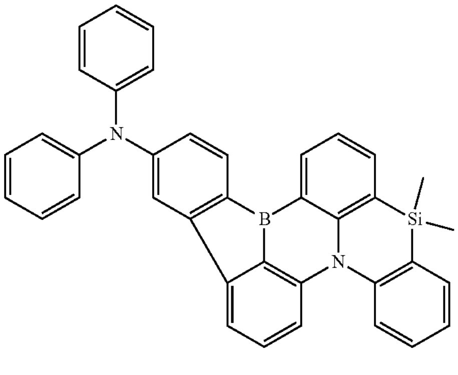
-continued
176
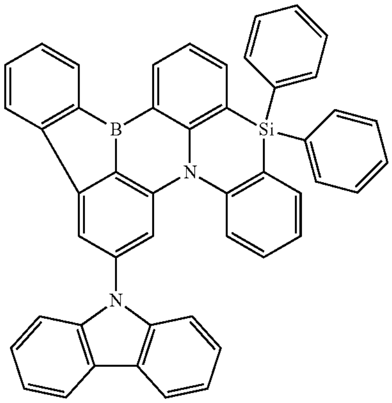
177
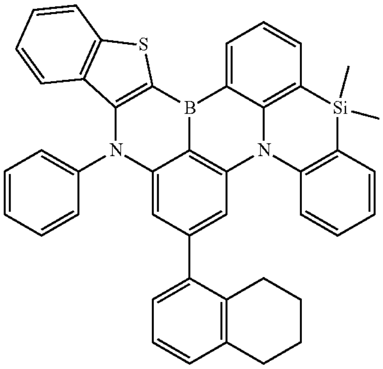
178
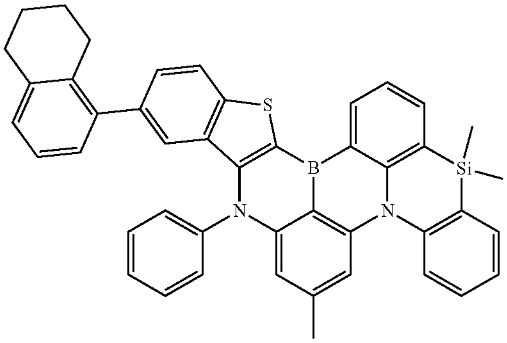
179
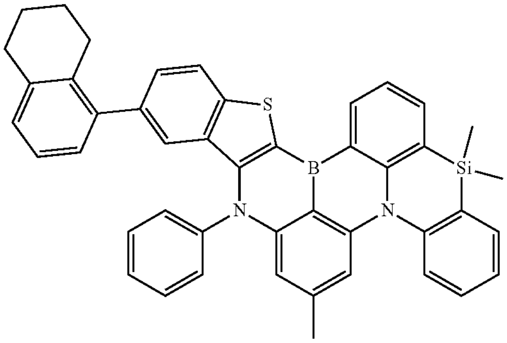

-continued
180
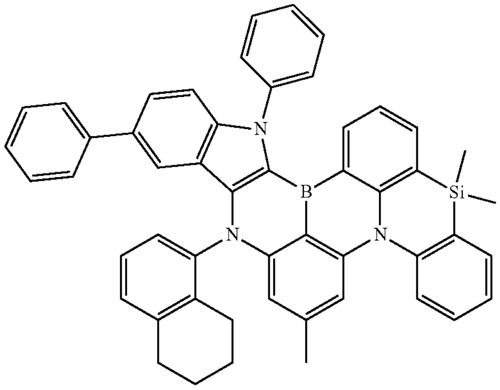
181
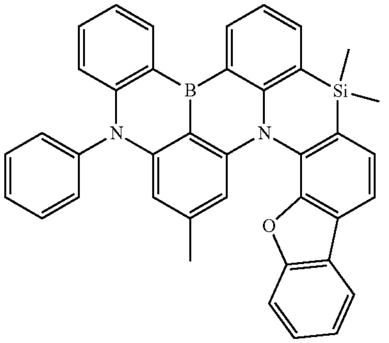
182
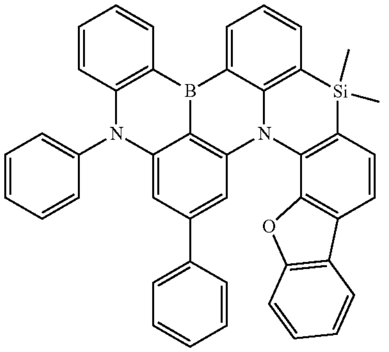
183
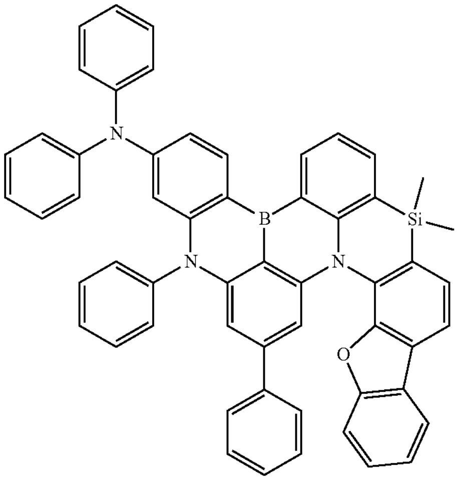
-continued
184
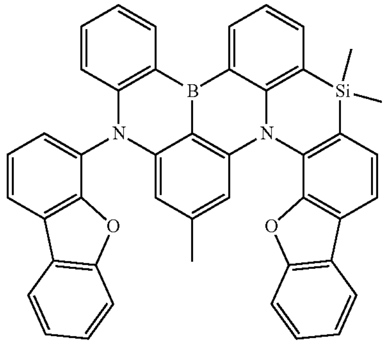
185
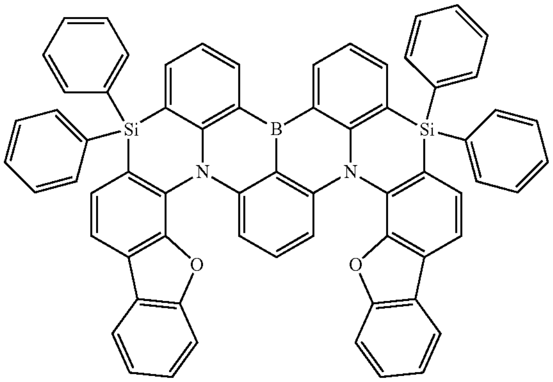
186
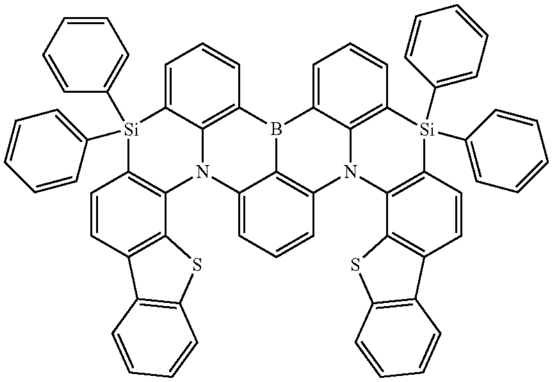
187
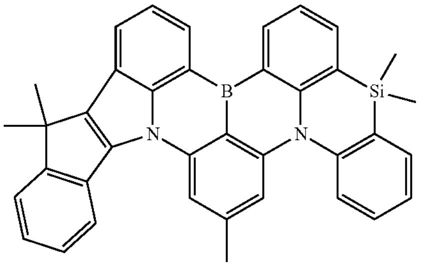

-continued
188
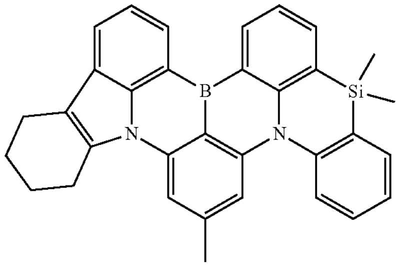
189
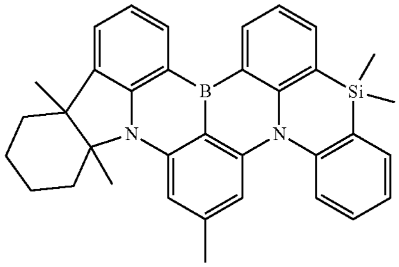
190
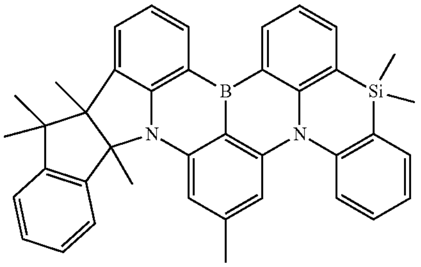
191
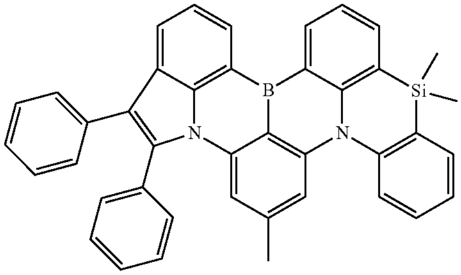
192
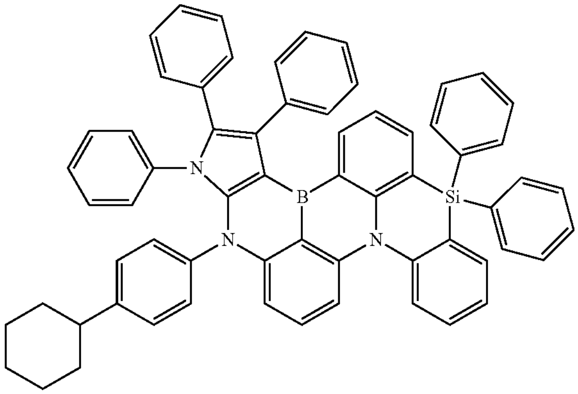
-continued
193
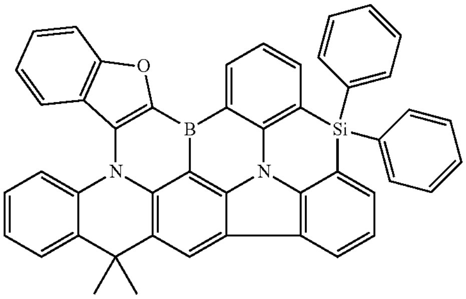
194
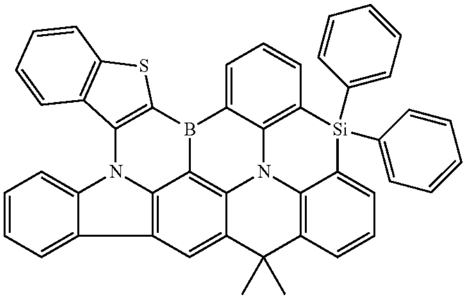
195
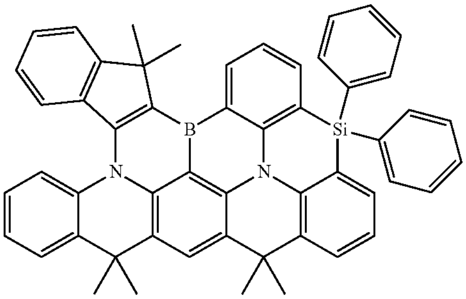
196
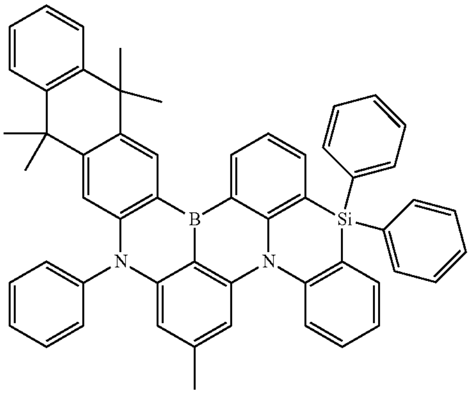
197
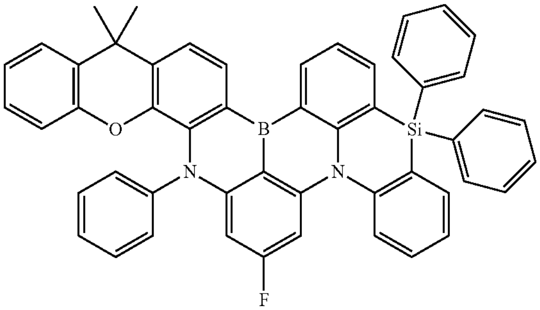

-continued
198
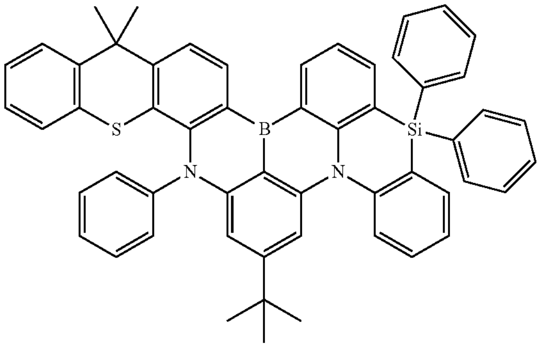
199
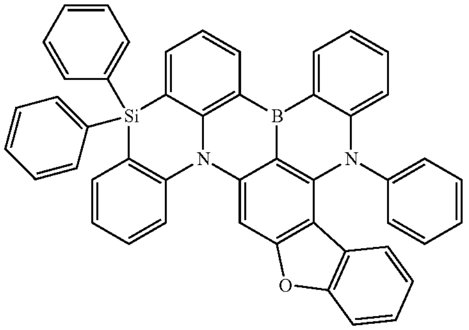
200
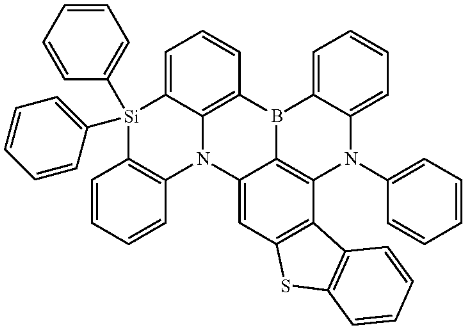
201
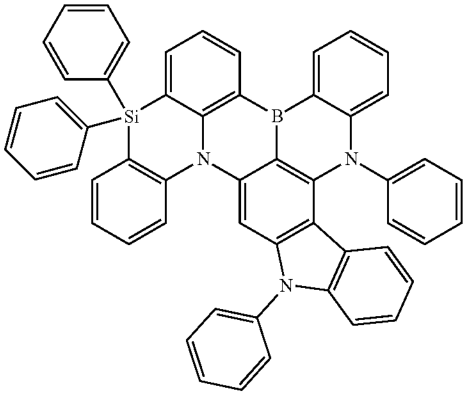
-continued
202
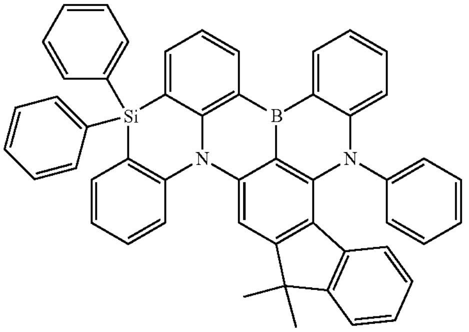
203
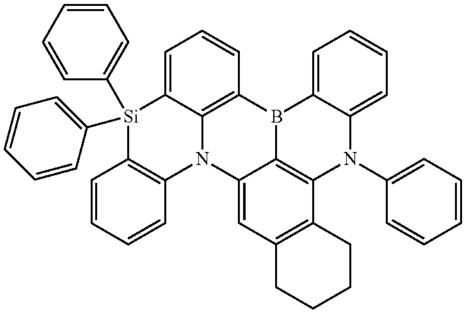
204
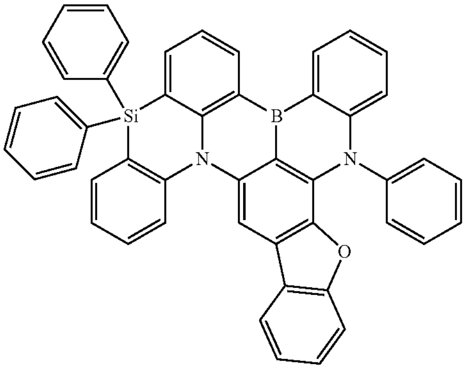
205
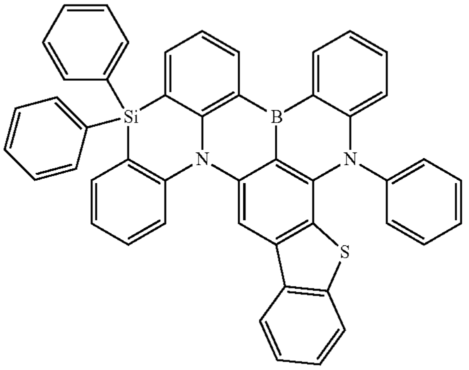

-continued

206

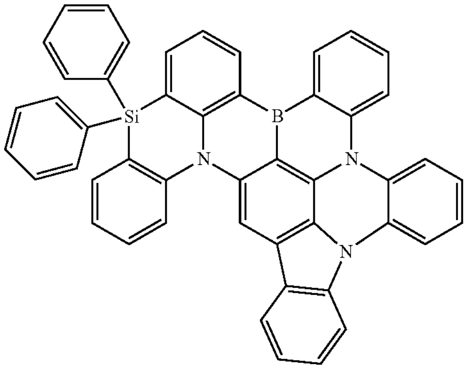

207

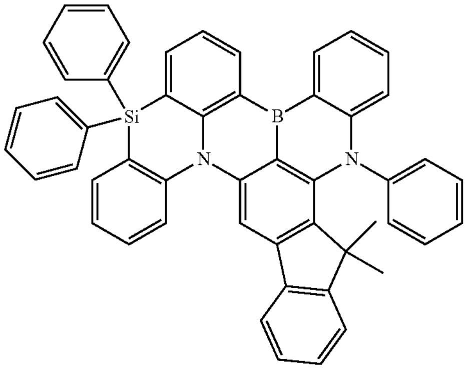

208

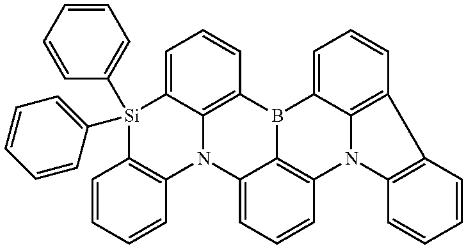

209

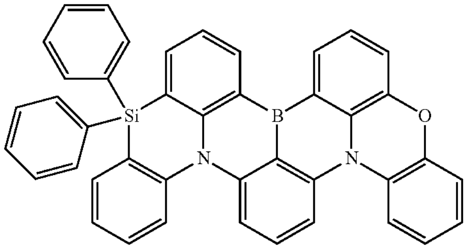

210

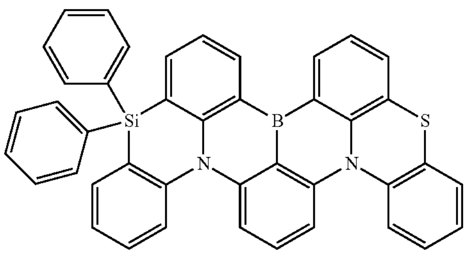

-continued

211

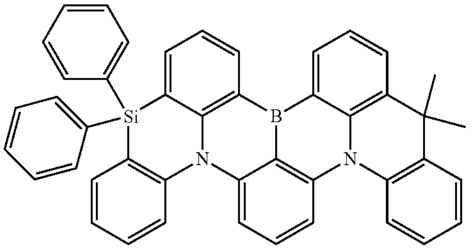

212

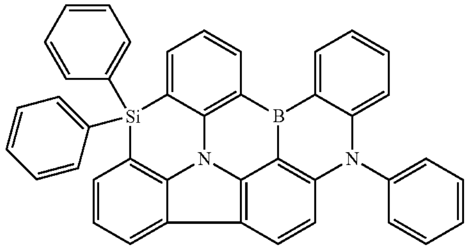

213

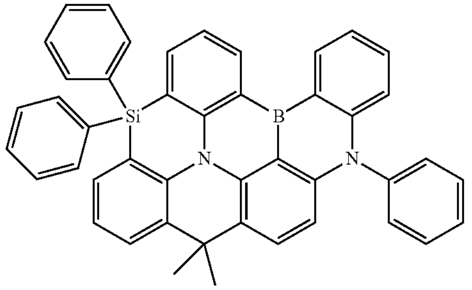

214

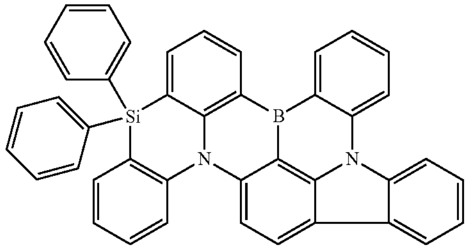

215

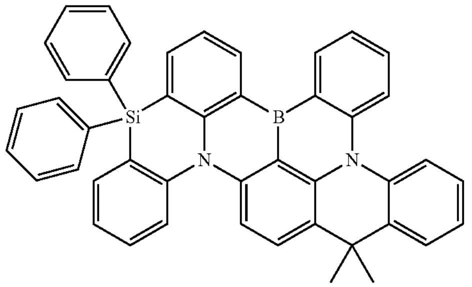

The specific substituents in Formula A or B can be clearly seen from the structures of the compounds 1 to 156 but are not intended to limit the scope of the compound represented by Formula A or B.

As can be seen from the above specific compounds, the polycyclic compound of the present invention contains B, N, CR, SIR, P, P═O, P═S, GeR, and Al and has a polycyclic ring structure. The introduction of substituents into the polycyclic ring structure enables the synthesis of organic light emitting materials with inherent characteristics of the backbone structure and the substituents. For example, the backbone structure and the substituents are designed for use in a hole injecting layer, a hole transport layer, a light emitting layer, an electron transport layer, an electron injecting layer, an electron blocking layer, and a hole blocking layer of an organic electroluminescent device. This introduction meets the requirements of the organic layers and enables the fabrication of a high efficiency organic electroluminescent device. The compound of the present invention may be used alone or in combination with other compounds to form various organic layers.

A further aspect of the present invention is directed to an organic electroluminescent device including a first electrode, a second electrode, and one or more organic layers interposed between the first and second electrodes wherein one of the organic layers includes at least one of the organic electroluminescent compounds that can be represented by Formula A or B.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A or B is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention will be described in more detail with reference to exemplary embodiments.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula C:

[Formula C]

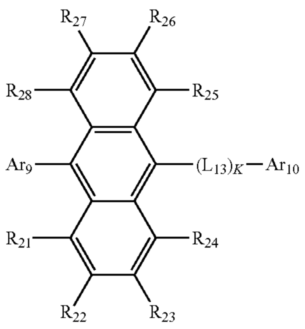

wherein $R_{21}$ to $R_{28}$ are identical to or different from each other and are as defined for $R_1$ to $R_{29}$ in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

[Formula C-1]

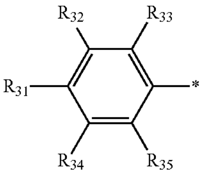

wherein $R_{31}$ to $R_{35}$ are identical to or different from each other and are as defined for $R_1$ to $R_{29}$ in Formula A, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae $C_1$ to $C_{48}$:

-continued
C1
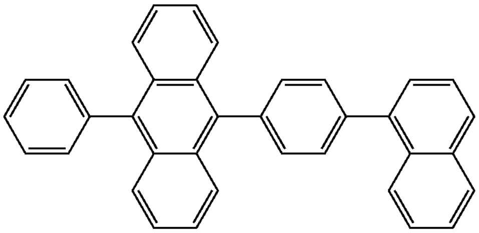
C2
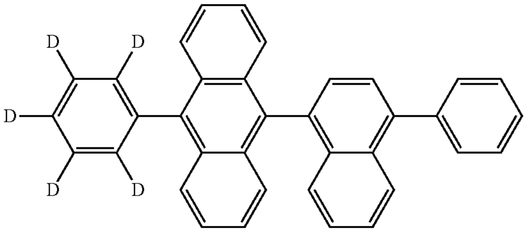
C3
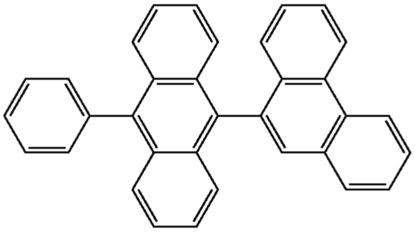
C4
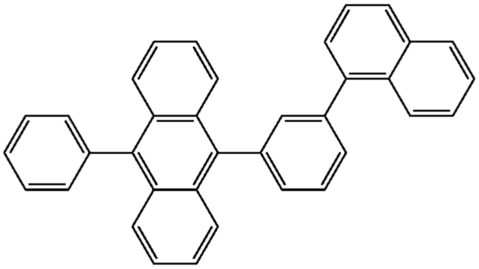
C5
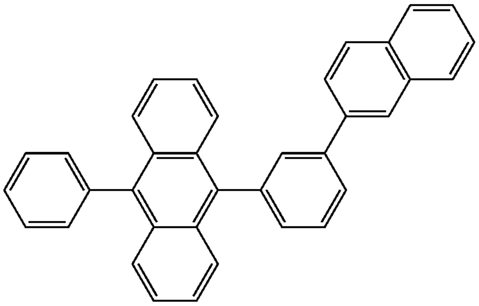
C6
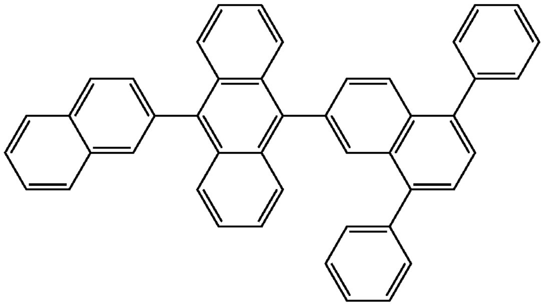
C7
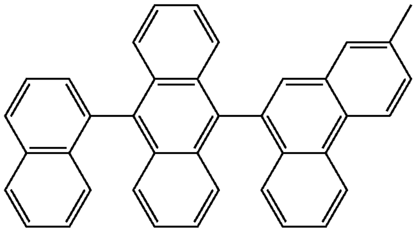
C8
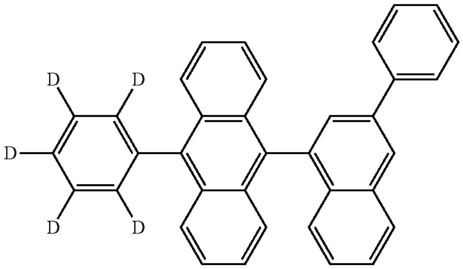
C9
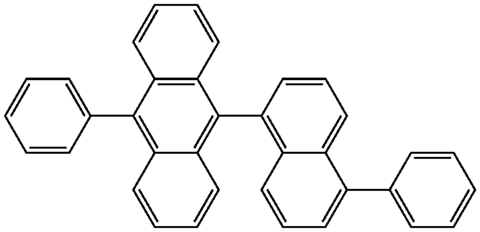
C10
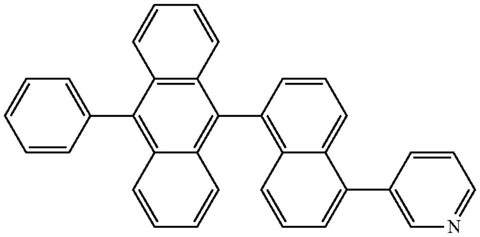
C11
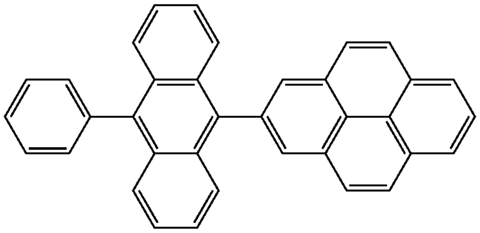

-continued
C12
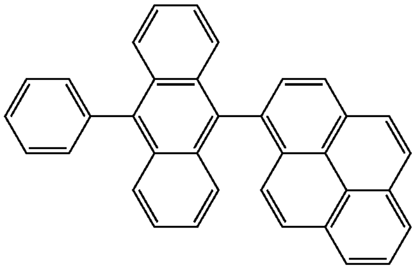
C13
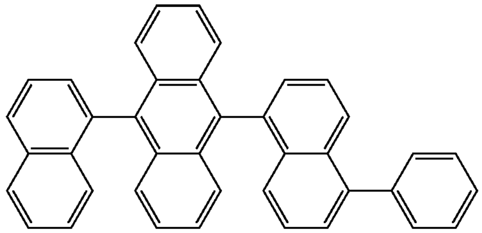
C14
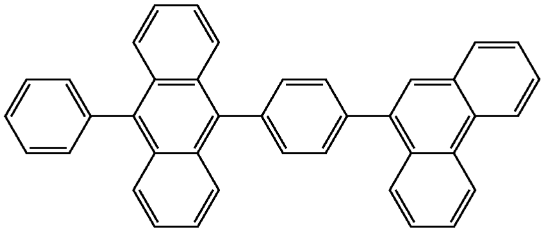
C15
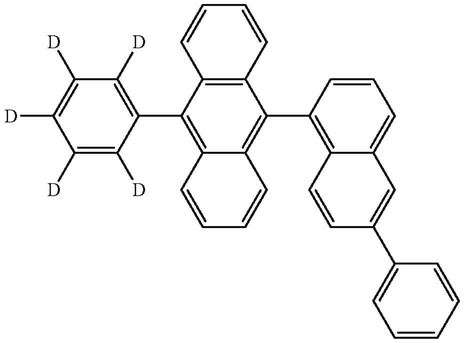
C16
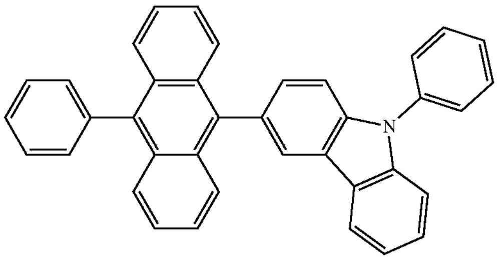
-continued
C17
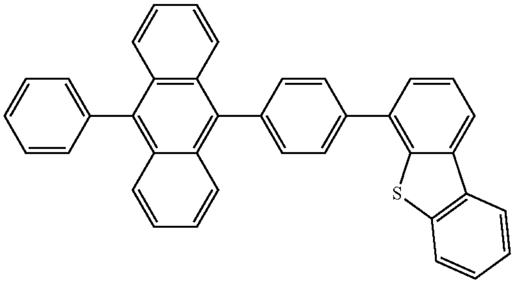
C18
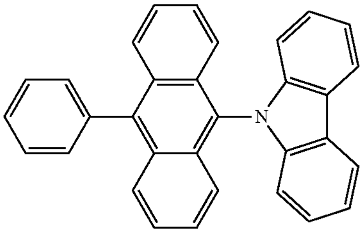
C19
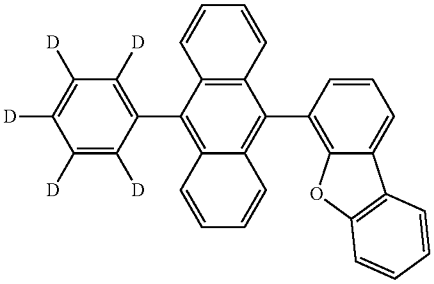
C20
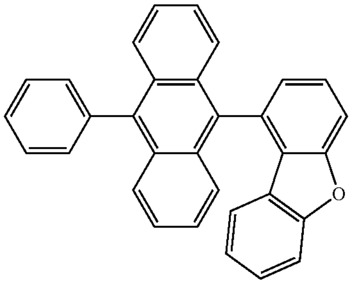
C21
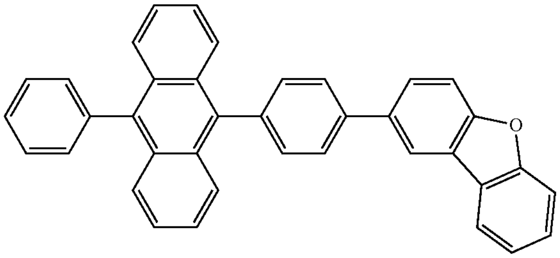

-continued
C22
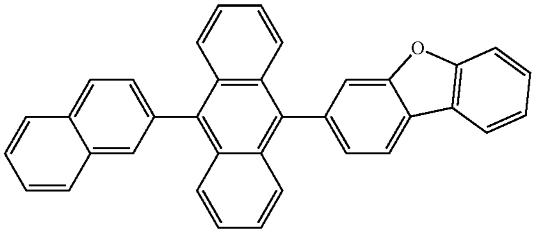
C23
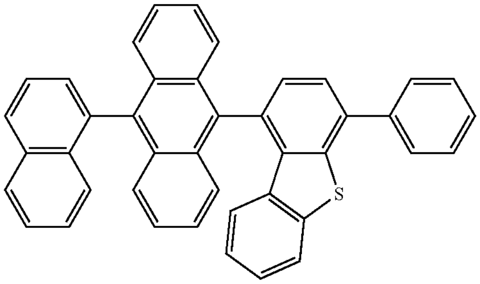
C24
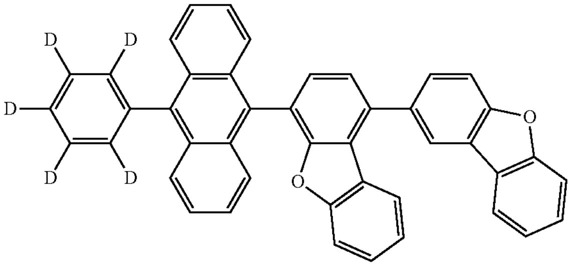
C25
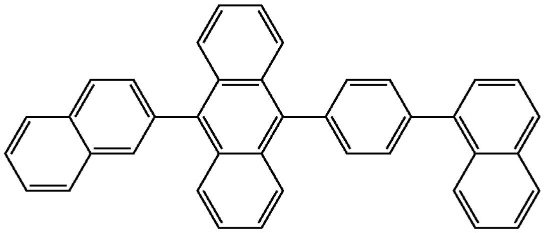
C26
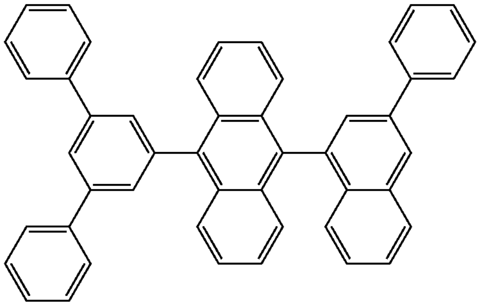
-continued
C27
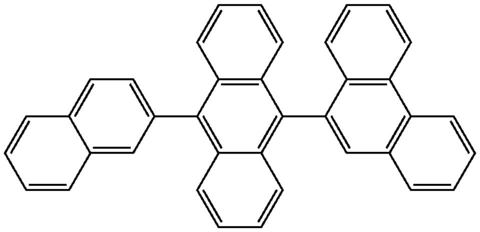
C28
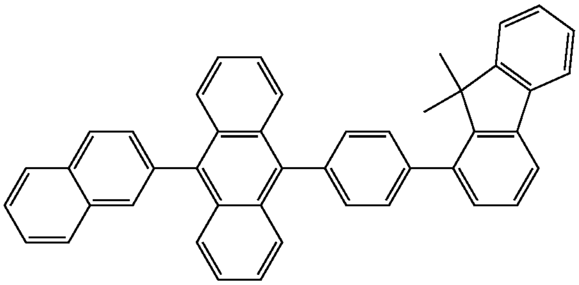
C29
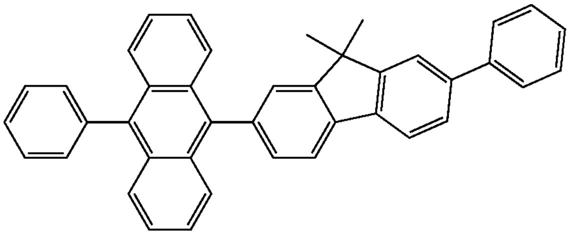
C30
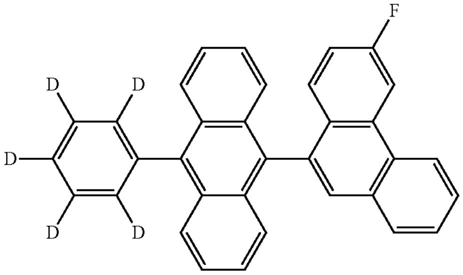
C31
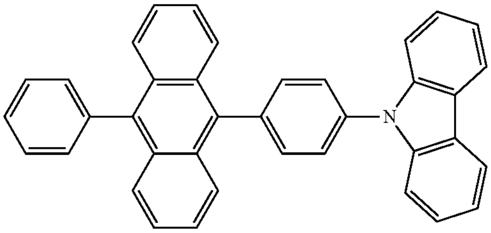
C32
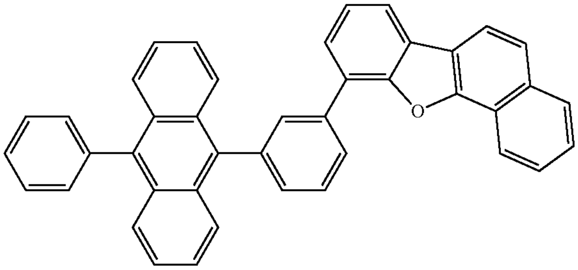

-continued
C33
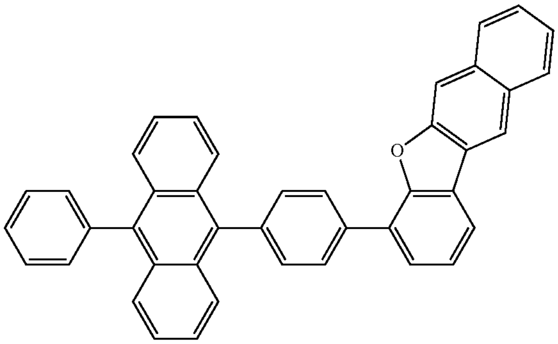
C34
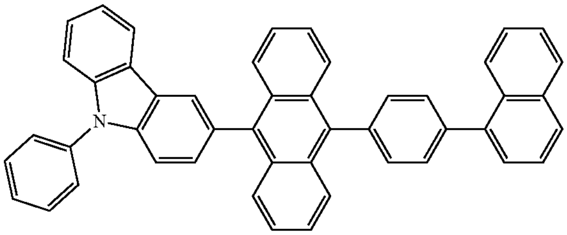
C35
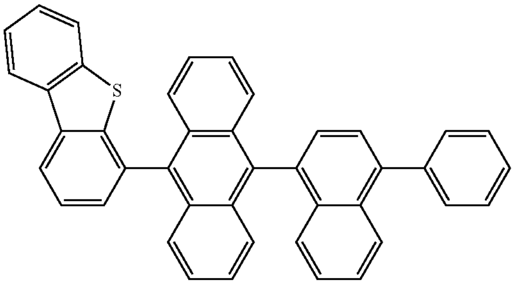
C36
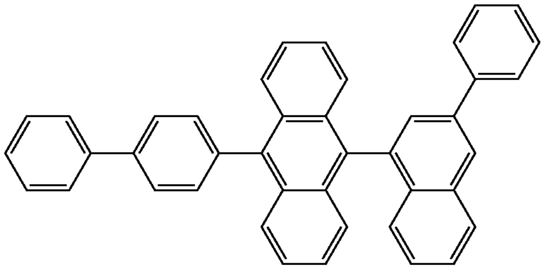
C37
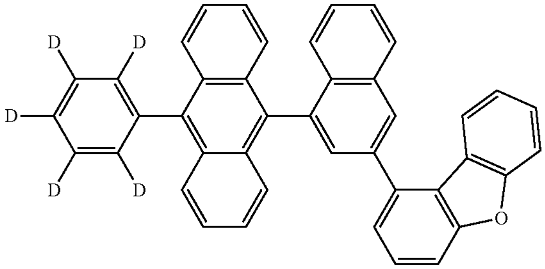
-continued
C38
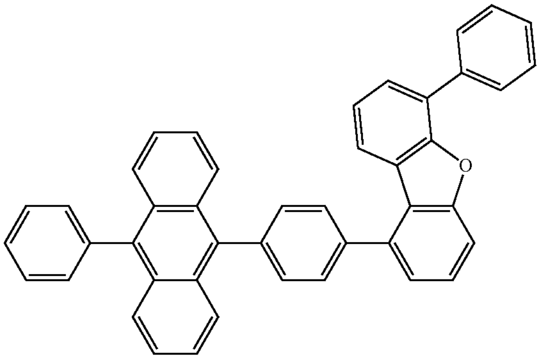
C39
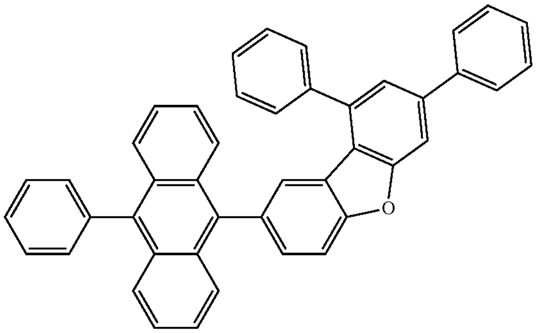
C40
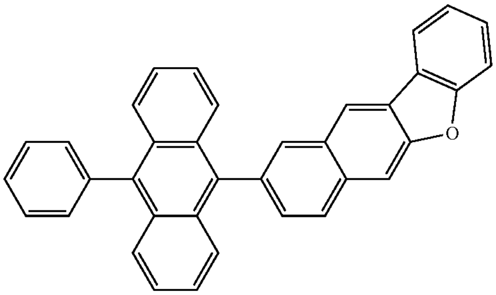
C41
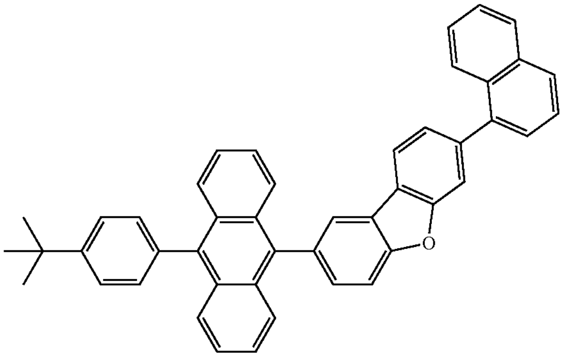

-continued

C42

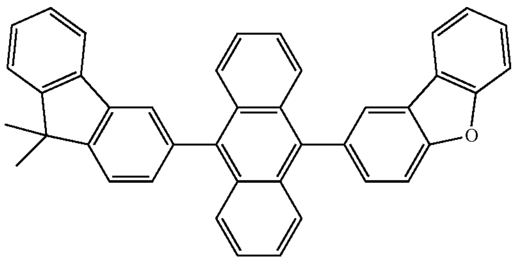

C43

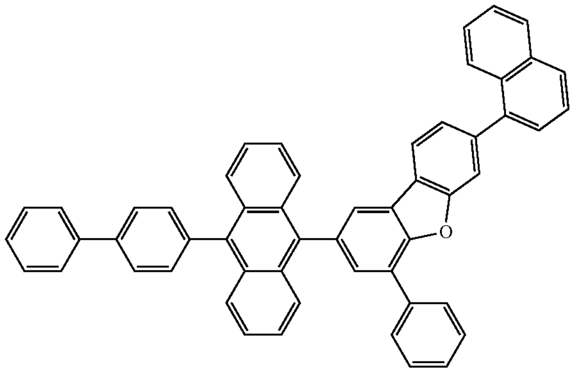

C44

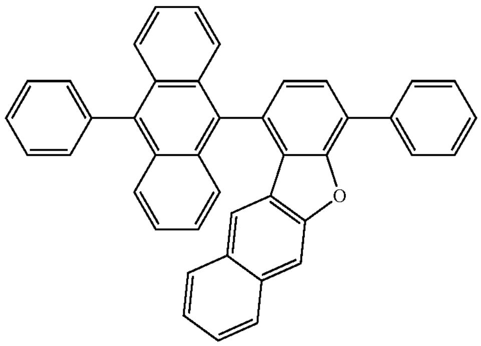

C45

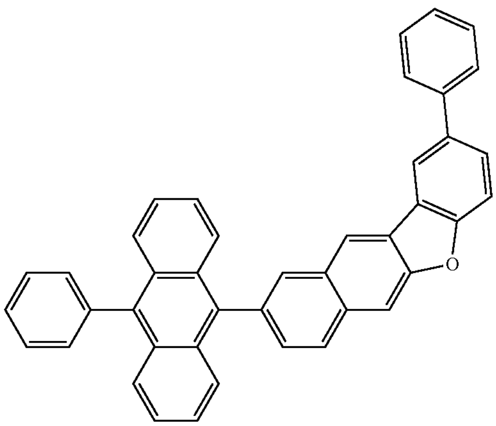

-continued

C46

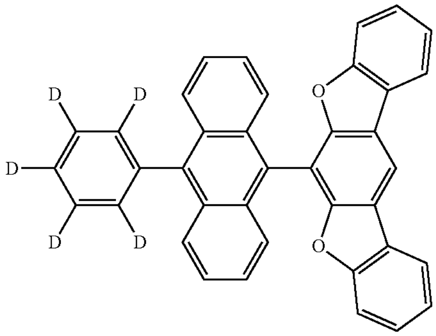

C47

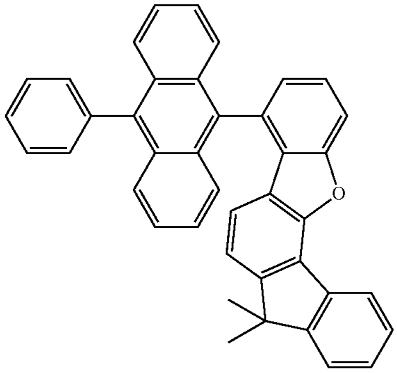

C48

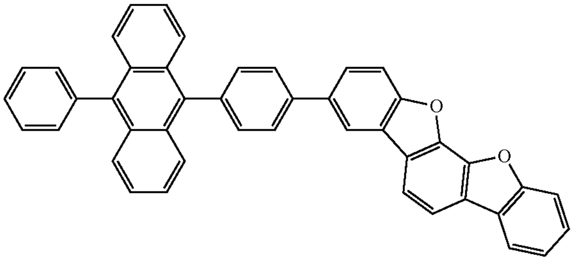

A specific structure of the organic electroluminescent device according to one embodiment of the present invention and a method for fabricating the device are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl)

biphenyl-4,4'-diamine (DNTPD), and 1,4,5,8,9,11-hexaazatriphenylenehexacarbonitrile (HAT-CN).

The hole transport material is not specially limited so long as it is commonly used in the art. Examples of such materials include N,N'-bis(3-methylphenyl)-N,N'-diphenyl-(1,1-bi-phenyl)-4,4'-diamine (TPD) and N,N'-di(naphthalen-1-yl)-N,N'-diphenylbenzidine (α-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, BeBq2, OXD-7, Liq, and the compounds 501 to 507:

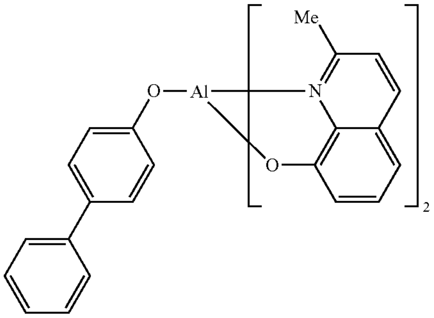

Balq

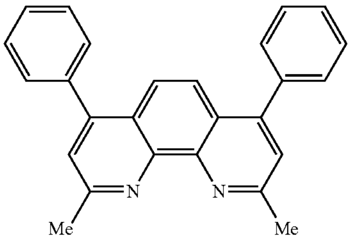

BCP

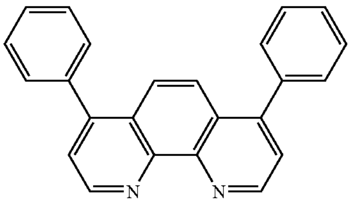

Bphen

-continued

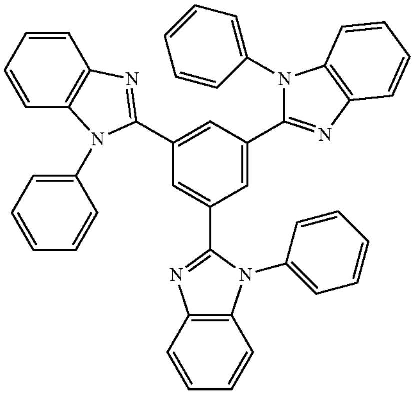

TPBI

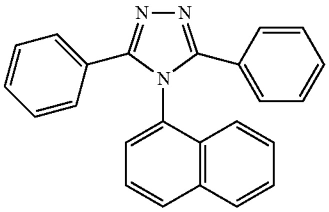

NTAZ

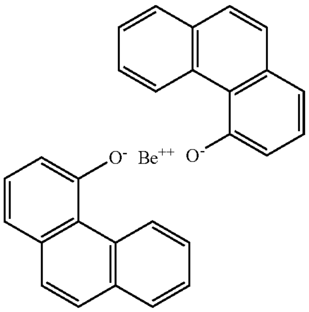

$BeBq_2$

OXD-7

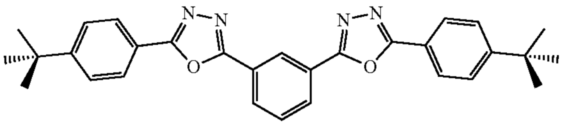

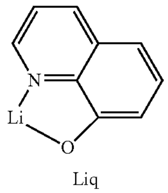

Liq

[Compound 501]

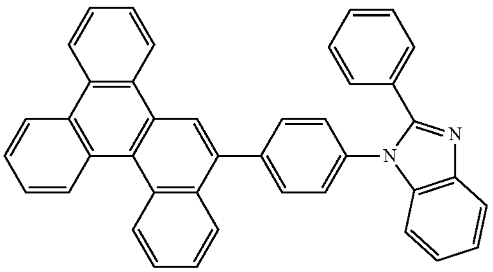

-continued

[Compound 205]

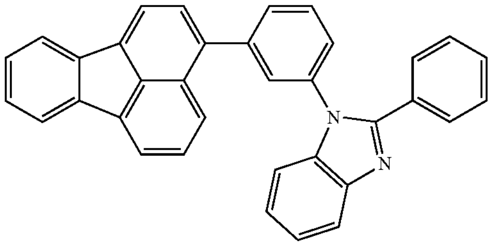

[Compound 503]

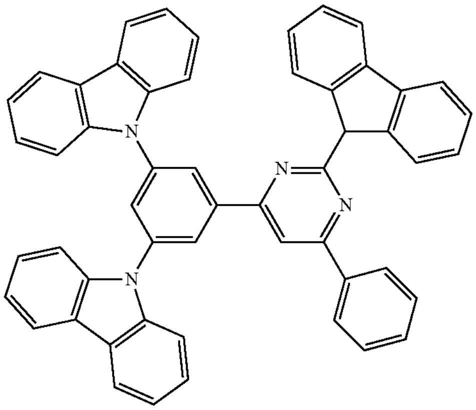

[Compound 504]

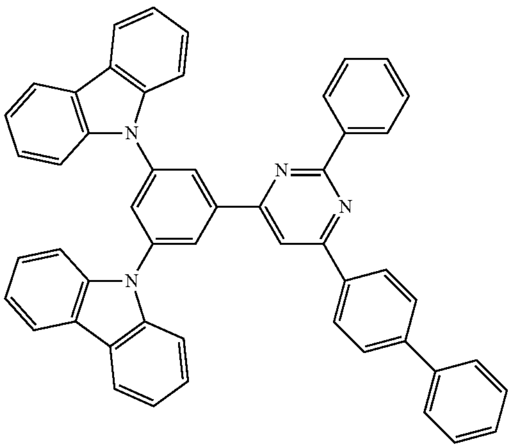

[Compound 505]

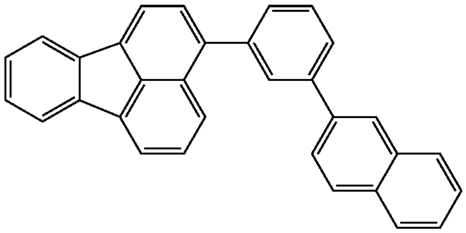

-continued

[Compound 506]

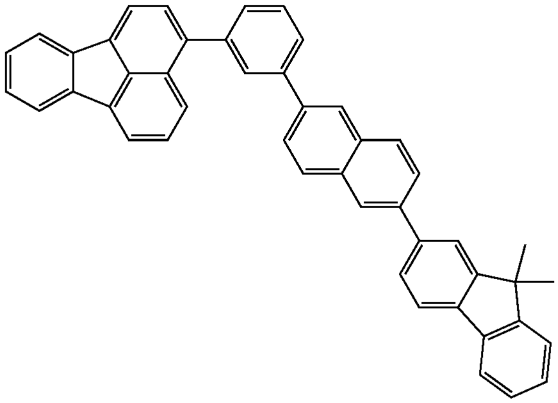

[Compound 507]

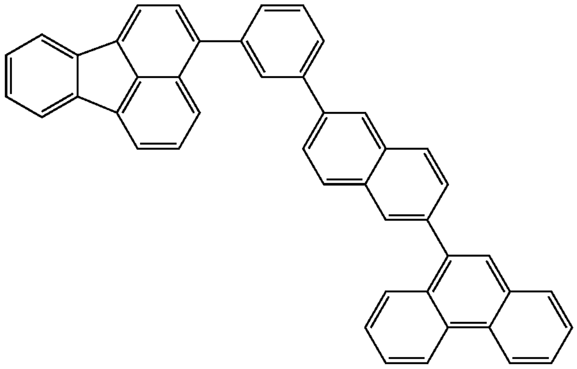

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebq2), ADN, the compounds 401 and 402, and oxadiazole derivatives such as PBD, BMD, and BND:

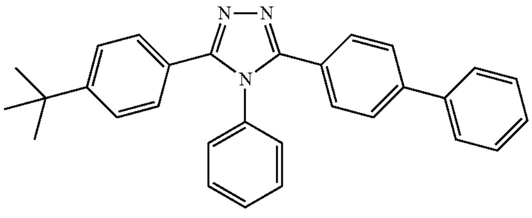

TAZ

-continued

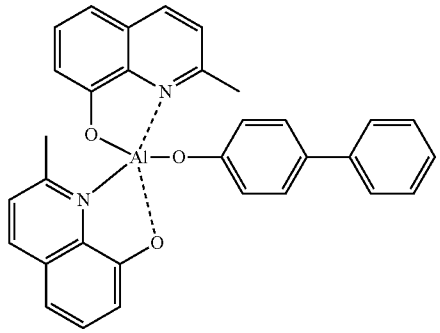

BAlq

[Compound 401]

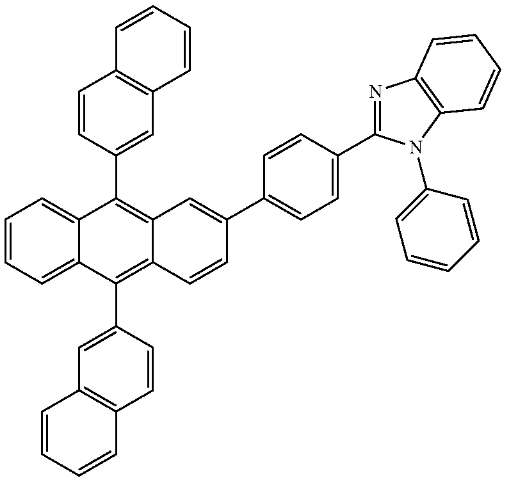

[Compound 402]

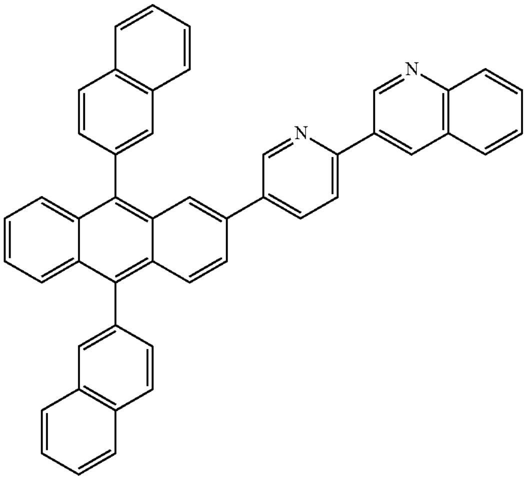

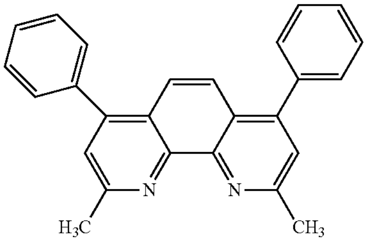

BCP

-continued

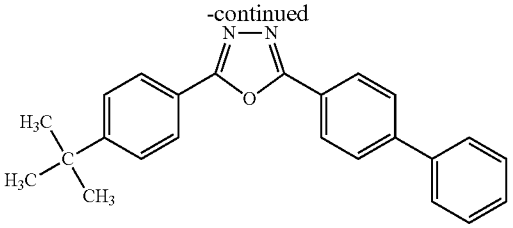

TAZ

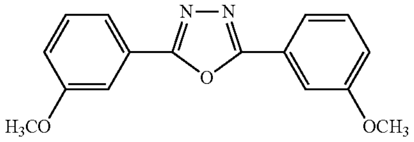

BMC

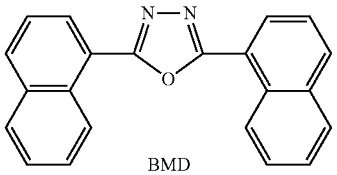

BMD

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR CARRYING OUT THE INVENTION

The present invention will be explained more specifically with reference to the following examples. However, it will be obvious to those skilled in the art that these examples are in no way intended to limit the scope of the invention.

Synthesis Example 1: Synthesis of Compound 2

(1) Synthesis of Intermediate 3

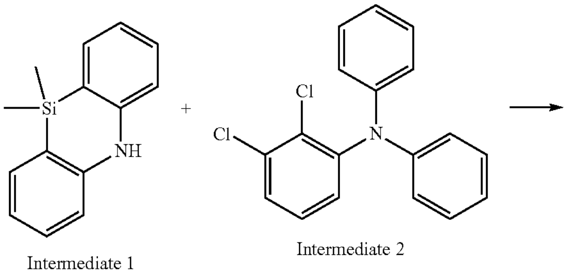

-continued

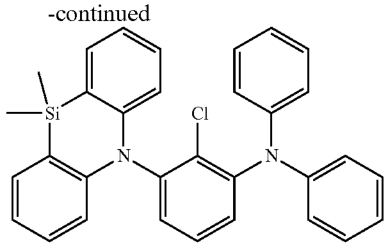

Intermediate 3

20.0 g of Intermediate 1 (see Tetrahedron Letters; vol. 57; nb. 44; (2016); p. 4914-4917 for synthesis), 27.9 g of Intermediate 2 (see Chinese Patent Publication No. 105431439 for synthesis), 0.91 g of bis(tri-tert-butylphosphine)palladium(0), 17.1 g of sodium tert-butoxide, and 200 mL of toluene were placed in a reactor. The mixture was stirred under reflux for 12 h. The reaction mixture was cooled to room temperature and ethyl acetate and water were added thereto. The organic layer was separated and purified by silica gel chromatography to afford Intermediate 3 (39.7 g, 88.9%).

MS (ESI) calcd. for Chemical Formula: $C_{32}H_{28}ClN_2Si$ (Pos)503.16, found 503.1.

(2) Synthesis of Compound 2

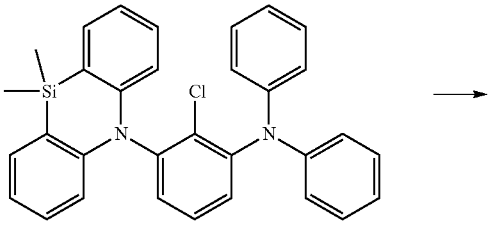

Intermediate 3

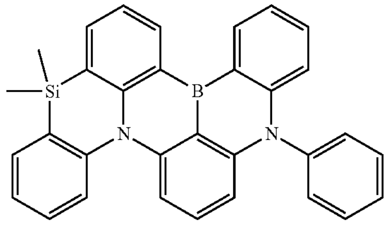

Compound 2

39.7 g of Intermediate 3 and 397 mL of tert-butylbenzene were placed in a reactor, and then 93.0 mL of 1.7 M tert-butyllithium was added dropwise thereto at −78° C. The mixture was stirred at 60° C. for 3 h. Nitrogen was blown into the mixture to remove pentane. After cooling to −78° C., 15.0 mL of boron tribromide was added dropwise. The resulting mixture was stirred at room temperature for 2 h. After cooling to 0° C., 27.5 mL of N,N-diisopropylethylamine was added dropwise. The mixture was stirred at 120° C. for 12 h. The reaction mixture was cooled to room temperature and 129 mL of a 10% aqueous solution of sodium acetate and ethyl acetate were added thereto. The organic layer was separated and purified by silica gel chromatography to afford Compound 2 (4.5 g, 12.0%).

MS (ESI) calcd. for Chemical Formula: $C_{32}H_{26}BN_2Si$ (Pos)477.19, found 477.1.

Synthesis Example 2: Synthesis of Compound 3

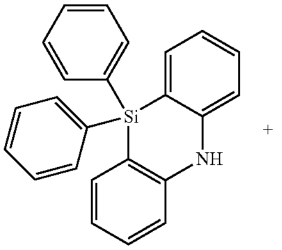

+

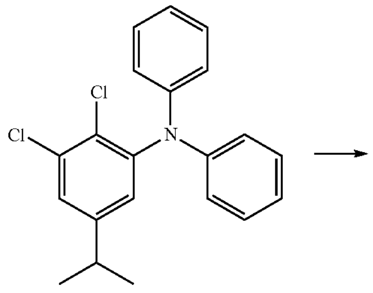

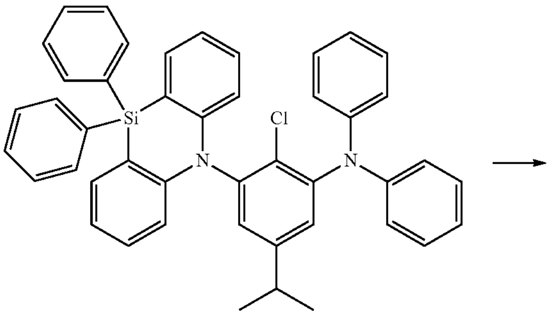

Intermediate 4

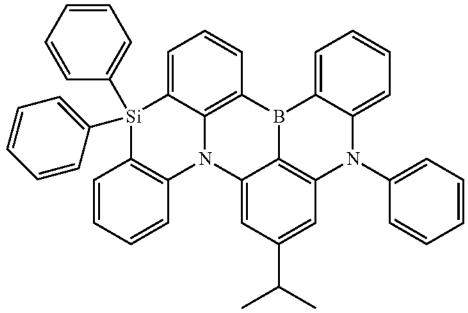

Compound 3

Compound 3 (5.0 g, 13.1%) was obtained from Intermediate 4 in the same manner as in Synthesis Example 1.

MS (ESI) calcd. for Chemical Formula: $C_{45}H_{36}BN_2Si$ (Pos)643.28, found 643.2.

Synthesis Example 3: Synthesis of Compound 9

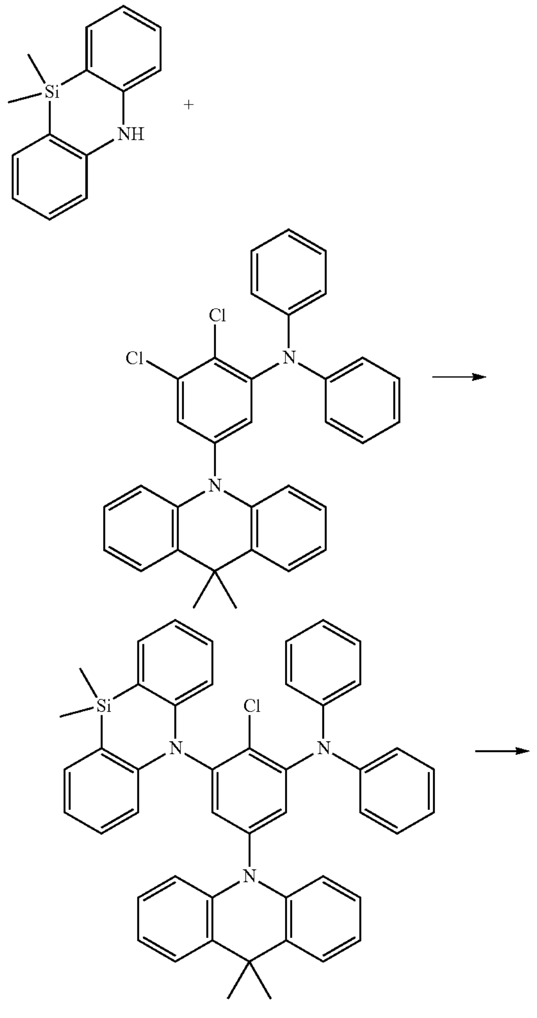

Intermediate 5

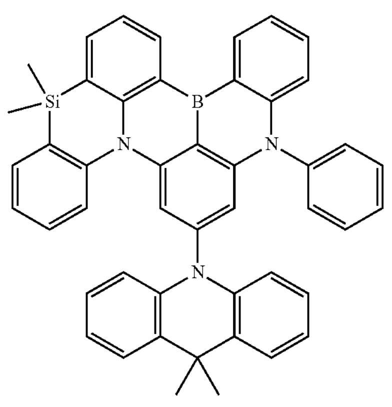

Compound 9

Compound 9 (2.1 g, 11.3%) was obtained from Intermediate 5 in the same manner as in Synthesis Example 1.

MS (ESI) calcd. for Chemical Formula: $C_{47}H_{39}BN_3Si$ (Pos)684.30, found 684.3.

Synthesis Example 4: Synthesis of Compound 11

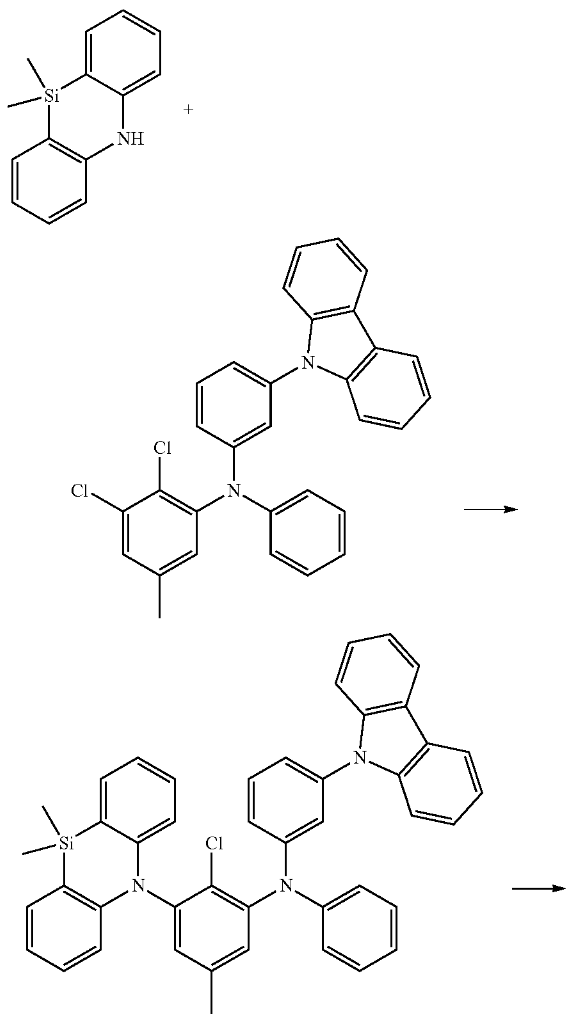

Intermediate 6

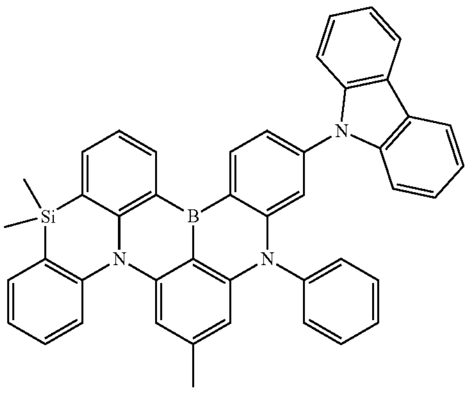

Compound 11

Compound 11 (3.8 g, 14.1%) was obtained from Intermediate 6 in the same manner as in Synthesis Example 1.

MS (ESI) calcd. for Chemical Formula: $C_{45}H_{35}BN_3Si$ (Pos)656.27, found 656.2.

Synthesis Example 5: Synthesis of Compound 23

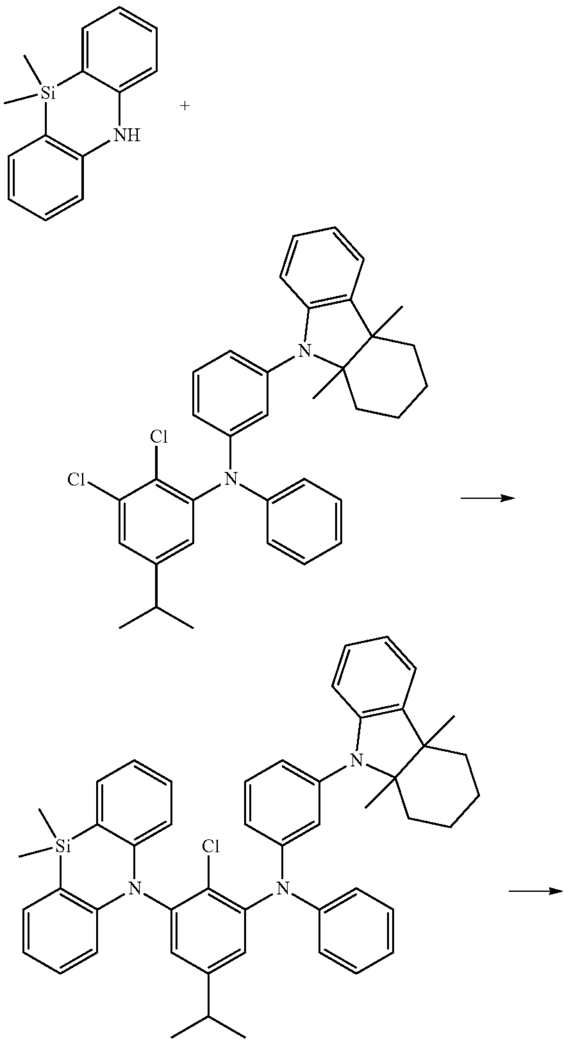

Intermediate 7

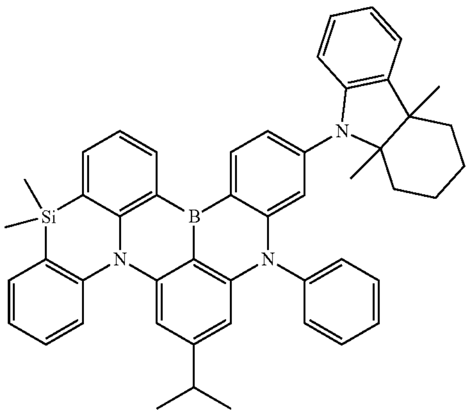

Compound 23

Compound 23 (2.4 g, 14.3%) was obtained from Intermediate 7 in the same manner as in Synthesis Example 1.

MS (ESI) calcd. for Chemical Formula: $C_{49}H_{49}BN_3Si$ (Pos)718.38, found 718.3.

Synthesis Example 6: Synthesis of Compound 45

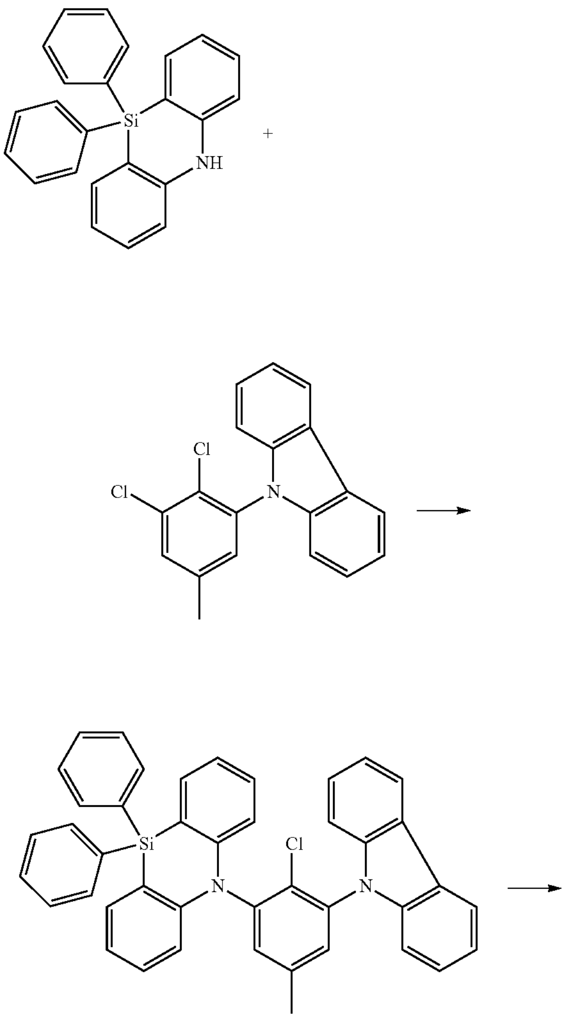

Intermediate 8

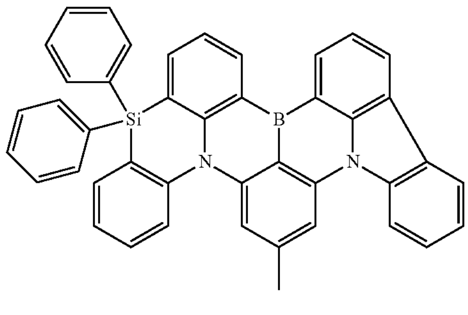

Compound 45

Compound 45 (4.1 g, 11.2%) was obtained from Intermediate 8 in the same manner as in Synthesis Example 1.

MS (ESI) calcd. for Chemical Formula: $C_{43}H_{30}BN_2Si$ (Pos)613.23, found 613.2.

Synthesis Example 7: Synthesis of Compound 58

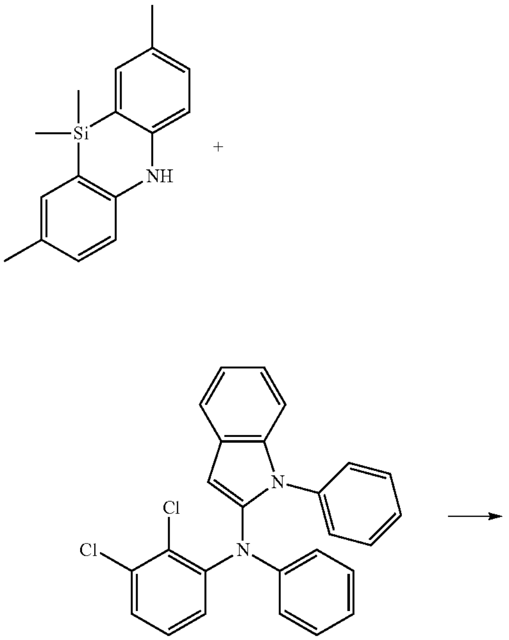

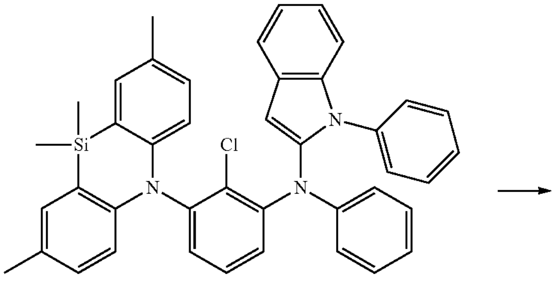

Intermediate 9

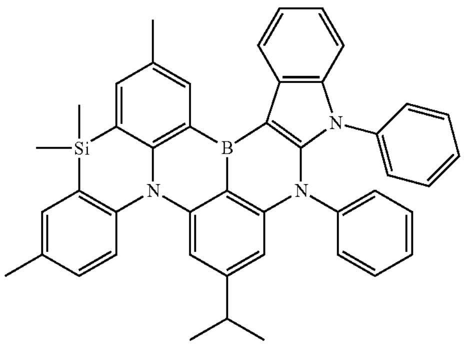

Compound 58

Compound 58 (6.1 g, 14.1%) was obtained from Intermediate 9 in the same manner as in Synthesis Example 1.

MS (ESI) calcd. for Chemical Formula: $C_{47}H_{39}BN_3Si$ (Pos)620.27, found 620.2.

Synthesis Example 8: Synthesis of Compound 78

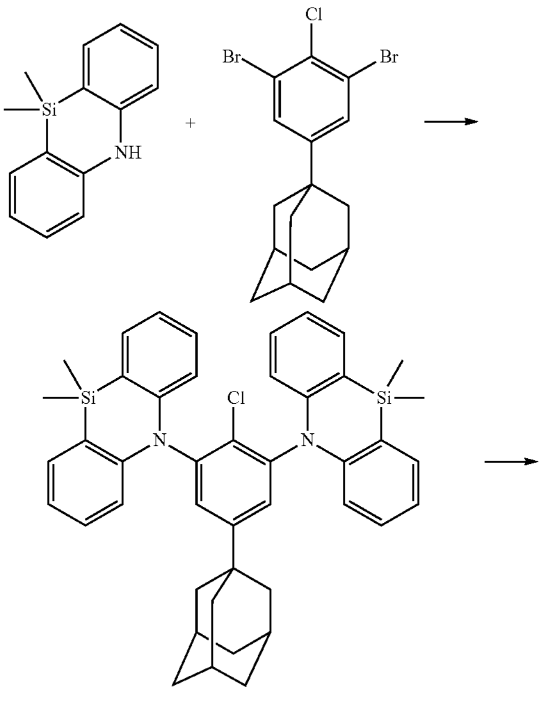

Intermediate 10

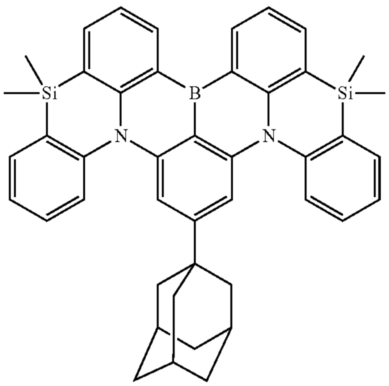

Compound 78

Compound 78 (4.6 g, 11.1%) was obtained from Intermediate 10 in the same manner as in Synthesis Example 1.

MS (ESI) calcd. for Chemical Formula: $C_{44}H_{44}BN_2Si_2$ (Pos)667.32, found 667.3.

Synthesis Example 9: Synthesis of Compound 80

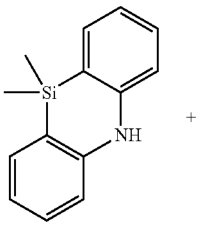

-continued

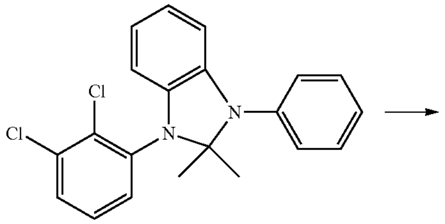

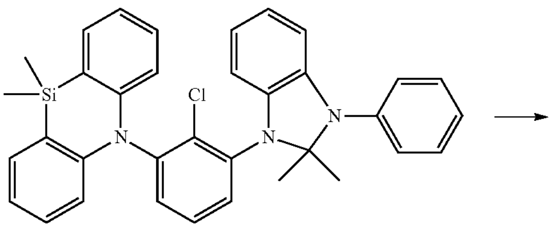

Intermediate 11

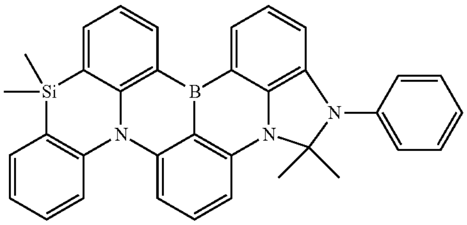

Compound 80

Compound 80 (1.9 g, 14.2%) was obtained from Intermediate 11 in the same manner as in Synthesis Example 1.

MS (ESI) calcd. for Chemical Formula: $C_{35}H_{31}BN_3Si$ (Pos)532.24, found 532.2.

Synthesis Example 10: Synthesis of Compound 85

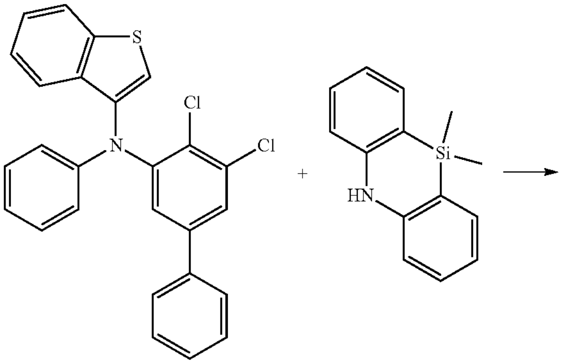

-continued

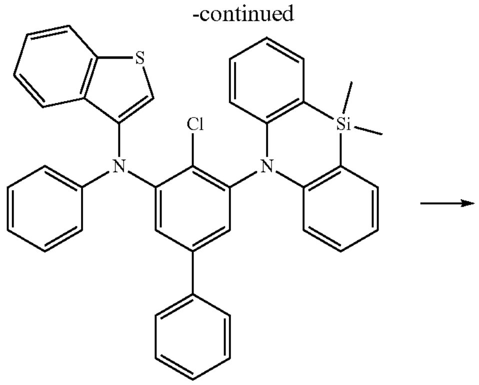

Intermediate 12

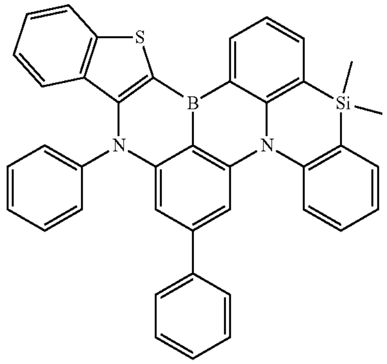

Compound 85

Compound 85 (3.9 g, 13.1%) was obtained from Intermediate 12 in the same manner as in Synthesis Example 1.

MS (ESI) calcd. for Chemical Formula: $C_{40}H_{30}BN_2SSi$ (Pos)609.20, found 609.2.

Synthesis Example 11: Synthesis of Compound 87

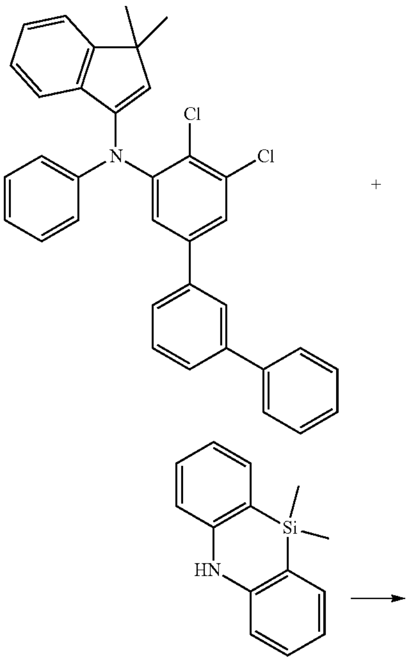

-continued

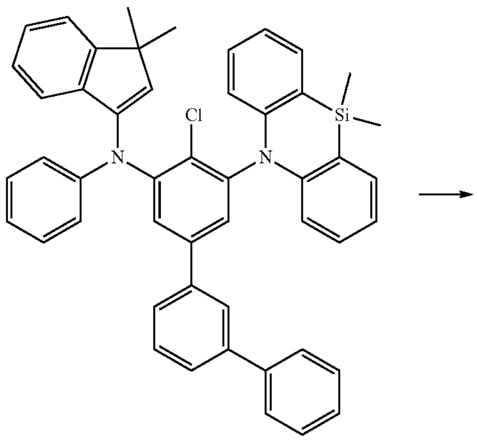

Intermediate 13

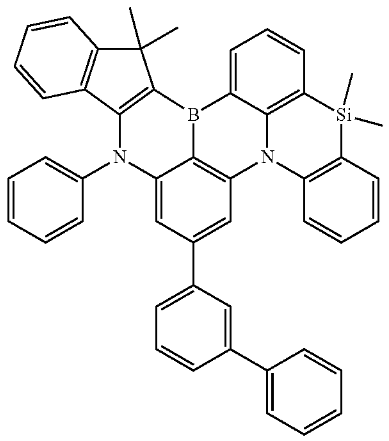

Compound 87

Compound 87 (2.9 g, 11.5%) was obtained from Intermediate 13 in the same manner as in Synthesis Example 1.

MS (ESI) calcd. for Chemical Formula: $C_{49}H_{40}BN_2Si$ (Pos)695.31, found 695.3.

Synthesis Example 12: Synthesis of Compound 102

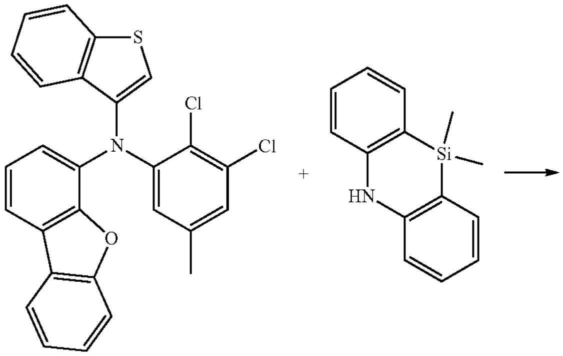

-continued

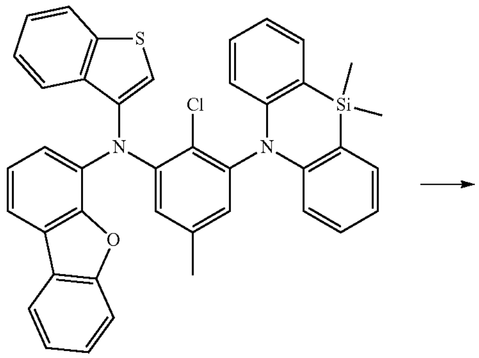

Intermediate 15

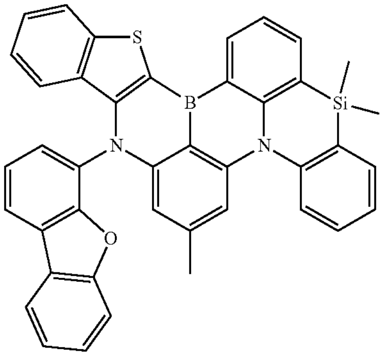

Compound 102

Compound 102 (6.6 g, 12.5%) was obtained from Intermediate 15 in the same manner as in Synthesis Example 1.

MS (ESI) calcd. for Chemical Formula: $C_{41}H_{30}BN_2OSSi$ (Pos)637.20, found 637.2.

Synthesis Example 13: Synthesis of Compound 108

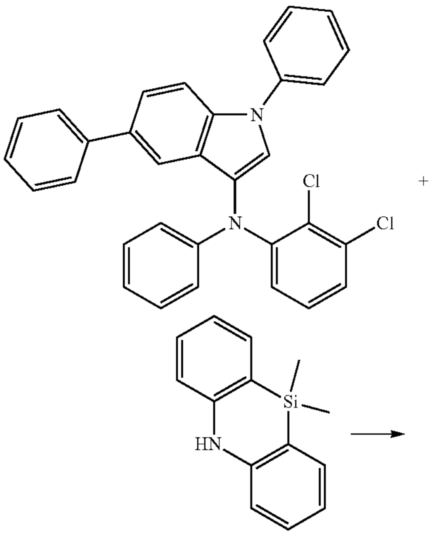

-continued

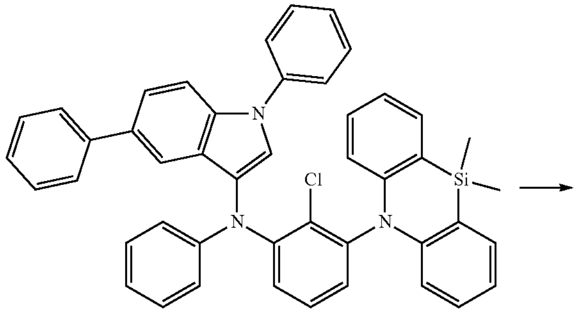

Intermediate 16

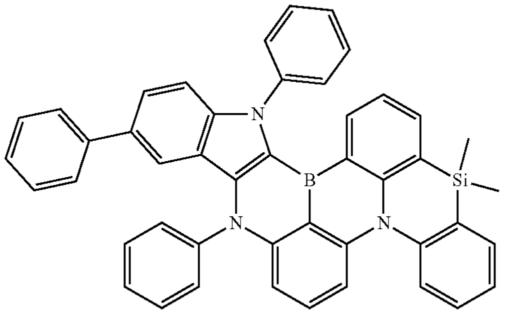

Compound 108

Compound 108 (3.6 g, 10.1%) was obtained from Intermediate 16 in the same manner as in Synthesis Example 1.

MS (ESI) calcd. for Chemical Formula: $C_{46}H_{35}BN_3Si$ (Pos)668.27, found 668.2.

Synthesis Example 14: Synthesis of Compound 109

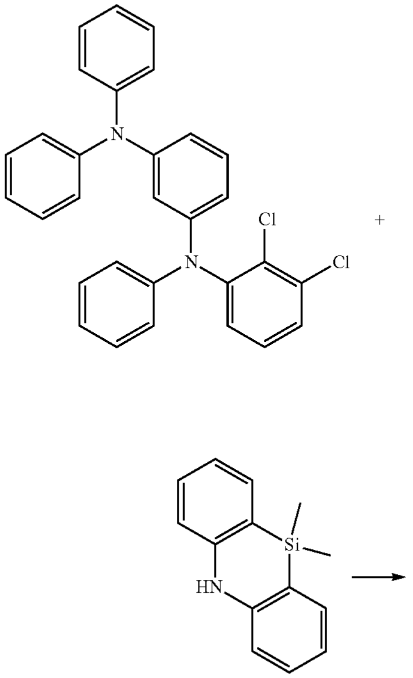

-continued

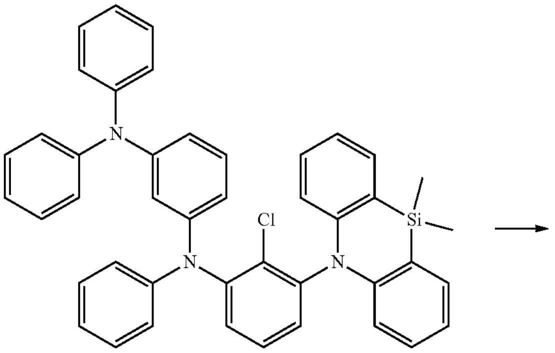

Intermediate 17

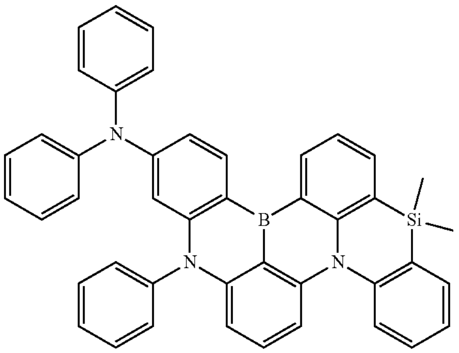

Compound 109

Compound 109 (3.3 g, 10.3%) was obtained from Intermediate 17 in the same manner as in Synthesis Example 1.

MS (ESI) calcd. for Chemical Formula: $C_{44}H_{35}BN_3Si$ (Pos)644.27, found 644.2.

Synthesis Example 15: Synthesis of Compound 114

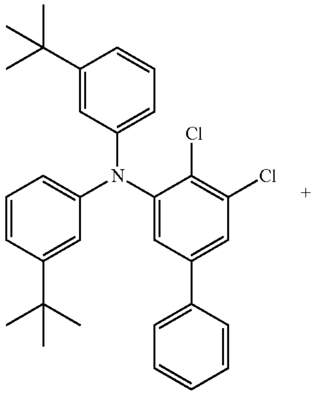

-continued

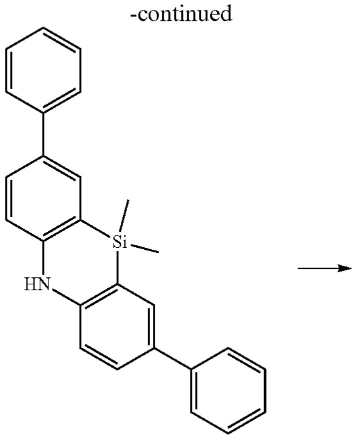

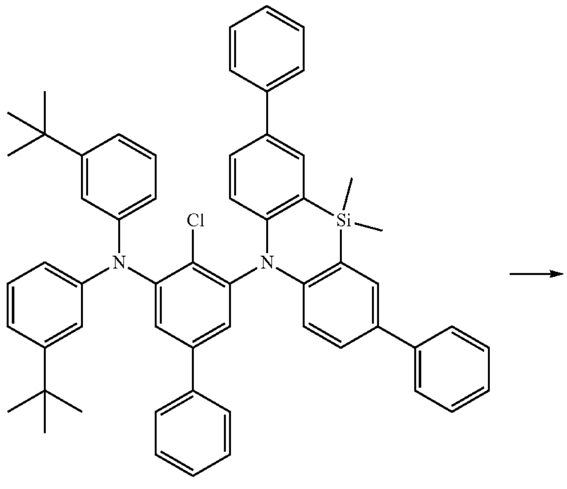

Intermediate 18

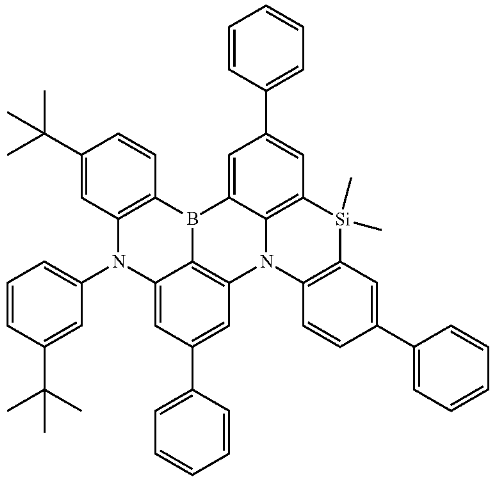

Compound 114

Compound 114 (3.9 g, 13.6%) was obtained from Intermediate 18 in the same manner as in Synthesis Example 1.

MS (ESI) calcd. for Chemical Formula: $C_{58}H_{54}BN_2Si$ (Pos)817.42, found 817.4.

Synthesis Example 16: Synthesis of Compound 130

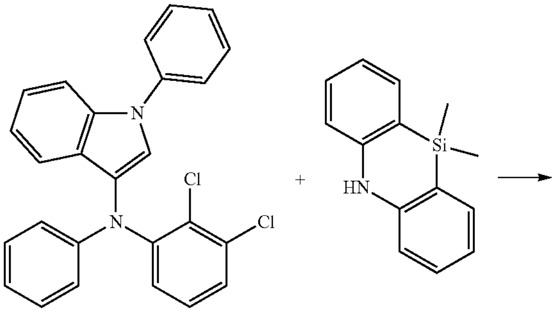

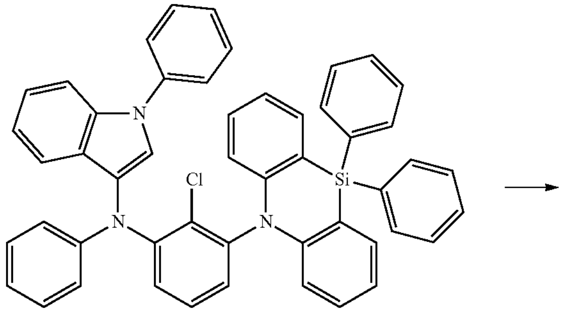

Intermediate 20

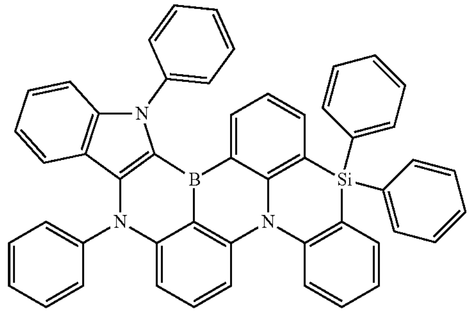

Compound 130

Compound 130 (4.5 g, 8.3%) was obtained from Intermediate 20 in the same manner as in Synthesis Example 1.

MS (ESI) calcd. for Chemical Formula: $C_{50}H_{35}BN_3Si$ (Pos)716.27, found 716.2.

Synthesis Example 17: Synthesis of Compound 133

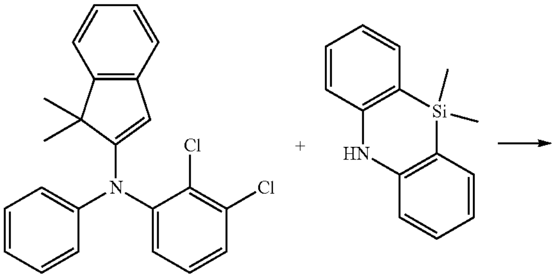

-continued

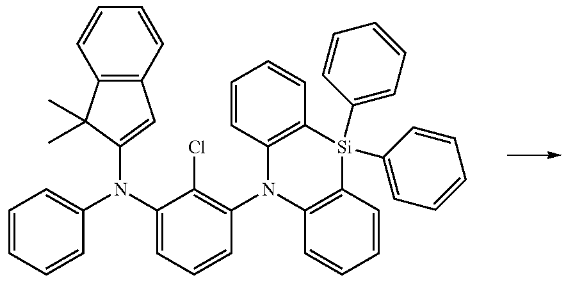

Intermediate 21

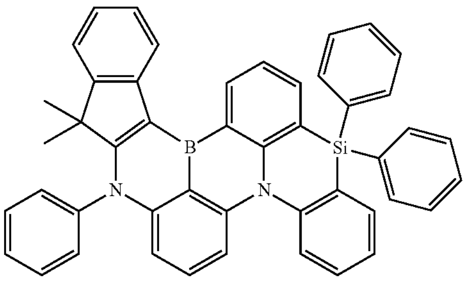

Compound 133

Compound 133 (5.5 g, 11.0%) was obtained from Intermediate 21 in the same manner as in Synthesis Example 1.

MS (ESI) calcd. for Chemical Formula: $C_{47}H_{36}BN_2Si$ (Pos)667.28, found 667.2.

Synthesis Example 18: Synthesis of Compound 161

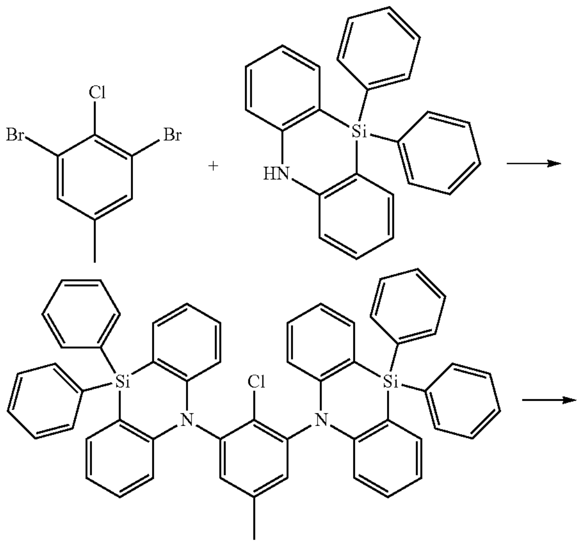

Intermediate 22

-continued

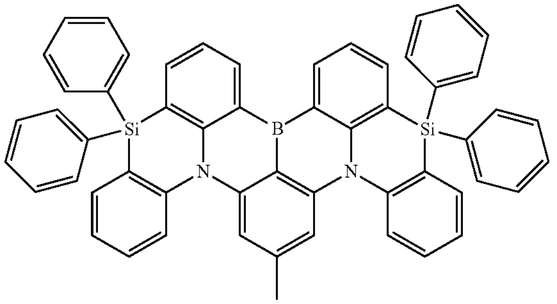

Compound 161

Compound 161 (6.1 g, 12.3%) was obtained from Intermediate 22 in the same manner as in Synthesis Example 1.

MS (ESI) calcd. for Chemical Formula: $C_{55}H_{40}BN_2Si_2$ (Pos)795.28, found 795.2.

Synthesis Example 19: Synthesis of Compound 162

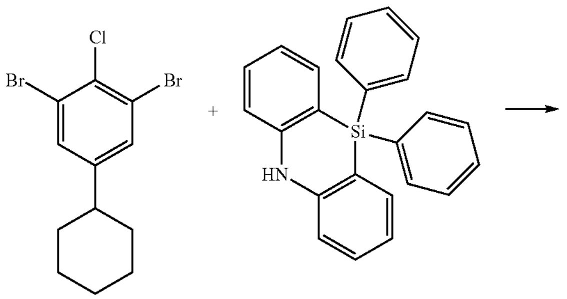

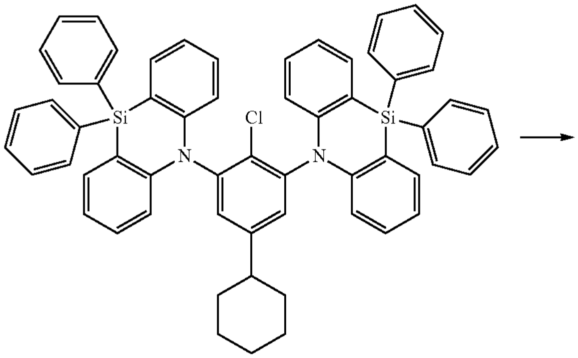

Intermediate 23

-continued

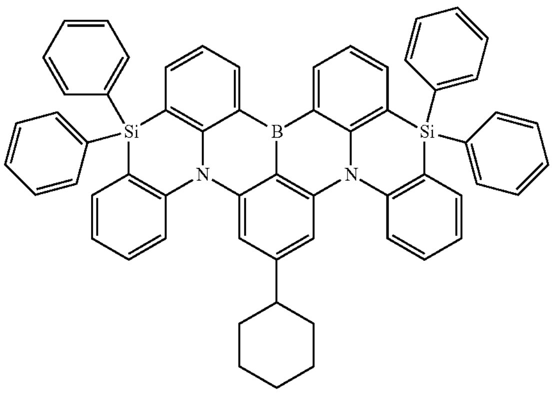

Compound 162

Compound 162 (5.4 g, 9.7%) was obtained from Intermediate 23 in the same manner as in Synthesis Example 1.

MS (ESI) calcd. for Chemical Formula: $C_{60}H_{48}BN_2Si_2$ (Pos)863.35, found 863.3.

Synthesis Example 20: Synthesis of Compound 164

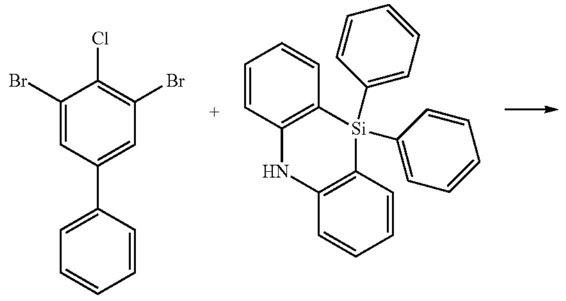

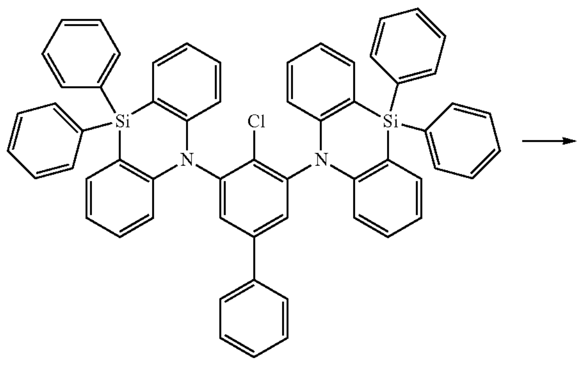

Intermediate 24

-continued

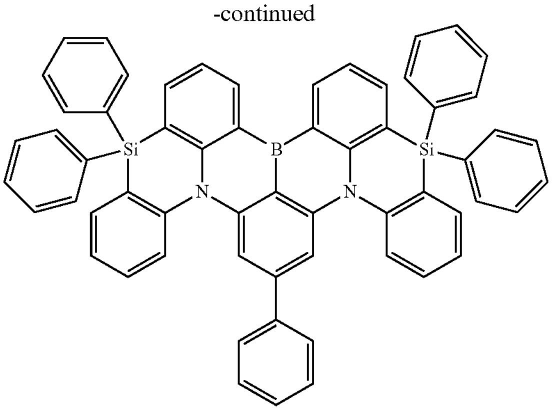

Compound 164

Compound 164 (2.9 g, 13.3%) was obtained from Intermediate 24 in the same manner as in Synthesis Example 1.

MS (ESI) calcd. for Chemical Formula: $C_{60}H_{42}BN_2Si_2$ (Pos)857.30, found 857.3.

Synthesis Example 21: Synthesis of Compound 189

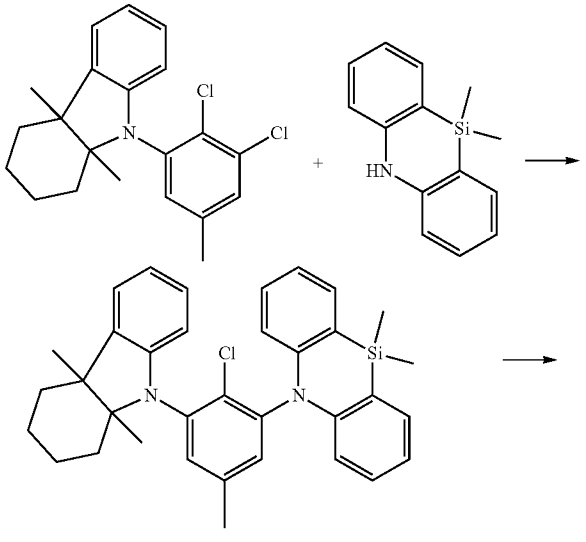

Intermediate 25

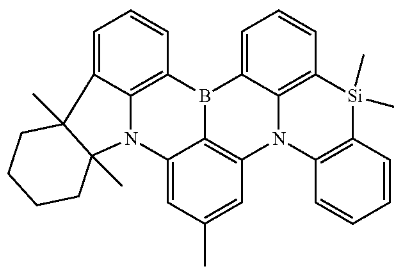

Compound 189

Compound 189 (4.7 g, 12.8%) was obtained from Intermediate 25 in the same manner as in Synthesis Example 1.

MS (ESI) calcd. for Chemical Formula: $C_{35}H_{36}BN_2Si$ (Pos)523.28, found 523.2.

Examples 1-22: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. HATCN (700 Å) and the compound represented by Formula F (250 Å) were deposited in this order on the ITO. A mixture of the host represented by BH1 and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

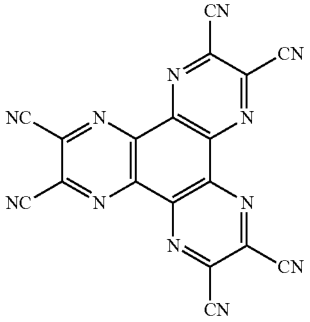

[HATCN]

[Formula F]

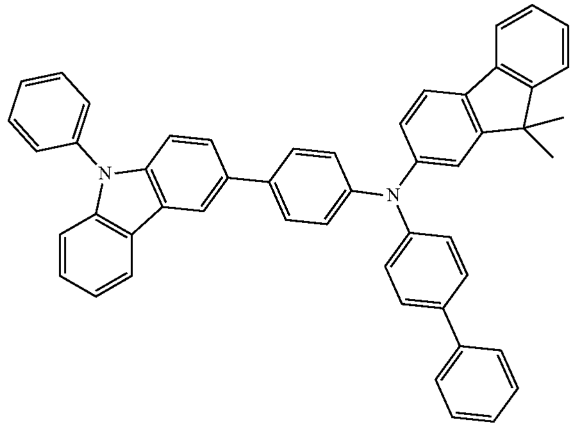

[Formula E-1]

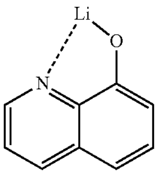

-continued

[Formula E-2]

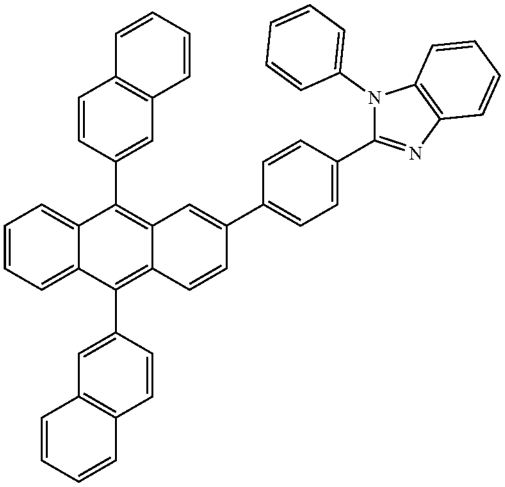

[BH1]

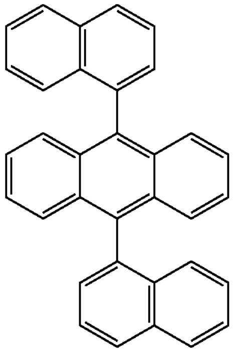

Comparative Examples 1-2

Organic electroluminescent devices were fabricated in the same manner as in Examples 1-22, except that BD1 or BD2 was used instead of the inventive compound. The luminescent properties of the organic electroluminescent devices were measured at 0.4 mA. The structures of BD1 and BD2 are as follow:

[BD1]

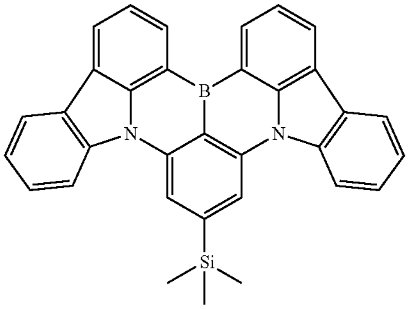

-continued

[BD2]

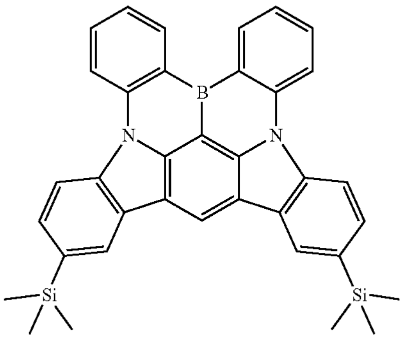

The organic electroluminescent devices of Examples 1-22 and Comparative Examples 1-2 were measured for voltage and efficiency. The results are shown in Table 1.

TABLE 1

| Example No. | Dopant | Driving voltage (V) | Efficiency (Cd/A) |
|---|---|---|---|
| Example 1 | Compound 2 | 4.0 | 6.7 |
| Example 2 | Compound 3 | 3.9 | 6.8 |
| Example 3 | Compound 11 | 4.0 | 7.1 |
| Example 4 | Compound 23 | 4.0 | 6.8 |
| Example 5 | Compound 58 | 4.0 | 6.5 |
| Example 6 | Compound 78 | 4.0 | 7.0 |
| Example 7 | Compound 85 | 3.9 | 7.5 |
| Example 8 | Compound 87 | 4.2 | 7.1 |
| Example 9 | Compound 88 | 4.0 | 6.6 |
| Example 10 | Compound 109 | 4.0 | 7.0 |
| Example 11 | Compound 114 | 4.0 | 7.3 |
| Example 12 | Compound 116 | 4.0 | 6.9 |
| Example 13 | Compound 130 | 4.1 | 6.8 |
| Example 14 | Compound 133 | 4.1 | 6.8 |
| Example 15 | Compound 158 | 4.0 | 7.0 |
| Example 16 | Compound 161 | 4.0 | 6.9 |
| Example 17 | Compound 162 | 4.1 | 7.0 |
| Example 18 | Compound 164 | 4.1 | 7.3 |
| Example 19 | Compound 189 | 4.1 | 7.0 |
| Example 20 | Compound 196 | 4.1 | 6.9 |
| Example 21 | Compound 197 | 4.0 | 6.8 |
| Example 22 | Compound 203 | 4.1 | 6.9 |
| Comparative Example 1 | BD1 | 4.3 | 6.1 |
| Comparative Example 2 | BD2 | 4.1 | 6.3 |

As can be seen from the results in Table 1, the organic electroluminescent devices of Examples 1-22, each of which employed the inventive compound, had high efficiencies compared to the devices of Comparative Examples 1-2.

INDUSTRIAL APPLICABILITY

The polycyclic compound of the present invention can be employed in an organic layer of an organic electroluminescent device to achieve excellent luminescent properties (including high efficiency) of the device. Due to these advantages, the organic electroluminescent device can find useful industrial application in various displays.

The invention claimed is:

1. An organic electroluminescent compound represented by Formula A:

[Formula A]

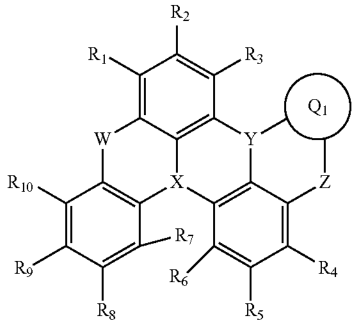

wherein W is $GeR_{13}R_{14}$, each of X and Y is independently selected from B, N, $CR_{15}$, $SiR_{16}$, P, P=O, P=S, $GeR_{17}$, and Al, Z is a single bond or a divalent group selected from the following structures Y-1 and Y-3 to Y-12:

(Y-1)

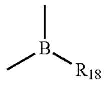

(Y-3)

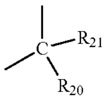

(Y-4)

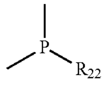

(Y-5)

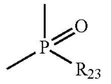

(Y-6)

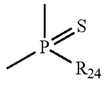

(Y-7)

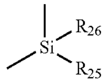

(Y-8)

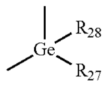

(Y-9)

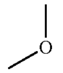

(Y-10)

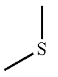

(Y-11)

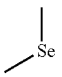

-continued (Y-12)

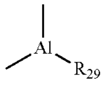

$Q_1$ is a 3- to 8-membered monocyclic or polycyclic aliphatic, aromatic or non-aromatic ring containing at least one hydrocarbon or heteroatom, and $R_1$ to $R_{10}$, $R_{13}$ to $R_{18}$, and $R_{20}$ to $R_{29}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{10}$, $R_{13}$ to $R_{18}$, and $R_{20}$ to $R_{29}$, $Q_1$, and their substituents optionally forms a substituted or unsubstituted ring with an adjacent substituent.

2. An organic electroluminescent compound represented by Formula B:

[Formula B]

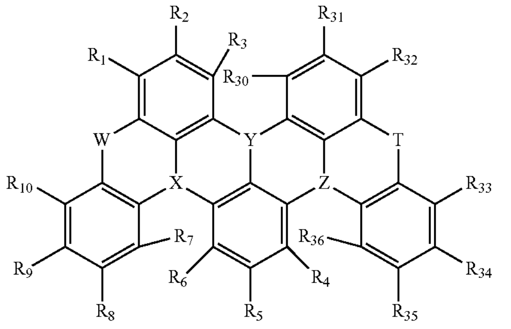

wherein W is $GeR_{13}R_{14}$, each of X, Y, and Z is independently selected from B, N, $CR_{15}$, $SiR_{16}$, P, P=O, P=S, $GeR_{17}$, and Al, T is a single bond or a divalent group selected from the following structures Y-1 to Y-12:

(Y-1)

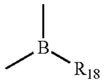

(Y-2)

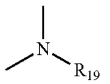

-continued (Y-3)

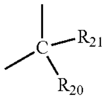

(Y-4)

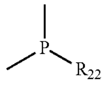

(Y-5)

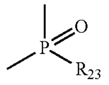

(Y-6)

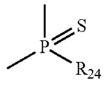

(Y-7)

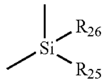

(Y-8)

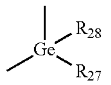

(Y-9)

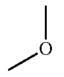

(Y-10)

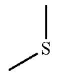

(Y-11)

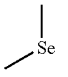

(Y-12)

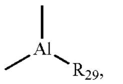

and $R_1$ to $R_{10}$, and $R_{13}$ to $R_{36}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, and substituted or unsubstituted $C_1$-$C_{30}$ non-aromatic rings, with the proviso that each of $R_1$ to $R_{10}$, $R_{13}$ to $R_{18}$, and $R_{20}$ to $R_{29}$, and their substituents optionally forms a substituted or unsubstituted ring with an adjacent substituent.

3. The organic electroluminescent compound according to claim 1, wherein $R_{18}$ is combined with $Q_1$ or its substituent or $R_4$ to form a substituted or unsubstituted aliphatic, aromatic or non-aromatic ring containing at least one hydrocarbon or heteroatom.

4. The organic electroluminescent compound according to claim 1, wherein $R_3$ and $Q_1$ are bonded together to form a substituted or unsubstituted aliphatic, aromatic or non-aromatic ring containing at least one hydrocarbon or heteroatom.

5. The organic electroluminescent compound according to claim 2, wherein $R_3$ and $R_{30}$ are bonded together to form a substituted or unsubstituted aliphatic, aromatic or non-aromatic ring containing at least one hydrocarbon or heteroatom.

6. An organic electroluminescent device comprising a first electrode, a second electrode, and one or more organic layers interposed between the first and second electrodes wherein one of the organic layers comprises at least one of the compound represented by Formula A according to claim 1.

7. The organic electroluminescent device according to claim 6, wherein the organic layers comprise an electron injecting layer, an electron transport layer, a hole injecting layer, a hole transport layer, an electron blocking layer, a hole blocking layer, and a light emitting layer, at least one of which comprises the organic electroluminescent compound represented by Formula A.

8. The organic electroluminescent device according to claim 7, wherein the light emitting layer comprises the organic electroluminescent compound represented by Formula A.

9. The organic electroluminescent device according to claim 7, wherein one or more of the layers are formed by a deposition or solution process.

10. The organic electroluminescent device according to claim 6, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

11. An organic electroluminescent device comprising a first electrode, a second electrode, and one or more organic layers interposed between the first and second electrodes wherein one of the organic layers comprises at least one of the compound represented by Formula B according to claim 2.

12. The organic electroluminescent device according to claim 11, wherein the organic layers comprise an electron injecting layer, an electron transport layer, a hole injecting layer, a hole transport layer, an electron blocking layer, a hole blocking layer, and a light emitting layer, at least one of which comprises the organic electroluminescent compound represented by Formula B.

13. The organic electroluminescent device according to claim 12, wherein the light emitting layer comprises the organic electroluminescent compound represented by Formula B.

14. The organic electroluminescent device according to claim 12, wherein one or more of the layers are formed by a deposition or solution process.

15. The organic electroluminescent device according to claim 11, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *